US006826390B1

(12) United States Patent
Tamura

(10) Patent No.: US 6,826,390 B1
(45) Date of Patent: Nov. 30, 2004

(54) RECEIVER, TRANSCEIVER CIRCUIT, SIGNAL TRANSMISSION METHOD, AND SIGNAL TRANSMISSION SYSTEM

(75) Inventor: Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 615 days.

(21) Appl. No.: 09/614,907

(22) Filed: Jul. 12, 2000

(30) Foreign Application Priority Data

| Jul. 14, 1999 | (JP) | ............................................ 11-200550 |
| Sep. 28, 1999 | (JP) | ............................................ 11-274587 |
| Sep. 28, 1999 | (JP) | ............................................ 11-274693 |

(51) Int. Cl.[7] ............................................. H04B 17/00
(52) U.S. Cl. .................... 455/226.1; 455/334; 455/280; 375/346; 375/355
(58) Field of Search ........................... 455/226.1, 334, 455/280, 296, 311, 232.1, 234.1, 234.2; 375/346, 355

(56) References Cited

U.S. PATENT DOCUMENTS

| 4,672,637 | A | | 6/1987 | Halpern et al. ................ 375/96 |
| 4,697,152 | A | | 9/1987 | Westwick ....................... 330/9 |
| 4,728,953 | A | * | 3/1988 | Richmond .................... 342/91 |
| 4,788,696 | A | * | 11/1988 | Sakane et al. .............. 714/705 |
| 4,873,702 | A | | 10/1989 | Chiu ............................. 375/76 |
| 4,965,786 | A | | 10/1990 | Salle .......................... 370/32.1 |
| 5,001,725 | A | | 3/1991 | Senderowicz et al. ........ 375/28 |
| 5,053,770 | A | * | 10/1991 | Mayer et al. ................ 341/118 |
| 5,422,889 | A | * | 6/1995 | Sevenhans et al. ......... 370/442 |
| 5,652,541 | A | | 7/1997 | Yang et al. .................. 329/300 |
| 5,864,586 | A | | 1/1999 | Kato ........................... 375/297 |
| 5,877,718 | A | * | 3/1999 | Andoh et al. ............... 341/155 |
| 5,892,800 | A | * | 4/1999 | Rybicki et al. ............. 375/345 |
| 6,185,260 | B1 | * | 2/2001 | Ishii ............................ 375/279 |
| 6,211,716 | B1 | * | 4/2001 | Nguyen et al. ............. 327/307 |
| 6,333,902 | B1 | * | 12/2001 | Shim ........................ 369/47.54 |
| 6,376,933 | B1 | * | 4/2002 | Goetz et al. .................. 307/91 |
| 6,622,011 | B1 | * | 9/2003 | Joeressen et al. ............. 455/88 |
| 2002/0150151 | A1 | * | 10/2002 | Krone et al. ................ 375/219 |

FOREIGN PATENT DOCUMENTS

| EP | 0 275 548 A1 | 7/1988 |
| EP | 0 653 855 A1 | 5/1995 |
| EP | 0 893 899 A2 | 1/1999 |
| JP | 2-305148 | 12/1990 |
| WO | WO 93/1060 | 5/1993 |
| WO | WO 98/27683 | 6/1998 |
| WO | WO 99/03241 | 1/1999 |

OTHER PUBLICATIONS

Toumelin et al., "A 5–V CMOS Line Controller With 16–Bit Audio Converters", IEEE Custom Integrated Circuits Conference, CH2994–2/91/0000/0192 (1991).
Der et al., "A Switched–Capacitor Differencing Circuit with Common–Mode Rejection for Fully Differential Comparators", CH 3381–1/93/S01.00 (1993).
Haycock et al., "A 2.5Gb/s Bidirectional Signaling Technology", Aug. 21–23, 1997 pp. 149–156.

* cited by examiner

Primary Examiner—Nick Corsaro
Assistant Examiner—Tan Trinh
(74) Attorney, Agent, or Firm—Arent Fox, PLLC

(57) ABSTRACT

A receiver has an offset application circuit for applying a known offset to an input signal, and a decision circuit for comparing the offset-applied input signal with a reference voltage. The level of the input signal is determined based on the known offset and on the result output from the decision circuit. With this configuration, a large common mode voltage can be eliminated in a circuit used for signal transmission.

35 Claims, 60 Drawing Sheets

(TRANSMITTING END)      (RECEIVING END)

OFFSET CODE

[DECISION PERIOD]

[SAMPLE PERIOD]

RECEIVER, TRANSCEIVER CIRCUIT, SIGNAL TRANSMISSION METHOD, AND SIGNAL TRANSMISSION SYSTEM

BACKGROUND OF THE INVENTION

1. Field of the Invention

The present invention relates to a signal transmission technology and, more particularly, to a receiver, a transceiver circuit, a signal transmission method, and a signal transmission system for performing high-speed signal transmission between LSI chips or between a plurality of devices or circuit blocks accommodated on the same chip, or between boards or enclosures.

2. Description of the Related Art

In recent years, the performance of components used to construct computers and other information processing apparatuses has improved greatly; for example, performance improvements for semiconductor memory devices such as DRAM (Dynamic Random Access Memory) and processors and the like have been remarkable. The improvements in the performance of semiconductor memory devices, processors, etc. have come to the point where system performance cannot be improved further unless the speed of signal transmission between components or elements is increased.

For example, the speed of signal transmission between a main storage device such as a DRAM and a processor is becoming a bottleneck impeding performance improvement for a computer as a whole. The need for the improvement of signal transmission speed is increasing not only for signal transmission between enclosures or boards (printed wiring boards), such as between a server and a main storage device or between servers connected via a network, but also for signal transmission between. LSI (Large Scale Integration) chips or between devices or circuit blocks accommodated on the same chip because of increasing integration and increasing size of semiconductor chips, decreasing supply voltage levels (signal amplitude levels), etc.

Specifically, there is a need to increase the signal transmission speed per pin in order to address the increase in the amount of data transmission between LSIs or between boards or enclosures. This is to avoid an increase in package cost, etc. due to increased pin count. As a result, the inter-LSI signal transmission rate in recent years has exceeded 1 Gbps, and in the future (three to eight years from now) it is expected to reach an extremely high value (very high signal transmission rate) such as 4 Gbps or even 10 Gbps.

It is thus desired to provide a transceiver circuit that can evaluate and diagnose signal transmission systems, optimize transmission/reception parameters, and achieve increased receiver sensitivity, and also a receiver that can eliminate a large common mode voltage in a circuit used for signal transmission.

For signal transmission between boards or enclosures, between LSI chips, or between a plurality of devices or circuit blocks accommodated on the same chip, there is a need to increase the efficiency of use of a transmission line by reducing the number of signal lines, wiring patterns, etc. and, in view of this, it is also desired to provide a signal transmission system, a signal transmission method, and a transceiver circuit capable of providing higher-accuracy and higher-speed signal transmission in both directions.

The prior art and its associated problem will be described in detail, later, with reference to the accompanying drawings.

SUMMARY OF THE INVENTION

A first object of the present invention is to provide a transceiver circuit that can evaluate and diagnose signal transmission systems, optimize transmission/reception parameters, and enhance receiver sensitivity. It is also an object of the present invention to provide a receiver that can eliminate a large common mode voltage in a circuit used for signal transmission.

A second object of the present invention is to provide a receiver capable of achieving higher-accuracy and higher-speed signal transmission by allowing a large timing margin for the operation of a decision circuit.

A third object of the present invention is to provide a signal transmission system, a signal transmission method, and a transceiver circuit that can achieve more efficient utilization of the signal transmission line and accurately perform high-speed signal transmission using fewer signal lines, and that can extend the maximum signal line length.

According to the present invention, there is provided a receiver comprising an offset application circuit for applying a known offset to an input signal; and a decision circuit for comparing the offset-applied input signal with a reference voltage, wherein the level of the input signal is determined based on the known offset and on a result output from the decision circuit.

The offset application circuit may include an offset level control circuit for controlling the level of the offset by a digital signal. The receiver may further comprise an input signal level detection circuit for detecting the level of the input signal by increasing or decreasing the level of the offset using the offset level control circuit, and by finding an offset level where the result output from the decision circuit changes. The receiver may further comprise a timing control circuit for controlling decision timing in the decision circuit in such a manner as to vary the decision timing relative to an internal clock in the receiver, and wherein the level of the offset is adjusted by judging an externally supplied, predetermined test pattern at output timing of the timing control circuit, and information concerning the input signal is acquired using the input signal level detection circuit.

The offset voltage application circuit may pass a constant current to a termination resistor provided in parallel to an input terminal of the receiver. The offset voltage application circuit may include a plurality of capacitors and switches, and vary the level of the offset by varying a precharge voltage of each of the capacitors. The offset voltage application circuit varies the level of the offset by passing a constant current into an internal node in the receiver. The offset voltage application circuit varies the level of the offset by passing a constant current into an internal node in the receiver. The received signal quality of the input signal may be diagnosed, or a characteristic of the receiver or driver may be adjusted, by using the waveform of the input signal obtained from the known offset and the result output from the decision circuit.

Further, according to the present invention, there is provided a transceiver circuit having a receiver for receiving a signal input thereto, and a driver for outputting a signal, wherein the receiver comprises an offset application circuit for applying a known offset to the input signal; and a decision circuit for comparing the offset-applied input signal with a reference voltage, wherein the level of the input signal is determined based on the known offset and on a result output from the decision circuit.

According to the present invention, there is also provided a signal transmission system having a first transceiver circuit, a second transceiver circuit, and a signal transmission line connecting between the first and second transceiver circuits, wherein each of the transceiver circuits comprises a receiver for receiving a signal input thereto, and a driver for outputting a signal; and the receiver includes an offset application circuit for applying a known offset to the input signal and a decision circuit for comparing the offset-applied input signal with a reference voltage, wherein the level of the input signal is determined based on the known offset and on a result output from the decision circuit.

A predetermined test pattern may be transmitted from the driver in the first transceiver circuit, the test pattern may be judged at predetermined timing using the receiver in the second transceiver circuit; and the level of the test pattern may be detected by adjusting the level of the offset in the second transceiver circuit, thereby adjusting an equalization parameter of the receiver in the second transceiver circuit. A boundary signal which should be judged to be at a boundary between data "0" and "1" may be transmitted to the receiver in the second transceiver circuit by the driver in the first transceiver circuit; the boundary signal may be received by the receiver in the second transceiver circuit and such a boundary offset may be sought that the result of a decision in the decision circuit of the receiver agrees with the boundary between data "0" and "1"; and zero adjustment of the receiver in the second transceiver circuit may be performed by applying the boundary offset to the receiver at the time of usual input signal reception.

A predetermined test pattern may be transmitted to the receiver in the first transceiver circuit by the driver in the first transceiver circuit; and the test pattern may be received by the receiver in the second transceiver circuit by sequentially changing receive timing in the receiver and the level of the test pattern may be detected, thereby adjusting a parameter of the second transceiver circuit.

In addition, according to the present invention, there is provided a receiver having a plurality of signal lines and a capacitor network having capacitors connected to the signal lines and switches for controlling the connection of the capacitors, wherein the receiver includes a common mode voltage elimination circuit for eliminating a common mode voltage present on the plurality of signal lines by connecting at least one of capacitor nodes containing the component of the common mode voltage to a node held to a specific voltage value.

According to the present invention, there is provided a receiver comprising a plurality of signal: lines and a capacitor network having capacitors connected to the signal lines and switches for controlling the connection of the capacitors, wherein the receiver includes a common mode voltage elimination circuit for eliminating a common mode voltage present on the plurality of signal lines by connecting at least one of capacitor nodes containing the component of the common mode voltage to a node precharged to a specific voltage value.

The common mode voltage elimination circuit may include a corresponding voltage generating circuit for generating a voltage value corresponding to the common mode voltage, and a capacitor charging circuit for charging one end of the capacitor by the output voltage of the corresponding voltage generating circuit. The common mode voltage elimination circuit may include a difference voltage capacitor charging circuit for charging an input capacitor by a difference voltage appearing on the plurality of signal lines, and a connection control circuit for connecting a terminal of the input capacitor to an input terminal of a decision circuit subsequent to a charge period. The difference voltage capacitor charging circuit may perform the elimination of the common mode voltage simultaneously with a differential to single-ended conversion by connecting one node of the capacitor to a constant voltage. The difference voltage capacitor charging circuit may couple two nodes of the capacitor respectively to single-ended amplifiers.

The capacitor network may implement PRD. The receiver may apply feedback for the elimination of the common mode voltage to outputs of two single-ended amplifiers to which signals from the capacitor network are input. The capacitor network may include two or more coupling capacitors, and the coupling capacitors are connected in parallel during a precharge period and in series during a decision period.

According to the present invention, there is provided a receiver comprising an input line via which an input signal is supplied; a plurality of sample-and-hold circuits for sequentially latching the input signal by a multi-phase periodic clock, and for holding the latched input signal; and a decision circuit for making a decision on the input signal by generating a signal corresponding to a weighted sum of the outputs of the sample-and-hold circuits, wherein an output valid period of each sample-and-hold circuit is made longer than one bit time of the input signal; and the decision circuit is operated by using the weighted sum generated during a period where the output valid period of the sample-and-hold circuit overlaps the output valid period of another sample-and-hold circuit operating before or after the sample-and-hold circuit.

The decision circuit may generate a voltage, current, or charge signal corresponding to the weighted sum of the outputs of the sample-and-hold circuits. An operating cycle of the sample-and-hold circuit may be set equal to two bit times of the input signal; and a sample period of the sample-and-hold circuit may be made longer than a hold period thereof, thereby making the output valid period of the sample-and-hold circuit overlap the output valid period of another sample-and-hold circuit operating before or after the sample-and-hold circuit. An operating cycle of the sample-and-hold circuit may; be set equal to three or more bit times of the input signal, and the output valid period of the sample-and-hold circuit is set equal to or longer than one bit time of the input signal.

The weighted sum of the outputs of the sample-and-hold circuits may be generated by converting the output signals of the sample-and-hold circuits into currents by a transconductor using transistors, and by passing the currents into a common load device. The weighted sum may be adjusted by varying the number of transistors to be connected in parallel in the transconductor. A weight in the weighted sum may be adjusted by varying a current bias value in the transconductor.

The decision circuit may generate the signal corresponding to the weighted sum of the outputs of the sample-and-hold circuits by interconnecting capacitors each charged to a hold voltage. The decision circuit may generate the weighted sum based on differences in charges stored in the capacitors. The decision circuit may generate the signal corresponding to the weighted sum of the outputs of the sample-and-hold circuits by moving charges corresponding to the outputs of the sample-and-hold circuits into a common capacitor through a charge transfer circuit. The weighted sum may be adjusted by varying the number of transistors to be connected in parallel in the charge transfer circuit.

Further, according to the present invention, there is provided a transceiver circuit comprising a driver for outputting a transmit signal onto a signal transmission line; a receiver for receiving a receive signal from the signal transmission line; and a compensation voltage generating circuit for generating a compensation voltage used to compensate for an interference voltage caused by the driver, and for supplying the compensation voltage to the receiver, wherein bidirectional signal transmission is performed by controlling an output level of the compensation voltage generating circuit in accordance with the phase relationship between the transmit signal and the receive signal.

The driver may be a constant-current driver. The driver may include a first driver unit array having a plurality of constant-current driver units; and a second driver unit array having a plurality of constant-current driver units, transmit signals being sequentially output by switching between the first and second driver unit arrays. Each of the driver unit arrays may control the operating condition of the plurality of constant-current driver units in each driver unit array and thereby may adjust a transient characteristic of the transmit signal. The transceiver circuit may further comprise a predriver for driving each of the driver unit arrays, wherein the predriver may be driven by a 4n-phase clock whose cycle is twice as long as bit time T, where n denotes the number of driver units in each driver unit array.

The compensation voltage generating circuit may be a replica driver having the same circuit configuration as that of the driver and driven by the same data as that for the driver, and may include a unit for controlling the output amplitude and transient time of the replica driver. The driver may comprise a plurality of driver units, and the replica driver may be similar in configuration to one of the driver units constituting the driver. The compensation voltage generating circuit may further include a correction circuit for generating, based on a past output bit, a correction signal for improving the accuracy of the compensation voltage at decision timing in the receiver.

The compensation voltage generating circuit may generate the compensation voltage based on a data sequence consisting of the present bit and past bit of the transmit signal output from the driver and in accordance with the phase relationship between the transmit signal and the receive signal. The transceiver circuit may further comprise a unit for determining prior to actual signal transmission a compensation voltage for a boundary across which a decision in the receiver changes from data "0" to data "1" or from data "1" to data "0", by transmitting a test pattern from the driver at one end while setting an output current level at zero in the driver at the other end; and a unit for storing the determined compensation voltage, and wherein actual signal transmission may be performed using the stored compensation voltage.

The compensation voltage generating circuit may include a plurality of compensation voltage correction circuits each for generating a voltage level that depends on a data sequence consisting of the present bit and past bit of the transmit signal output from the driver and on the phase difference between the transmit signal and the receive signal; and a selection circuit for selecting the output of one of the plurality of compensation voltage correction circuits in accordance with the data sequence.

A compensation offset value may be determined based on the value of a bit sequence of n past bits including the present bit, and wherein the transceiver circuit may include $2^n$ receivers corresponding to $2^n$ kinds of compensation voltages and a selection circuit for selecting a receiver output corresponding to an actual bit sequence. The transceiver circuit may further comprise an equalization circuit, provided for the driver or the receiver or for both the driver and the receiver, for compensating for a characteristic of the signal transmission line, and wherein the compensation voltage generating circuit may include a unit for receiving a test pattern and adjusting so as to minimize an interference value from the driver at the same end and intersymbol interference introduced into a, signal transmitted from the driver at the opposite end. The transceiver circuit may further comprise an impedance holding circuit for holding an output impedance of the driver at a constant value. The transient time of the transmit signal output from the driver may be set substantially equal to bit time T.

According to the present invention, there is also provided a signal transmission system comprising a first transceiver circuit, a second transceiver circuit, and a signal transmission line connecting between the first and second transceiver circuits, wherein at least one of the first and second transceiver circuits is a transceiver circuit comprising a driver for outputting a transmit signal onto a signal transmission line; a receiver for receiving a receive signal from the signal transmission line; and a compensation voltage generating circuit for generating a compensation voltage used to compensate for an interference voltage caused by the driver, and for supplying the compensation voltage to the receiver, wherein bidirectional signal transmission is performed by controlling an output level of the compensation voltage generating circuit in accordance with the phase relationship between the transmit signal and the receive signal.

Further, according to the present invention, there is also provided a signal transmission method, having a driver for outputting a transmit signal onto a signal transmission line and a receiver for receiving a receive signal from the signal transmission line, in which a compensation voltage used to compensate for an interference voltage caused by the driver is generated and supplied to the receiver, wherein bidirectional signal transmission is performed by controlling the level of the compensation voltage in accordance with the phase relationship between the transmit signal and the receive signal.

The compensation voltage may be generated based on a data sequence consisting of the present bit and past bit of the transmit signal output from the driver and in accordance with the phase relationship between the transmit signal and the receive signal. A compensation voltage for a boundary across which a decision in the receiver changes from data "0" to data "1" or from data "1" to data "0" may be determined prior to actual signal transmission by transmitting a test pattern from the driver at one end while setting an output current level at zero in the driver at the other end, the determined compensation voltage may be stored in memory, and actual signal transmission may be performed using the stored compensation voltage. Transient time of the transmit signal output from the driver may be set substantially equal to bit time T.

BRIEF DESCRIPTION OF THE DRAWINGS

The present invention will be more clearly understood from the description of the preferred embodiments as set forth below with reference to the accompanying drawings, wherein:

FIGS. 63A and 63B are diagrams for explaining multi-phase clocks applied to the predriver shown in; FIG. 61;

DESCRIPTION OF THE PREFERRED EMBODIMENTS

Before proceeding to the detailed description of the preferred embodiments of the receiver, transceiver circuit, signal transmission method, and signal transmission system according to the present invention, the prior art and problems associated with the prior art will be described first.

Figure 1:
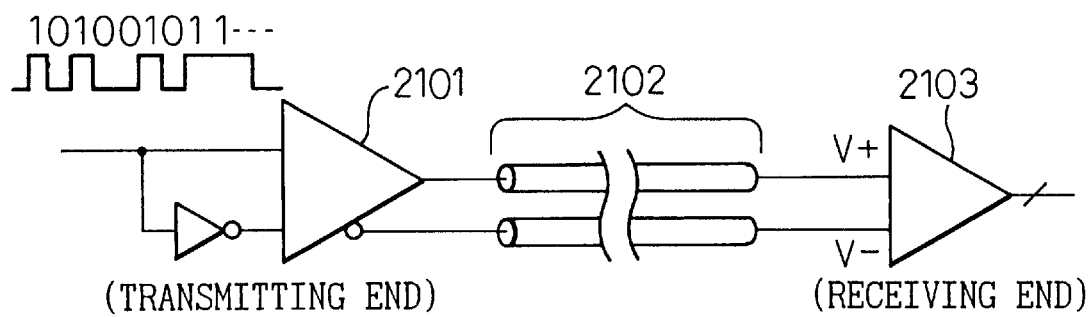
FIG. 1 is a block diagram schematically showing one example of a signal transmission system according to the prior art.

FIG. 1 is a block diagram schematically showing one example of a signal transmission system according to the prior art. In FIG. 1, reference numeral 2101 is a differential driver, 2102 is a signal transmission line (cable), and 2103 is a differential receiver (a receiver).

Generally, differential signal transmission, such as shown in FIG. 1, is employed to perform high-speed signal transmission, for example, between boards or enclosures (for example, between a server and a main storage device). Here, the differential driver 2101, for example, is provided at the server (main storage device) at the signal transmitting end, while the receiver 2103 is provided at the main storage device (server) at the signal receiving end. Signal transmission using differential signals (complementary signals) is used not only for signal transmission between boards or enclosures but also for signal transmission, for example, between devices or circuit blocks within a chip.

Figure 2:
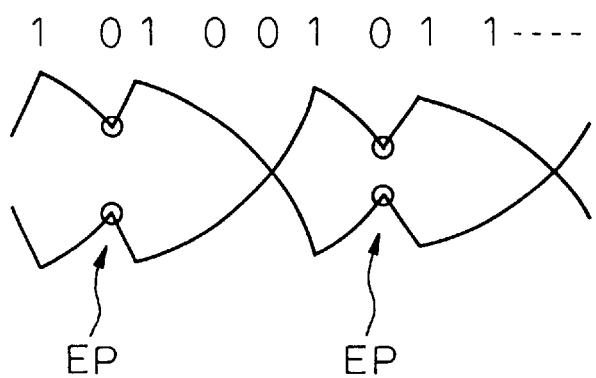
FIG. 2 is a waveform diagram showing one example of signal data transmitted by the signal transmission system of FIG. 1.

FIG. 2 is a waveform diagram showing one example of signal data transmitted by the signal transmission system of FIG. 1.

When transmitting a data signal between LSIs or between boards or enclosures, if the transmission distance along the transmission line (cable 2102), etc is relatively long, or if the conductor size of the transmission line, for example, is small, intersymbol interference occurs due to skin effect or other high-frequency losses, making it difficult to accurately discriminate between signal data "0" and "1" and thus limiting the signal transmission speed. For example, when data "101001011 . . . " is transmitted from the differential driver 2101 at the transmitting end to the differential receiver 2103 at the receiving end in the signal transmission system shown in FIG. 1, the waveform of the signal data received at the receiving end (the differential receiver 2103) is distorted as shown in FIG. 2; in that case, since the voltage values of the differential signal do not cross at points (EP) where they should normally cross, the differential receiver (2103) constructed using a conventional differentials amplifier would erroneously decide, for example, that the received data is "100001111 . . . ."

The, same phenomenon also occurs, for example, when a high-speed signal of several Gbps is transmitted over printed circuit board traces or copper cables; in that case also, the received waveform becomes an analog-like waveform taking values intermediate between a 0 and a 1, as shown in FIG. 2, rather than a digital-like signal waveform representing binary 0s and 1s. Accordingly, for the proper operation of a high-speed signal transmission/reception circuit (transceiver circuit), it would become necessary to acquire data concerning the waveform actually received by the receiver and to adjust the transceiver circuit based on the acquired value.

In the prior art, however since there is provided no means for observing the actual waveform, for example, with the LSI mounted on a printed circuit board, it has only been possible to decide whether or not the signal can be received at the receiver (a go/no-go decision).

Usually, differential signal transmission is employed for signal transmission between LSIs or between boards or enclosures, for example, when the transmission distance is relatively long. The reason is that the, noise induced on the transmission lines (signal lines) during signal transmission often becomes common mode noise with respect to the signal and, in the case of differential transmission, such common mode noise can be rejected.

Figure 3:
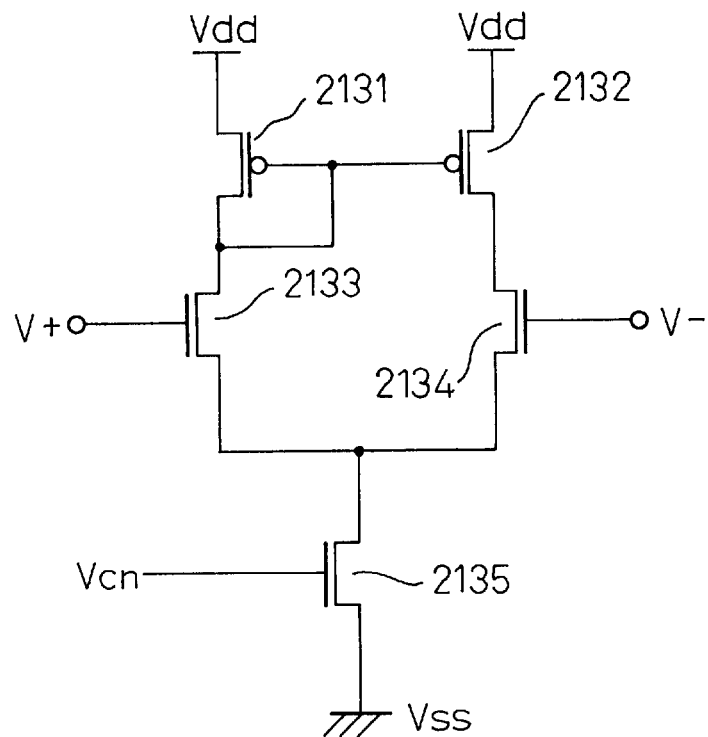
FIG. 3 is a circuit diagram showing one example of a receiver according to the prior art.

FIG. 3 is a circuit diagram showing one example of the receiver according to the prior art; as shown, the receiver here is constructed as a differential receiver.

In FIG. 3, reference numerals 2131 and 2132 are P-channel MOS transistors (PMOS transistors), and 2133 to 2135 are N-channel MOS transistors (NMOS transistors).

As shown in FIG. 3, the prior art receiver is, constructed from a differential amplifier stage using a transistor differential pair, for example, in order to receive a differential signal (V+, V−). However, the differential pair operates properly only when the differential amplifier stage acts as an active device. Furthermore, when a large common mode voltage is applied, for example, the characteristic of the differential amplifier stage changes from that when the common mode noise is small, and the design characteristic may not be obtained.

That is, common mode voltage elimination means using active devices, such as differential amplifier stages, have a problem yet to be solved in that the common mode voltage range that can be handled cannot be made large enough. Further, it has traditionally been practiced to remove common mode voltages over a wide range using a transformer, but this requires adding outside the LSI an external passive component (transformer) that does not pass DC signals, and becomes a major factor that contributes to increasing the cost.

Next, various embodiments according to a first mode of the present invention will be described with reference to FIGS. 4 to 36.

Figure 4:
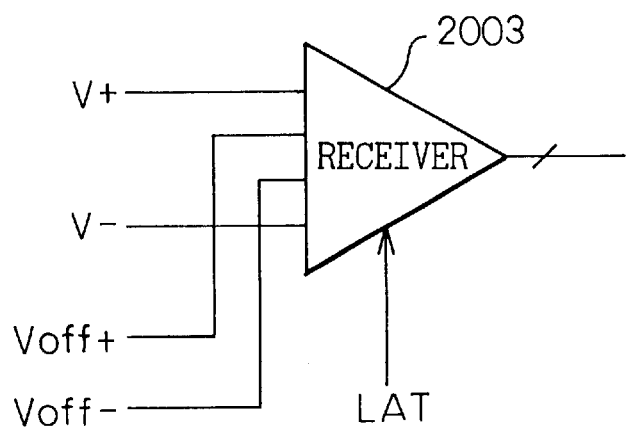
FIG. 4 is a block circuit diagram showing the basic configuration of a receiver according to a first mode of the present invention.
Figure 5A:
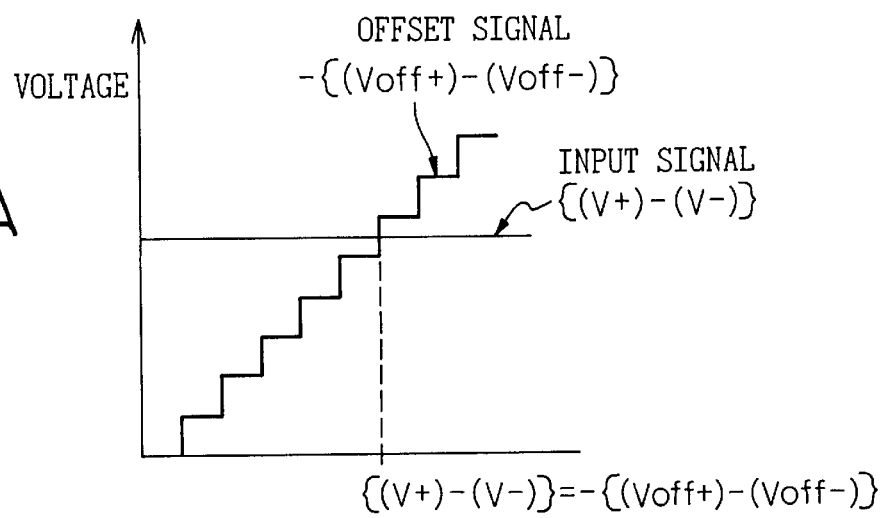
FIGS. 5A and 5B are diagrams for explaining the operation of the receiver of FIG. 4.
Figure 5B:
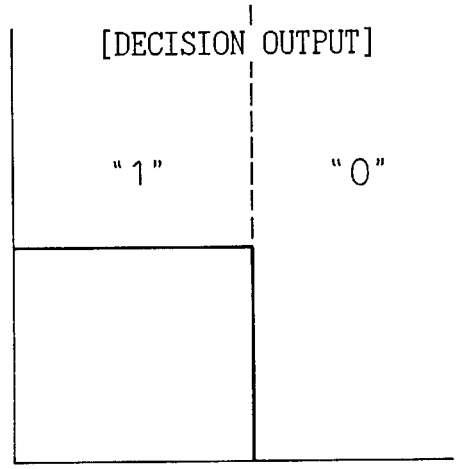

FIG. 4 is a block circuit diagram showing the basic configuration of a receiver according to the first mode of the present invention, and FIGS. 5A and 5B are diagrams for explaining the operation of the receiver of FIG. 4.

As shown in FIG. 4, the first mode of the present invention includes a means for applying a known offset voltage (Voff+, Voff−) to the receiver 2003. The waveform with the offset applied to it is compared with a reference voltage by a decision circuit in the receiver 2003, and is converted into a digital-like signal (a 0 or a 1) based on the result of the comparison. More specifically, the decision circuit outputs a 1 when the input is larger than the reference voltage, and a 0 when it is smaller.

That is, as shown in FIGS. 5A and 5B, when the voltage levels of the differential (complementary) input signals are denoted by V+ and V−, the effective input Va is given by Va={(V+)−(V−)}+{(Voff+)−(Voff−)}, and the output of the decision circuit changes from a 0 to a 1 or vice versa when the sign of the effective input Va is inverted. Accordingly, the boundary across which the decision output of the receiver switches between a 0 to a 1 lies where {(V+)−(V−)}={(Voff+)−(Voff−)}. When {(V+)−(V−)}>{(Voff+)−(Voff−)}, the decision output of the receiver is a 1; conversely, when {(V+)−(V−)}<{(Voff+)−(Voff−)}, the decision output of the receiver is a 0.

In the receiver according to the first mode of the present invention, the boundary across which the output of the decision circuit in the receiver switches between a 0 and a 1 is sought, for example., by repeatedly making decisions by reference to a periodic test pattern while controlling the value of the offset voltage (Voff+, Voff−) in a digital-like manner using a D/A converter; by so doing, analog-like values of the input signal (V+, V−) can be found with an accuracy equivalent to the resolution of the D/A converter. Furthermore, by making decisions while incrementally shifting the decision timing relative to the test pattern, the analog value of the signal input to the receiver can be found accurately.

In other words, with the decision timing fixed by seeking the boundary across which the output of the decision circuit in the receiver switches between a 0 and a 1 while sequentially varying the offset voltage, the level of the signal at that fixed timing can be found; further, by repeating the same process while sequentially varying the decision timing, the level of the signal at various decision timings (thus an analog-like signal waveform) can be determined.

In this way, according to the first mode of the present invention, analog-like values of the signal input to the receiver can be collected, and even when signal transmission is being performed at high speed (for example, at several Gbps), the transmit waveform of the signal, the quality of that waveform, etc. can be evaluated while the chip remains mounted in place. Furthermore, according to the first mode of the present invention, transceiver parameters (parameters etc. used for equalizing) can be adjusted based on analog-like data, and also the input offset voltage to the receiver can be adjusted for variations in the threshold voltage (Vth) of transistors.

Figure 6:
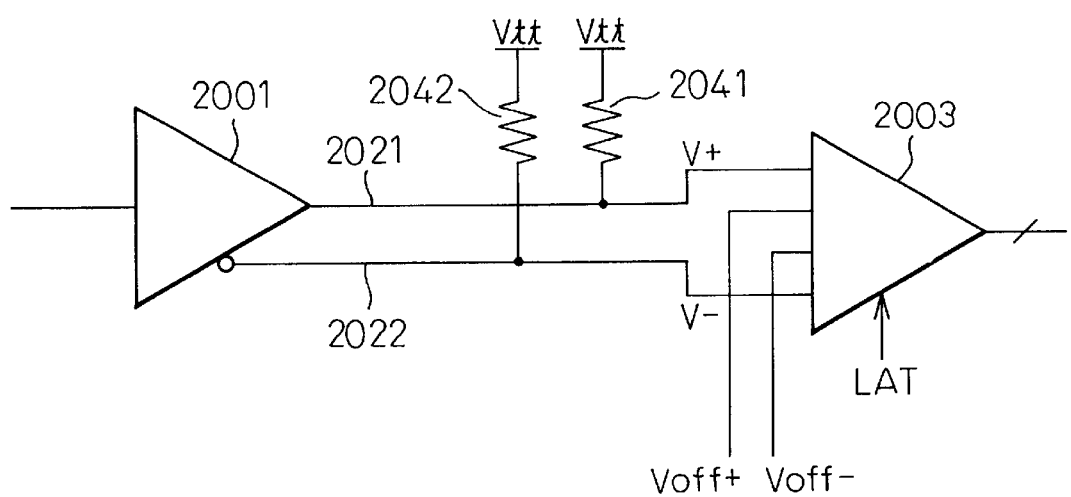
FIG. 6 is a block circuit diagram schematically showing one example of a signal transmission system to which the present invention is applied.

Thus, according to the first mode of the present invention, using a receiver operating in a digital-like manner, the analog value of the signal waveform applied to the input terminals of the receiver can be found accurately, thus permitting the evaluation and diagnosis of the transceiver circuit, the adjustment of parameters, etc. As a result, the cost of testing can be reduced, and a high-speed signal transmission transceiver having excellent performance can be achieved. FIG. 6 is a block circuit diagram schematically showing one example of a signal transmission system to which the present invention is applied. In FIG. 6, reference numeral 2001 is the driver (differential driver), 2021 and 2022 are signal transmission lines (cables), 2003 is the receiver, and 2041 and 2042 are termination resistors.

The driver 2001 transmits NRZ signals onto the signal transmission lines (cables) 2021 and 2022 at a data transmission rate of, for example, 1.25 Gbps. The signals output from the driver 2001 are sent over the cables 2021 and 2022 and terminated with the termination resistors 2041 and 2042, and then applied to the input terminals (V+ and V−) of the receiver 2003.

Figure 7:
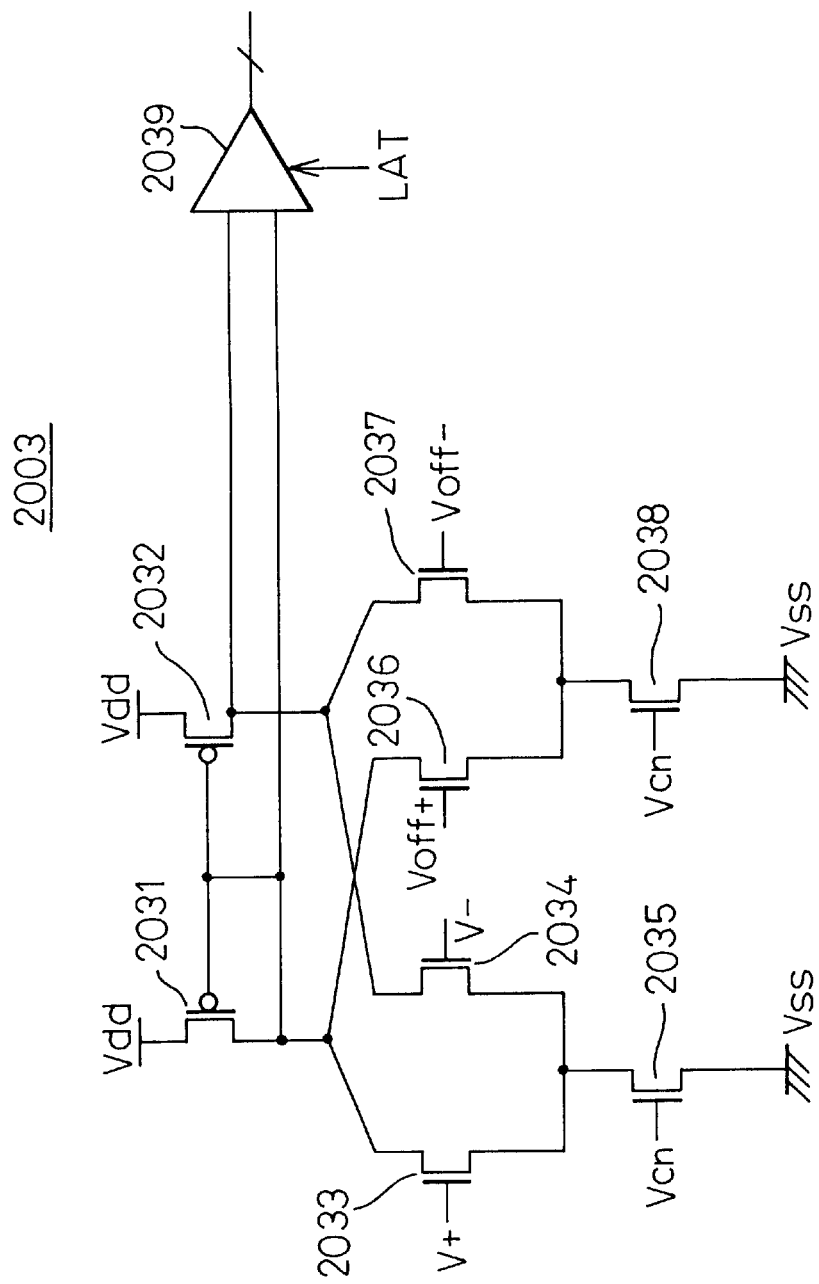
FIG. 7 is a circuit diagram showing a receiver as a first embodiment according to the first mode of the present invention.

FIG. 7 is a circuit diagram showing a receiver as a first embodiment according to the first mode of the present invention; the receiver 2003 of FIG. 6 is shown here. In FIG. 7, reference numerals 2031 and 2032 are P-channel MOS transistors (PMOS transistors)., 2033 to 2038 are N-channel MOS transistors (NMOS transistors), and 2039 is a decision circuit (latch circuit). Here, reference character Vcn represents a bias voltage applied to the gates of the transistors 2035 and 2038.

As shown in FIG. 7, the receiver 2003 comprises a preamplifier, which includes differential pair transistors 2033 and 2034 for application of input signals (input voltages V+ and V−) and differential pair transistors 2036 and 2037 for application of offset signals (offset voltagesVoff+ and Voff), and a decision circuit (regenerative latch circuit) 2039 which makes a decision on the output of the preamplifier. More specifically, the positive logic input signal V+ is applied to the gate of one transistor 2033 in the first differential pair, while the negative logic input signal V− is applied to the gate of the other transistor 2034. Likewise, the positive logic offset signal Voff+ is applied to the gate of one transistor 2036 in the second differential pair, while the negative logic offset signal Voff− is applied to the gate of the other transistor. 2037. Then, the output of the preamplifier having the first and second differential pairs is latched by a latch signal LAT into the regenerative latch circuit (decision circuit) 2039 where a decision is made on the output to determine whether the data is a 0 or a 1. Here, the offset signals (offset differential voltages Voff+ and Voff−) applied to the second differential pair (offset voltage application differential pair) have a known voltage level.

According to the first embodiment, a decision can be made as to whether or not the received voltage level (input voltages V+ and V−) at the timing that the decision circuit 2039 operates exceeds the reference voltage level (offset voltages Voff+ and Voff−), and more specifically, whether or not {(V+)−(V−)} is larger than −{(Voff+)−(Voff−)}, and thus the quality of the signal transmission system from the driver to the receiver can be evaluated. Furthermore, since the result of the decision (the decision output) is output as digital data representing a 0 or a 1, the digital data is transferred to logic circuitry or a processor responsible for the control of the transceiver so that the digital data can be used for evaluation, adjustment of characteristics, etc. For example, when a fault condition occurs in the apparatus, according to the first embodiment it is possible to know, using a test pattern, whether or not the received waveform is greater in value than the reference value while the chips and cables remain mounted in place. This makes it possible to provide quick corrective measures.

Figure 8:
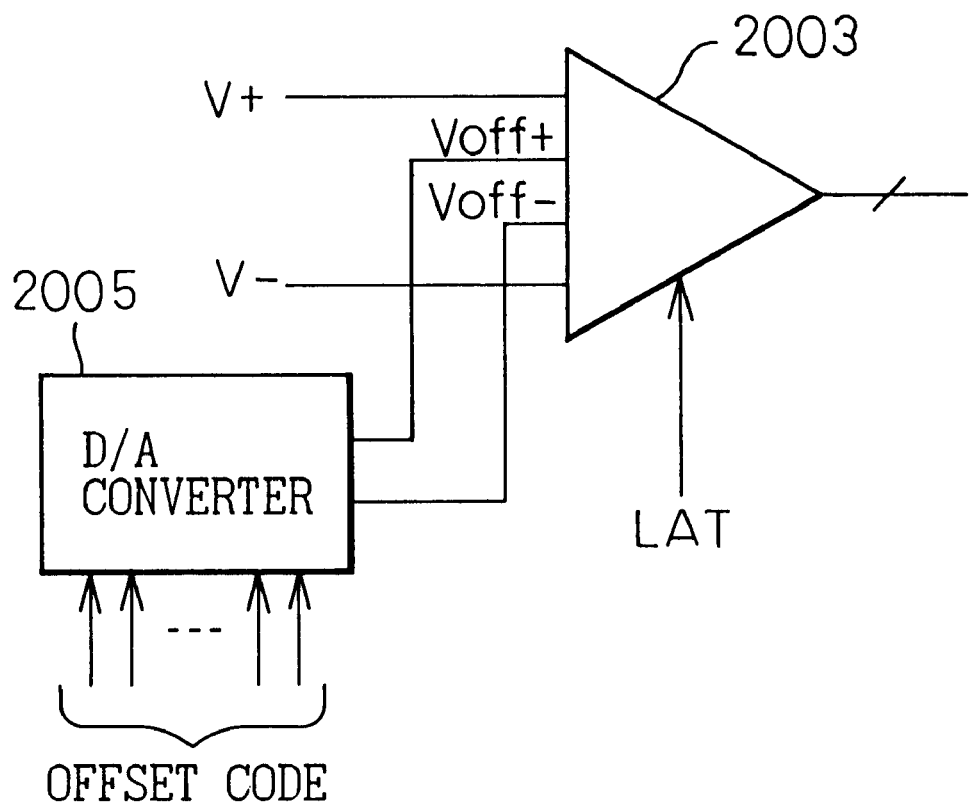
FIG. 8 is a block circuit diagram showing a receiver as a second embodiment according to the first mode of the present invention.

FIG. 8 is a block circuit diagram showing a receiver as a second embodiment according to the first mode of the present invention. In FIG. 8, reference numeral 2004 is a D/A converter for converting a digital offset code into analog form for output.

As shown in FIG. 8, the second embodiment differs from the first embodiment shown in FIG. 7 by the inclusion of a means for increasing or decreasing the offset level (offset value: offset voltage). More specifically, while applying, for example, a test pattern repeatedly in a periodic fashion, the offset value is varied in incremental steps from a minimum value toward a maximum value using the D/A converter 2005, to observe where the decision value changes from a 0 to a 1 or vice versa. With this configuration, the signal value (V+, V−) applied to the receiver (decision circuit) 2003 can be found with an accuracy equivalent to the resolution of the D/A converter 2005, and analog-like values of the received signal (the level of the input signal) can be determined, for example, with the LSI mounted on a printed circuit board. Here, the offset code applied to the D/A converter 2005 is, for example, a 6-bit or 7-bit code.

Figure 9:
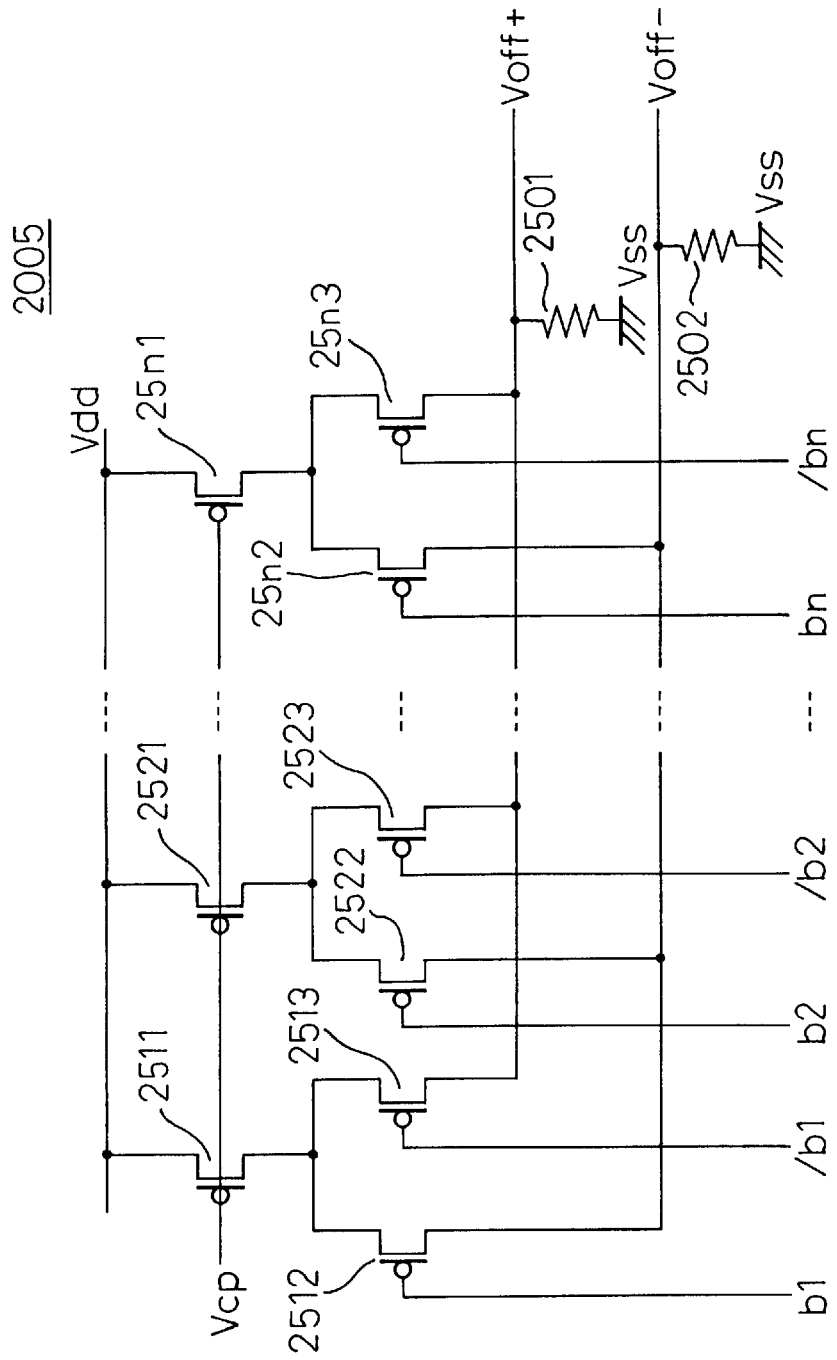
FIG. 9 is a circuit diagram showing one example of a D/A converter in the receiver of FIG. 8.

FIG. 9 is a circuit diagram showing one example of the D/A converter 2005 in the receiver of FIG. 8.

As shown in FIG. 9, the D/A converter 2005 comprises, for example, a plurality of PMOS transistors 2511 to 2513, 2521 to 2523, ..., 25n1 to 25n3, and load resistors 2501 and 2502. A bias voltage Vcp is applied to the gates of the transistors 2511, 2521, ..., 25n1, while the gates of the transistors 2512, 2522, ..., 25n2 and 2513, 2523, ..., 25n3 are supplied with the offset code, b1, b2, ..., bn and /b1, /b2, ..., /bn, respectively. The currents flowing through the transistors 2512, 2522, ..., 25n2 and 2513, 2523, 25n3 are respectively combined and flown into the load resistors 2502 and 2501, respectively, and the offset voltages Voff−and Voff+ are output. That is the D/A converter 2005 generates the offset voltages Voff+ and Voff−of the level proportional to the offset code (b1, /b1; b2, /b2; ... ; bn, /bn).

Figure 10:
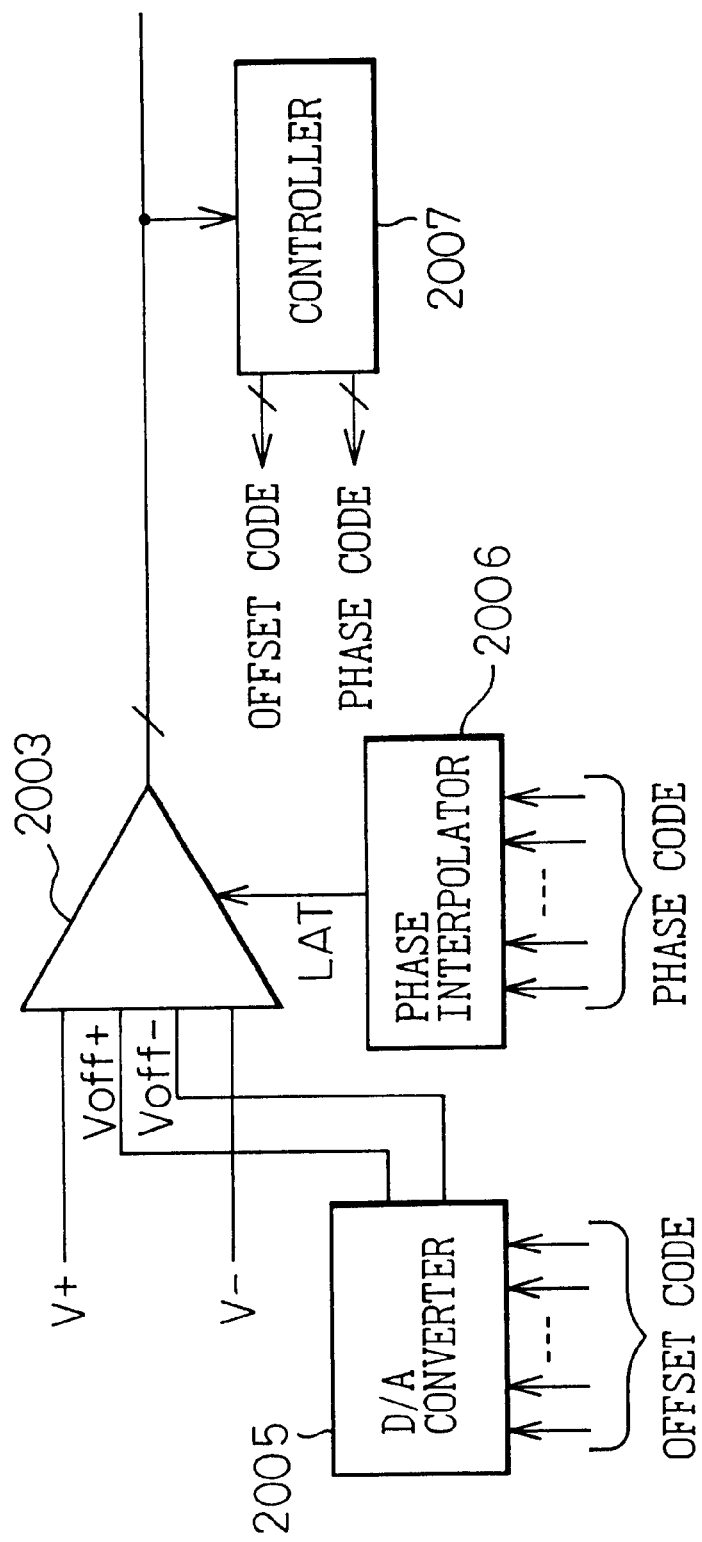
FIG. 10 is a block circuit diagram showing a receiver as a third embodiment according to the first mode of the present invention.

FIG. 10 is a block circuit diagram showing a receiver as a third embodiment according to the first mode of the present invention. In FIG. 10, reference numeral 2006 is a phase interpolator, and 2007 is a controller.

As is apparent from the comparison between FIGS. 8 and 10, the third embodiment includes, in addition to the above-described configuration of the second embodiment, a means (phase interpolator 2006) for shifting the receive timing (decision timing) relative to the received signal (input signal) various known configurations can be employed for the phase interpolator 2006.

The receiver 2003 (the decision circuit 2039) operates, for example, at the rising edge of a timing pulse LAT supplied from the phase interpolator 2006. The phase code applied to the phase interpolator 2006 is controlled, for example, by a 6-bit digital signal from a clock recovery circuit (not shown) during usual signal reception, but is controlled by a signal supplied from a separate control circuit (the controller 2007) during waveform diagnosis. The controller 2007 receives the output of the receiver 2003 and generates not only the offset code applied to the D/A converter 2005 but also the phase code (for example, a 6-bit digital signal) applied to the phase interpolator 2006.

According to the third embodiment, by adding a small amount of circuitry (that is, by just adding simple circuitry to the timing generating circuit), not only the level of the received signal (input signal) but also the waveform of the received signal can be acquired with a high temporal resolution. To describe this specifically, when the clock frequency of the phase interpolator 2006 is 625 MHz (one cycle is 1.6 ns) and the phase code is a 6-bit signal, for example, the waveform of the received signal can be obtained with a temporal resolution of 25 ps. The level of the received signal, as in the foregoing second embodiment, is defined by the resolution of the D/A converter 2005 (for example, a 6-bit or 7-bit offset code).

Figure 11:
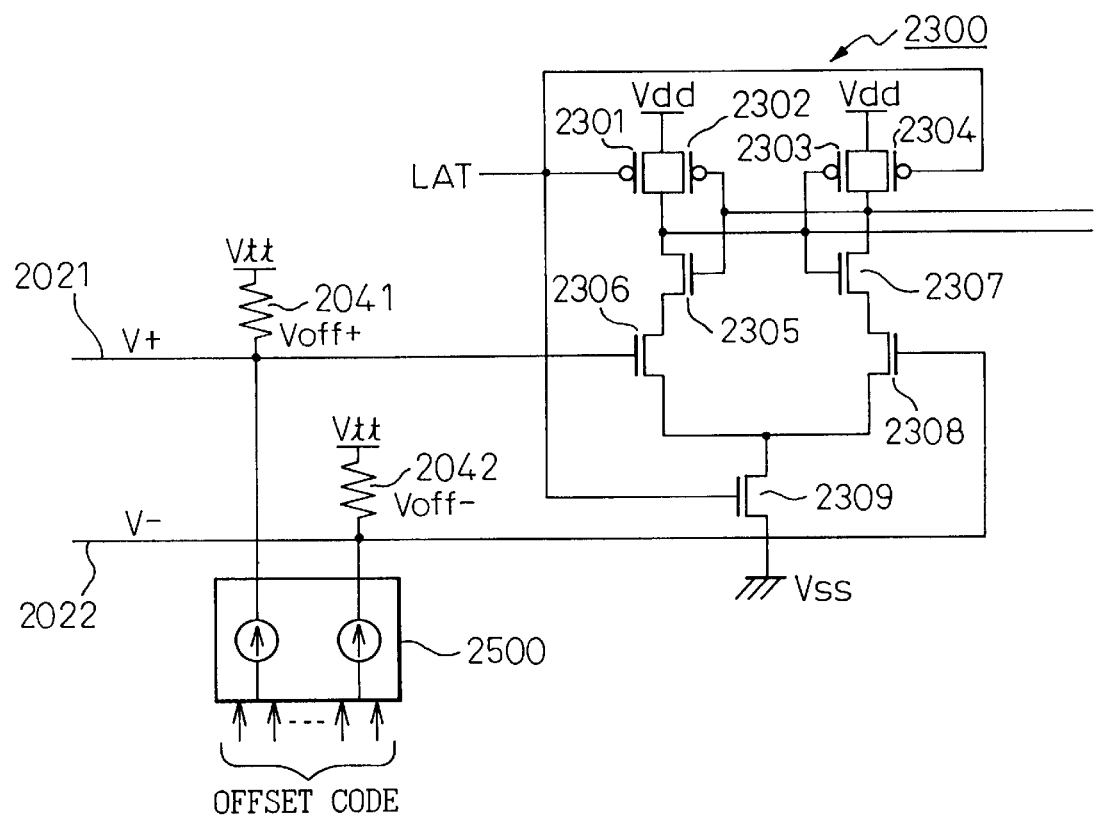
FIG. 11 is a block circuit diagram showing a receiver as a fourth embodiment according to the first mode of the present invention.

FIG. 11 is a block circuit diagram showing a receiver as a fourth embodiment according to the first mode of the present invention. In FIG. 11, reference numeral 2300 indicates the receiver (differential receiver), and 2500 designates a current D/A converter.

As shown in FIG. 11, in the fourth embodiment, the receiver 2300 is a conventional differential receiver, and the offset is applied at the front stage (input stage) of this receiver 2300. That is, the D/A converter 2500 whose current value is controlled by the offset code is provided for the termination resistors 2041 and 2042 provided on the signal transmission lines 2021 and 2022 and, by injecting currents from the constant voltage sources in the D/A converter 2500 into the input terminals of the receiver 2300, the offset voltage (Voff+, Voff−) is applied to the received signal (V+, V−) at the input stage of the receiver 2300. Here, the D/A converter 2500 is controlled by the offset code consisting, for example, of six or so bits.

In this way, according to the fourth embodiment, the offset (Voff+, Voff−) can be applied to the receiver, if it is terminated at the receiving end, regardless of the circuit configuration employed for the receiver. Another advantage is that the high-speed operation of the circuit is not impaired since there is no need to add an extra circuit to an internal node of the receiver 2300 but the additional circuit is inserted at the low-impedance input side (because of the parallel insertion of termination resistors). In the fourth embodiment, a regenerative latch circuit is used as the receiver 2300.

Figure 12:
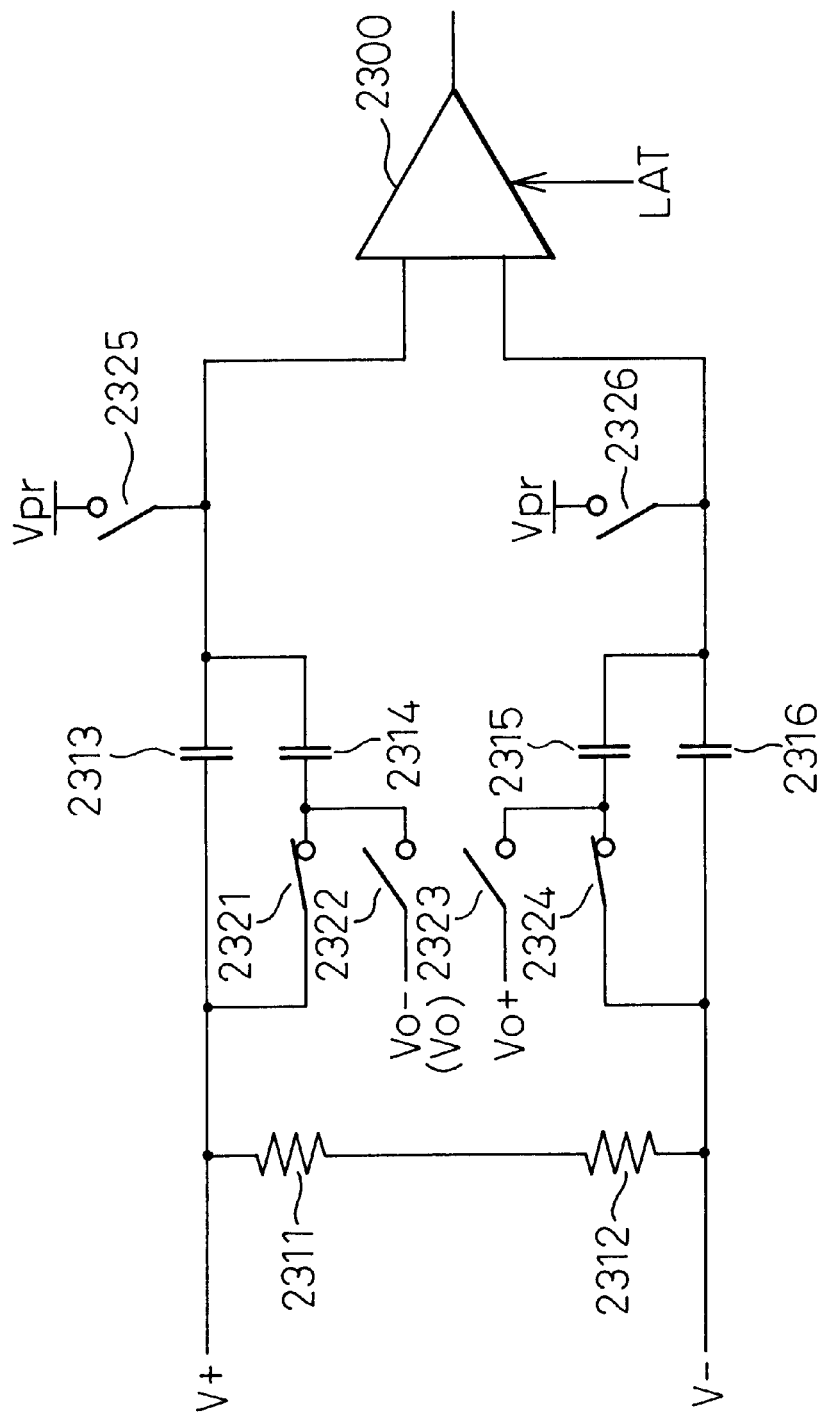
FIG. 12 is a block circuit diagram showing a receiver as a fifth embodiment according to the first mode of the present invention.

FIG. 12 is a block circuit diagram showing a receiver as a fifth embodiment according to the first mode of the present invention. In FIG. 12, reference numeral 2311 and 2312 are termination resistors, 2313 to 2316 are capacitors, and 2321 and 2326 are switches.

In the fifth embodiment, first, in the precharge period, the switches 2321 and 2324 are turned off and the switches 2322, 2323, 2325, and 2326 are turned on, and a difference voltage representing the difference between precharge voltage Vpr and base point voltage V0 (V0−, V0+) is applied to store charges on the capacitors 2314 and 2315. Next, when the regenerative latch circuit 2300 makes a decision on the received signal, the switches 2321 and 2324 are turned on and the switches 2322, 2323, 2325, and 2326 are turned off, as shown in FIG. 12, thereby connecting the capacitors 2314 and 2315 in parallel with the capacitors 2313 and 2316.

To describe this more specifically, the receiver (the regenerative latch circuit 2300) is capacitively coupled to the inputs. In the precharge period, the input nodes of the latch circuit 2300 are precharged to the precharge voltage Vpr; on the other hand, the nodes on the signal line side of the capacitors 2314 and 2315 are supplied with the base point voltages V0 (V0− and V0+) since the switches 2322 and 2323 are on. Here, the offset voltage (Voff+, Voff−) can be adjusted by controlling the value of the precharge voltage Vpr using, for example, a 6-bit D/A converter. The reason is that the voltage across each of the capacitors 2314 and 2315 is (Vpr−V0), and this voltage is applied to each input during the decision period.

The fifth embodiment can be applied to the receiver of any circuit configuration, if the input terminals are connected to gate electrodes. Further, since the mechanism for applying the offset voltage is essentially linear, an added advantage is that distortion due to nonlinearity does not occur.

Figure 13:
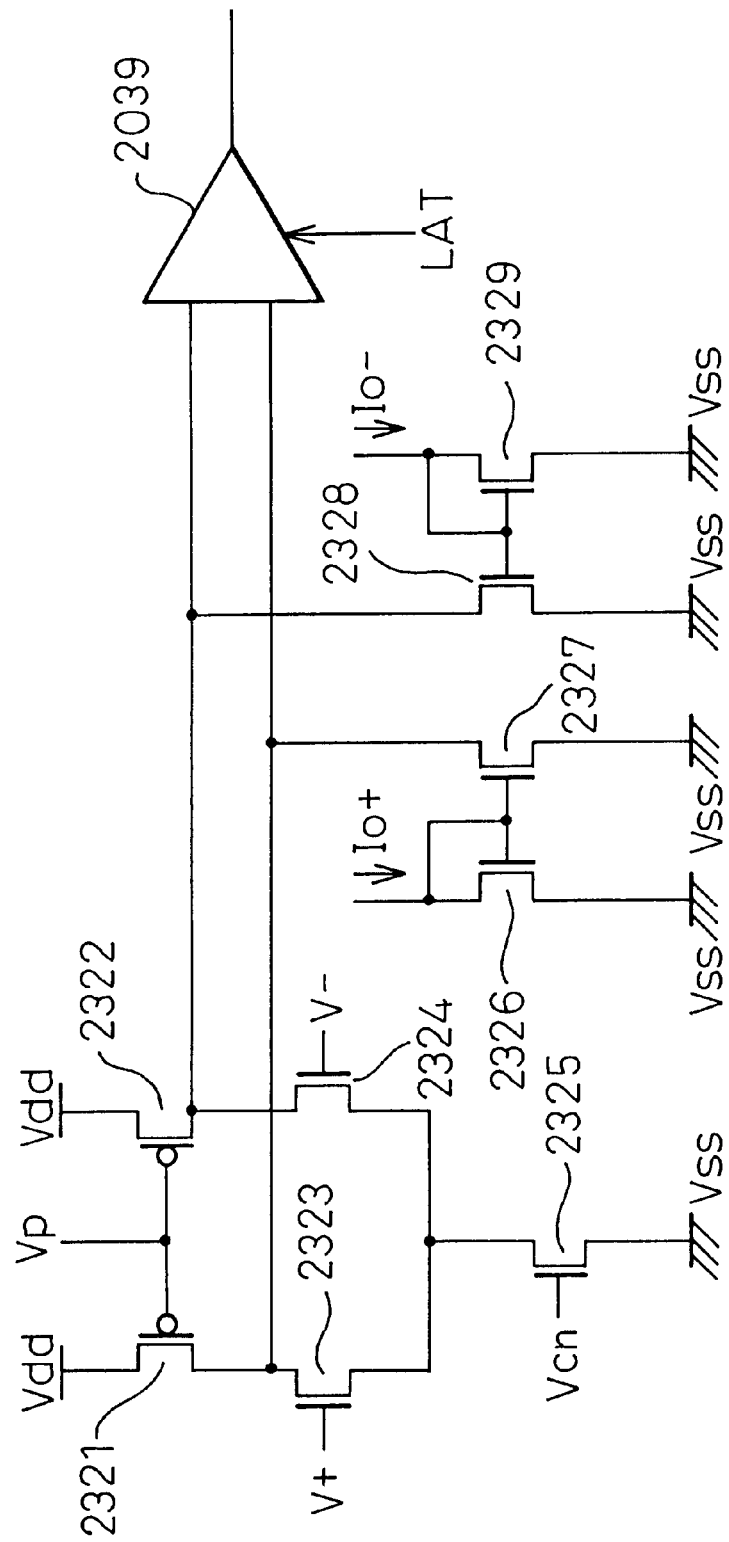
FIG. 13 is a block circuit diagram showing a receiver as a sixth embodiment according to the first mode of the present invention.

FIG. 13 is a block circuit diagram showing a receiver as a sixth embodiment according to the first mode of the present invention.

As shown in FIG. 13, in the sixth embodiment, the input stage of the decision circuit (regenerative circuit 2039) is a differential pair having a tail current as a constant current. More specifically, a constant current circuit (transistors 2327 and 2328) for passing constant differential currents (Io+ and Io−) is provided in addition to the usual input differential pair (transistors 2323 and 2324). These currents flow into PMOS transistors (load devices) 2321 and 2322, and the resulting output is judged by the regenerative latch, circuit (decision circuit). Here, the currents Io+ and Io−flowing in the transistors 2326 and 2329 connected in a current mirror configuration with the transistors 2327 and 2328, respectively, can be varied in value (offset level) using a D/A converter" such as the one (2005) previously shown in FIG. 9.

Since, unlike the fifth embodiment, the offset is applied not by a voltage but by a current, the sixth embodiment can be applied to higher-speed signal transmission. Furthermore, since the bias can be varied using a smaller control current, current consumption can also be reduced.

Figure 14:
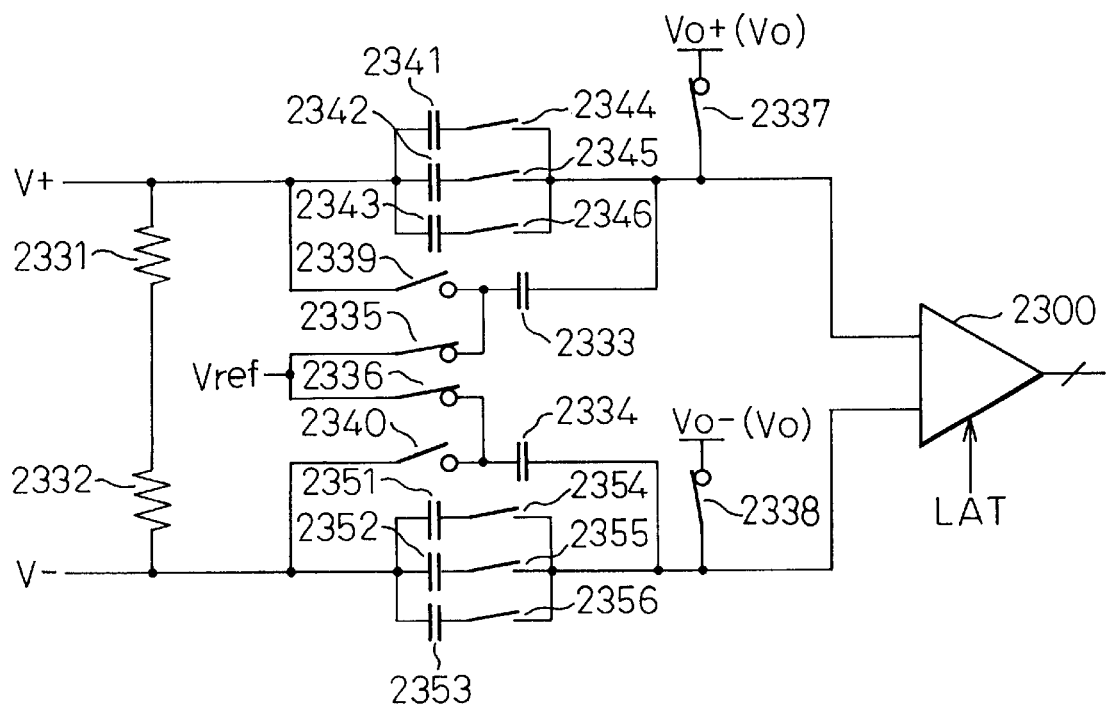
FIG. 14 is a block circuit diagram showing a receiver as a seventh embodiment according to the first mode of the present invention.

FIG. 14 is a block circuit diagram showing a receiver as a seventh embodiment according to the first mode of the present invention. In FIG. 14, reference numerals 2331 and 2332 are termination resistors, 2333, 2334, 2341 to 2343, and 2351 to 2353 are capacitors, and 2335 to 2340, 2344 to 2346, and 2354 to 2356 are switches. Here, the capacitors 2341 to 2343 and 2351 to 2353 and the switches 2344 to 2346 and 2354 to 2356 are provided to control equalization parameters; in FIG. 14, the capacitors and switches are shown in groups of three, but the arrangement is not limited to this particular example.

In the seventh embodiment, first, in the precharge period, the switches 2335 to 2338 are turned on and the switches 2339 and 2340 are turned off, as shown in FIG. 14, and a difference voltage representing the difference between base point voltage V0 (V0−, V0+) and reference voltage Vref is applied to store charges on the capacitors 2333 and 2334. Next, when the receiver (the regenerative latch circuit 2300) makes a decision on the received signal, the switches 2335 to 2338 are turned off and the switches 2339 and 2340 are turned on.

That is, the seventh embodiment includes, in addition to the configuration of the fifth embodiment, a configuration in which the capacitors coupled to the inputs of the receiver 2300 perform PRD (Partial Response Detection). The PRD performs equalization on the input signal waveform, and the equalization parameters are controlled by switching the capacitor values. More specifically, the on/off states of the switches 2344 to 2346 and 2354 to 2356 are determined, for example, at power-on initialization, etc. so that input signals can be received with high sensitivity; the switch states, once determined, are maintained thereafter, regardless of whether the operation is a received signal decision operation or otherwise. That is, the seventh embodiment accomplishes optimum equalization by receiving successive signals of two bits and by selecting the equalization parameters (controlling the switch states of the switches 2344 to 2346 and 2354 to 2356) in such a manner as to minimize the degree to which the reception level of the present signal depends on the previous bit.

Figure 15:
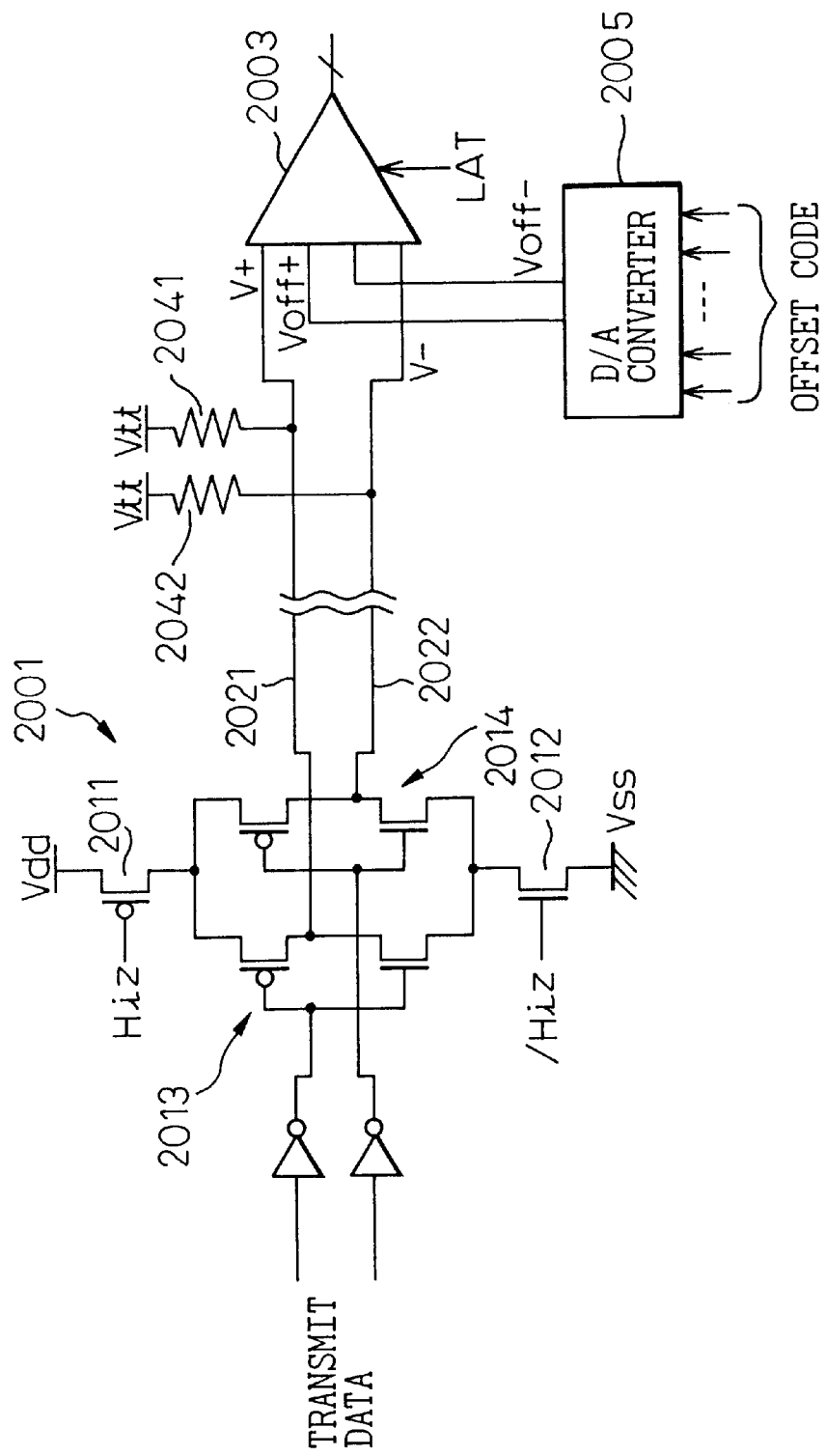
FIG. 15 is a block circuit diagram showing a signal transmission system as an eighth embodiment according to the first mode of the present invention.

FIG. 15 is a block circuit diagram showing a signal transmission system as an eighth embodiment according to the first mode of the present invention. Here, the termination voltage Vtt applied to the termination resistors 2041 and 2042 is set at an optimum value for the receiver 2003.

The eighth embodiment has the function of outputting signals that make the difference voltage of the pair of signals (complementary signals V+ and V−) equal to zero by the driver 2001 holding its output stage in a high impedance state. That is, as shown in FIG. 15, signals Hiz (high level "H") and /Hiz (low level "L") are applied to the gates of a PMOS transistor 2011 and an NMOS transistor 2012, the former being inserted between an inverter 2013 and a high voltage supply line Vdd and the latter being inserted between an inverter 2014 and a low voltage supply line Vss at the output stage of the driver 2001, to prevent currents from flowing into the inverters 2013 and 2014; in this condition, the decision circuit (2039) in the receiver 2003 is operated, and the offset voltage (Voff+, Voff−) with which the result of the decision (the decision output) changes to a 0 or a 1 is obtained.

By using this offset voltage during usual signal reception, the decision circuit can make a decision on the received signal with the input offset compensated for. According to the eighth embodiment, if an offset voltage occurs at the inputs of the decision circuit due to variations of transistor characteristics, high sensitivity reception is possible because the offset can be compensated for.

Figure 16:
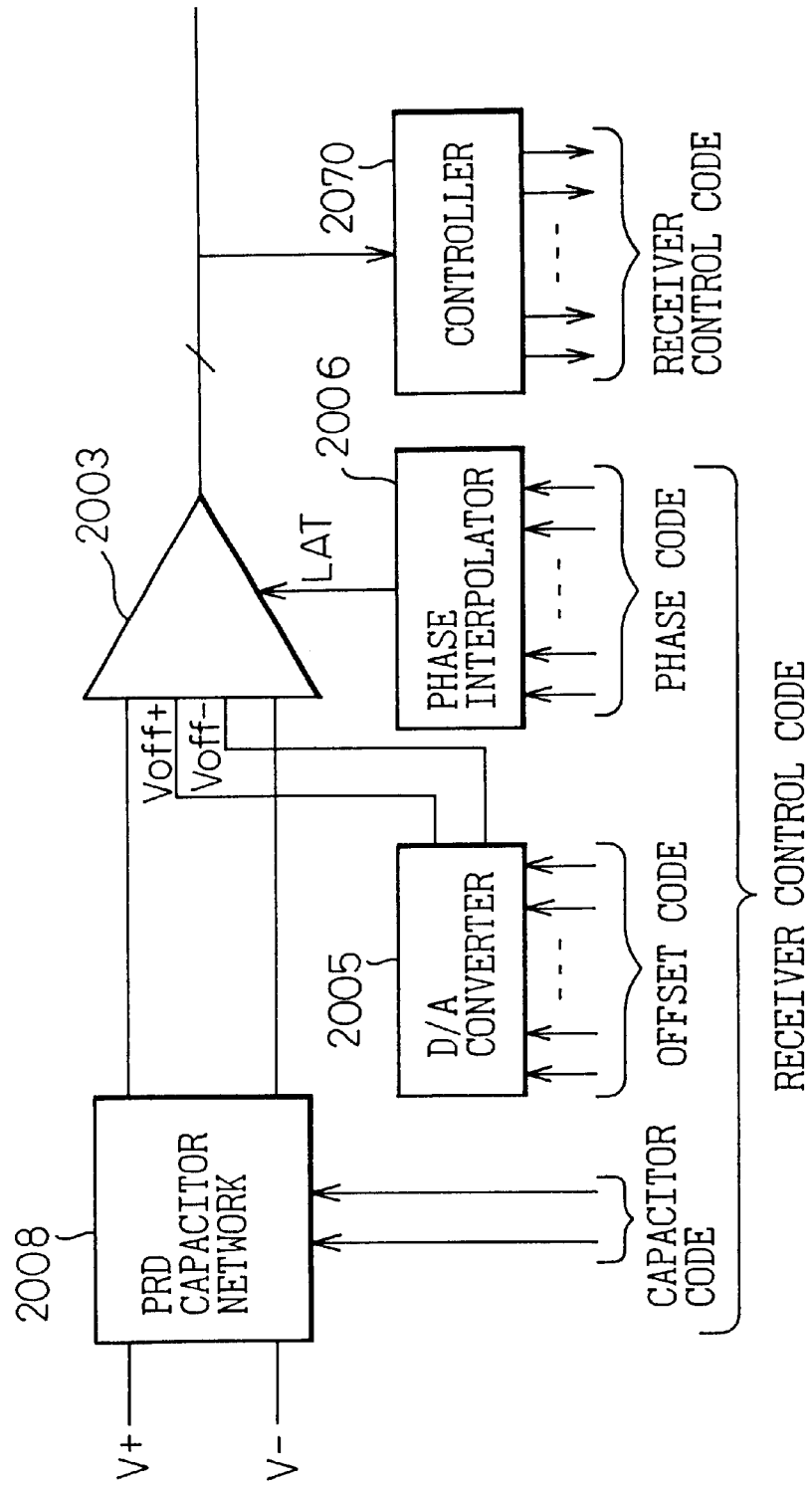
FIG. 16 is a block circuit diagram showing a receiver as a ninth embodiment according to the first mode of the present invention.

FIG. 16 is a block circuit diagram showing a receiver as a ninth embodiment according to the first mode of the present invention. In FIG. 16, reference numeral 2008 indicates the PRD capacitor network described with reference to FIG. 14.

In the ninth embodiment, during a transceiver characteristic adjusting period (for example, the power-on initialization period), a test pattern (for example, data pattern such as "1000") is sent out periodically from a driver in another transceiver circuit and, by varying the offset voltage (Voff+, Voff−) via the D/A converter 2005 while sequentially changing the decision timing via the phase interpolator 2006, the receiver 2003 (the decision circuit) receives the test pattern and acquires the analog value of the received waveform. The acquired value is sent to the controller (control processor) 2070, which then computes from the received data the optimum value of the offset voltage (optimum offset code), the optimum value of the receive timing (optimum phase code), and the equalization parameters (optimum capacitor code) that minimize intersymbol interference, and sets these receiver control code values into the receiver. The capacitor code supplied to the PRD capacitor network 2008 is used to control the on/off states of the switches 2344 to 2346 and 2354 to 2356 in FIG. 14. Here, the controller 2070 that acquired the analog value of the received waveform can also apply feedback control to the test pattern transmitting driver in the other transceiver circuit so as to adjust, for example, the amplitude level of the signal.

In this way, according to the ninth embodiment, high sensitivity signal reception can be achieved since the input signal can be received using the offset voltage and receive timing that maximize the received signal and the equalization parameters that minimize intersymbol interference.

As described above, according to the first to ninth embodiments in the first mode of the present invention, since signal waveform quality can be evaluated on board, and since the equalization parameters can be optimized on board, it becomes possible to provide a receiver, a transceiver circuit, and a signal transmission system that have excellent serviceability and good sensitivity.

As previously noted, differential signal transmission is usually employed for signal transmission between LSIs or between boards or enclosures, for example, when the transmission distance is relatively long. However, in the case of the prior art differential receiver shown, for example, in FIG. 3, the common mode voltage range that can be handled cannot be made large enough.

The receiver hereinafter described is one that can remove a large common mode voltage.

Figure 17C:
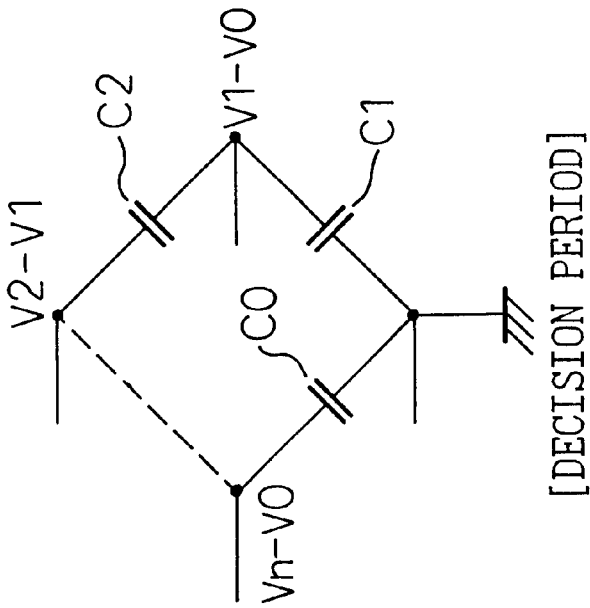
FIGS. 17A, 17B, and 17C are diagrams (part 1) for explaining the principle of a receiver according to a second mode of the present invention.
Figure 17B:
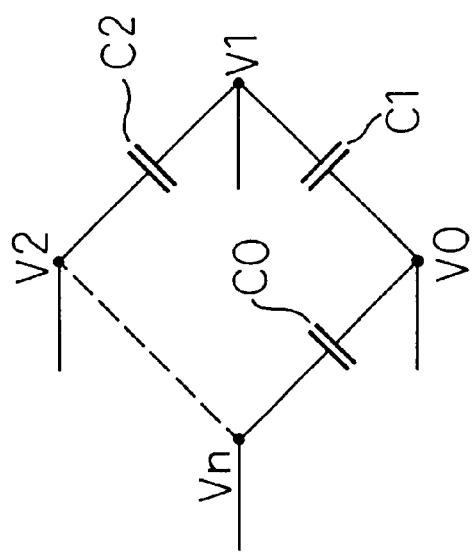
Figure 17A:
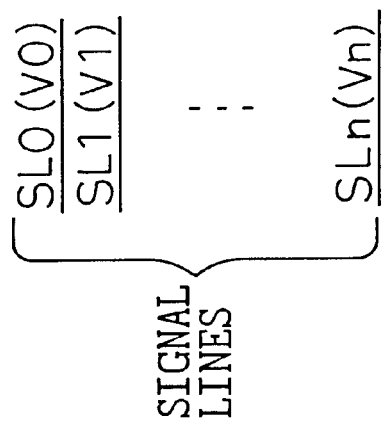

FIGS. 17A, 17B, and 17C are diagrams (part 1) for explaining the principle of the receiver according to a second mode of the present invention: FIG. 17A shows signal lines SL0 to SLn, FIG. 17B shows a capacitor network in a sample period, and FIG. 17C shows the capacitor network in a decision period. Here, the signal line SL0, for example, is set as a common line, and signals are transmitted on the common signal line SL0 and each of the signal lines SL1 to SLn. Reference characters V0 to vn indicate signal levels (voltages) on the respective signal lines SL0 to SLn, and C0, C1, C2, denote the capacitors.

First, it is assumed that, in the sample period, the nodes (n+1 nodes) of the capacitor network are charged to voltages V0, v1, . . . , Vn, respectively, as shown in FIG. 17B.

Next, in the decision period, when the node supplied with voltage V0 is connected to zero potential, as shown in FIG. 17C, the voltages on the other nodes are V1-V0, V2-V0, . . . , Vn-V0, respectively. That is, voltage V0 is subtracted from every node voltage.

Here, if voltage V0 is a common mode voltage, then it follows that the common mode voltage is subtracted from each of the other node voltages. Accordingly, when this voltage is connected to the receiver input, the voltage (signal) after subtracting the common mode voltage is input to the receiver, and the common mode voltage can thus be removed.

Figure 18A:
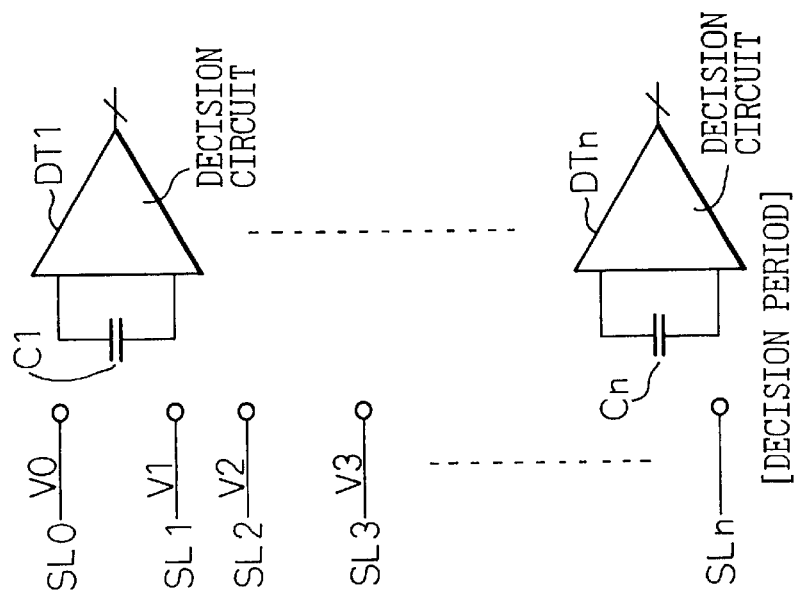
FIGS. 18A and 18B are diagrams (part 2) for explaining the principle of the receiver according to the second mode of the present invention.
Figure 18B:
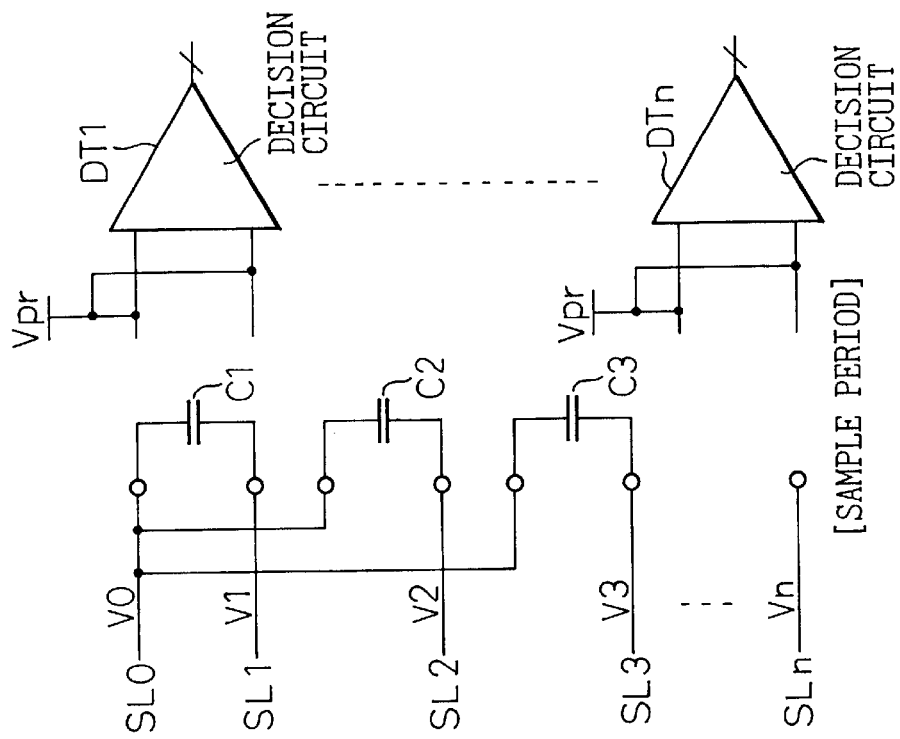

FIGS. 18A and 18B are diagrams (part 2) for explaining the principle of the receiver according to the second mode of the present invention: FIG. 18A shows the connections between the capacitors and the receiver in a sample period, and FIG. 18B shows the connections between the capacitors and the receiver in a decision period.

As shown in FIG. 18A, in the sample period, the capacitors C1, C2, C3, are connected between the signal line SL0 and the signal lines SL1, SL2, SL3, respectively, and difference voltages (V1-V0, V2-V0, V3-V0, . . . ), each representing the difference with respect to the voltage V0 on the signal line SL0, are applied. At this time, the inputs to the decision circuits DT1 to DTn are each precharged to the precharge voltage Vpr.

As shown in FIG. 18B, in the decision period, the capacitors C1, C2, C3, . . . are disconnected from the signal lines SL0 to SLn, and connected to the respective decision circuits DT1 to DTn.

That is, in FIGS. 18A and 18B, rather than grounding the node (V0) of the reference signal line SL0 to zero potential as in FIGS. 17A to 17C, the difference voltages between the reference signal line SL0 and the respective signal lines SL1 to SLn are applied across the respective capacitors C1 to Cn, and these capacitors are connected to the input nodes of the receiver (DT1 to DTn) precharged to a prescribed voltage, thereby removing the common mode voltage.

The receivers described with reference to FIGS. 17A to 17C and FIGS. 18A and 18B each use a capacitor network comprising a plurality of switches and capacitors for connecting input signals to the input terminals of the receiver; the capacitor network is configured so that the common mode voltage occurs at one node of the network, and this node is connected to a prescribed potential or to a node precharged to a prescribed voltage so that only the difference voltage after removal of the common mode voltage is input.

In this way, according to the second mode of the present invention, since the common mode voltage elimination means is implemented by switching the passive devices (capacitors), the common mode voltage elimination characteristic is not affected if there are variations in the transistor characteristics. Furthermore, if the common mode noise varies greatly, the elimination capability is unaffected and almost no common mode voltage propagates to the receiver at the subsequent stage. Accordingly, a receiver having excellent common mode noise immunity can be realized.

Figure 19:
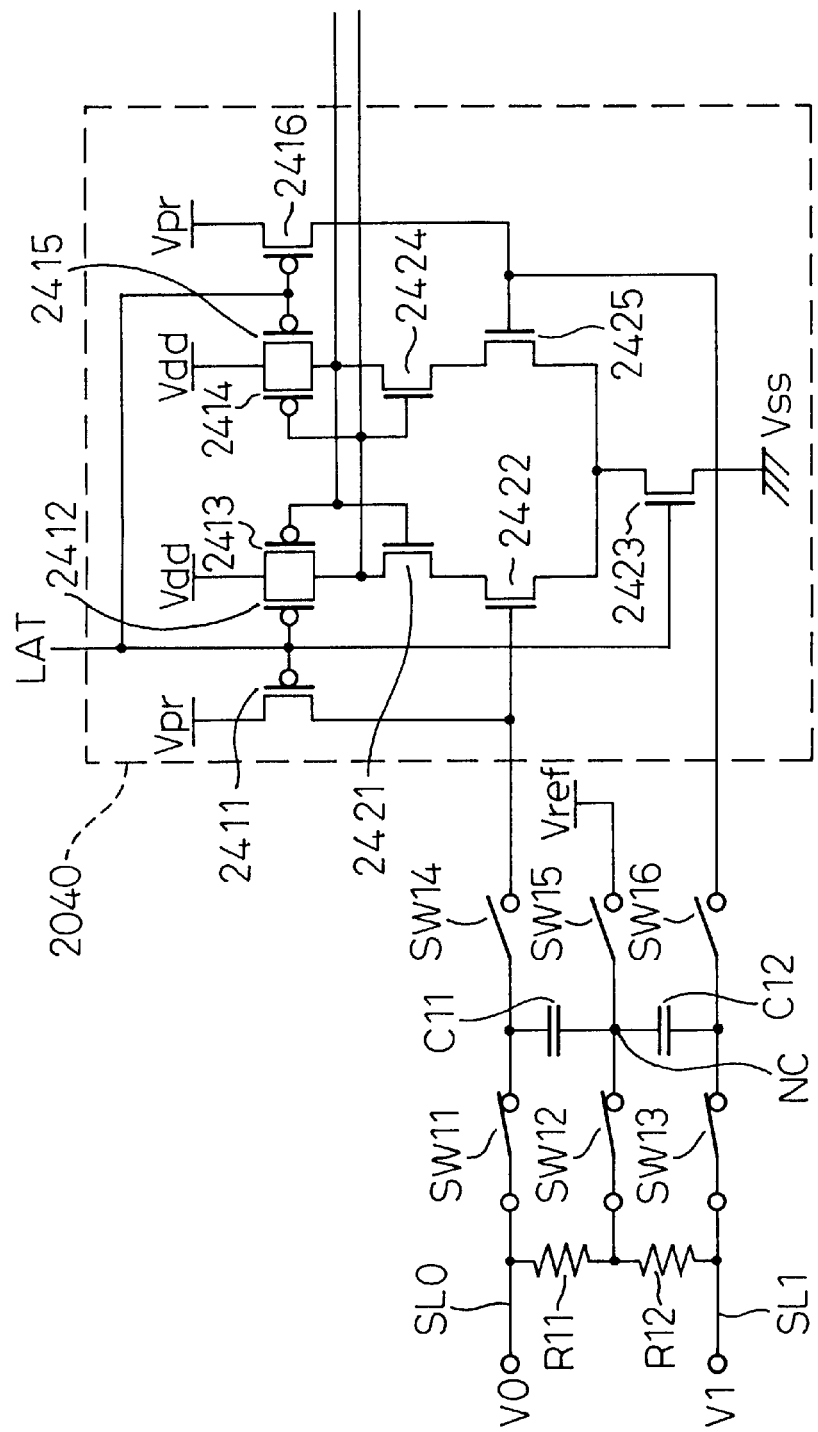
FIG. 19 is a circuit diagram showing a receiver (in a sample period) as a first embodiment according to the second mode of the present invention.
Figure 20:
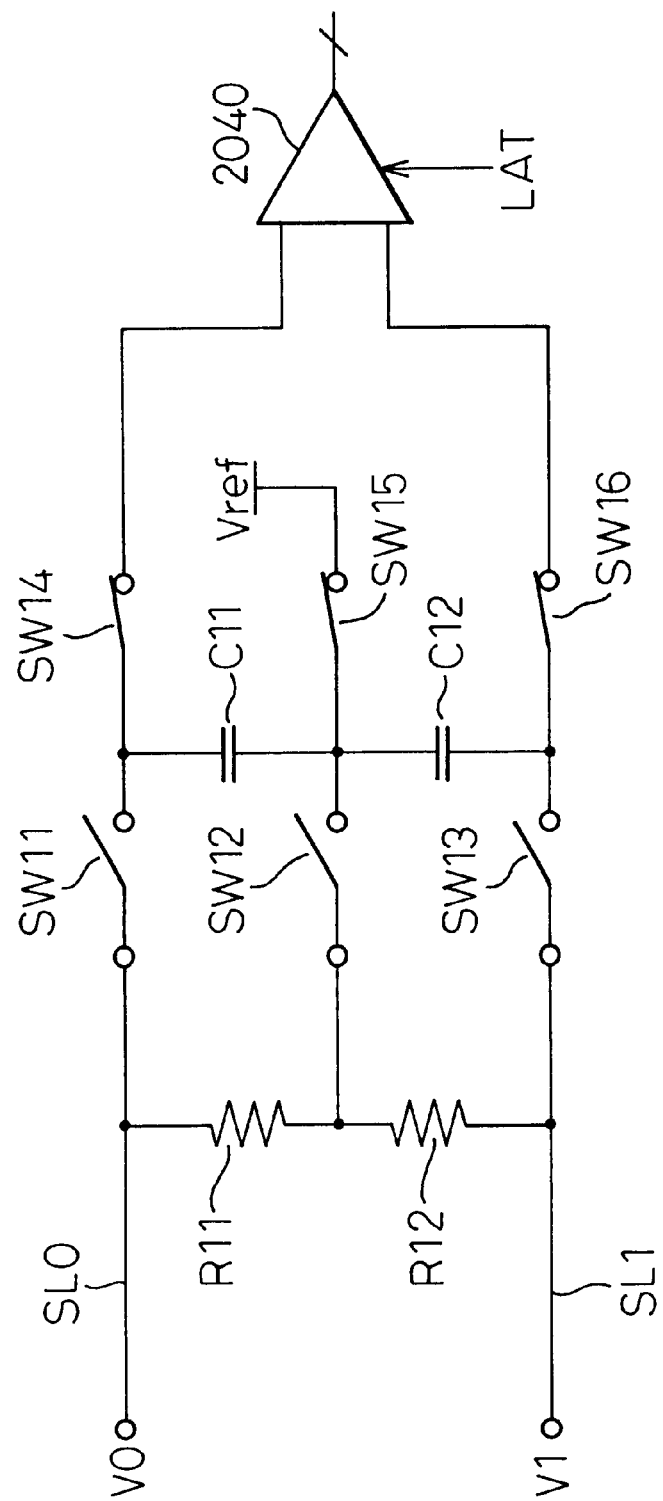
FIG. 20 is a circuit diagram showing the receiver (in a decision period) as the first embodiment according to the second mode of the present invention.

FIG. 19 is a circuit diagram showing a receiver (in a sample period) as a first embodiment according to the second mode of the present invention, and FIG. 20 is a circuit diagram showing the receiver (in a decision period) as the first embodiment according to the second mode of the present invention. In FIGS. 19 and 20, reference numeral 2040 is the receiver (the regenerative latch circuit), R11 and R12 are termination resistors, C11 and C12 are coupling capacitors, and SW11 to SW16 are switches. Further, SL0 and SL1 indicate differential (complementary) signal lines.

As shown in FIG. 19, the regenerative latch circuit 2040 comprises PMOS transistors 2411 to 2416 and NMOS transistors 2421 to 2425, and a latch signal LAT is supplied to the gates of the transistors 2411, 2416, and 2423. That is, when the latch signal LAT is at a low level "L" (precharge period), the NMOS transistor 2423 is off and the PMOS transistors 2411 and 2416 are on, and the inputs to the latch circuit 2040 (the inputs to the gates of the transistors 2422 and 2425) are precharged to the precharge voltage Vpr. When the latch signal LAT goes high "H", the precharge voltage Vpr is cut off and the NMOS transistor 2423 is on, and the input signal is thus latched.

First, as shown in FIG. 19, in the sample period (precharge period), the switches SW11 to SW13 are turned on and the switches SW14 to SW16 off, thus connecting the capacitors C11 to C12 to the signal lines SL0 and SL1. The other nodes of these capacitors C11 and C12 are connected to a node NC at which the common mode voltage is produced. The node NC is connected by the on-state switch SW12 to a node connecting between the termination resistors R11 and R12. As earlier described, during the precharge period (sample period), the input nodes of the latch circuit 2040 are precharged to the precharge voltage Vpr.

Next, as shown in FIG. 20, in the decision period, the switches SW11 to SW13 are turned off and the switches SW14 to SW16 on, as a result of which the coupling capacitors C11 and C12 are disconnected from the signal lines SL0 and SL1 and the node between the termination resistors R11 and R12, and are instead connected between the reference voltage Vref and the input nodes of the latch circuit 2040. In this way, the common mode voltage on the signal lines SL0 and SL1 is completely removed, eliminating the possibility of the common mode voltage appearing on the input nodes of the latch circuit 2040.

That is, in the precharge period, the two capacitors C11 and C12 are charged by being connected between the common mode voltage-node NC and the respective signal lines SL0 and SL1, and in the decision period, the node NC at which the common mode voltage is applied is connected to the reference voltage Vref, while the nodes at which the signal line voltages (V0 and V1) are applied are connected to the inputs to the latch circuit (differential receiver) 2040. This arrangement serves to eliminate the common mode voltage at the inputs to the latch circuit 2040.

In this embodiment (and in the embodiments hereinafter described), since the common mode voltage elimination means is implemented by switching the passive devices (capacitors), the elimination characteristic is not affected if there are variations in the transistor characteristics; furthermore, if the common mode noise varies greatly, the elimination capability is unaffected and almost no common mode voltage propagates to the receiver at the subsequent stage. Accordingly, a receiver having excellent common mode noise immunity can be realized.

Figure 21:
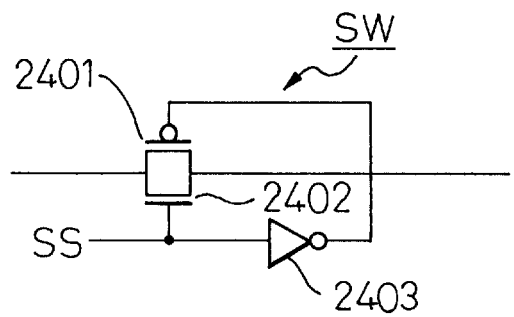
FIG. 21 is a circuit diagram showing one example of a switch in FIGS. 19 and 20.

FIG. 21 is a circuit diagram showing one example of each switch in FIGS. 19 and 20.

As shown in FIG. 21, each switch SW (SW11 to SW16) is constructed, for example from a transfer gate comprising a PMOS transistor 2401 and an NMOS transistor 2402, the configuration being such that a control signal SS is applied to the gate of the transistor 2402 directly and to the gate of the transistor 2401 after being inverted by an inverter 2401. That is, the transfer gate is on when the control signal SS is at a high level "H", and off when it is at a low level "L".

Figure 22:
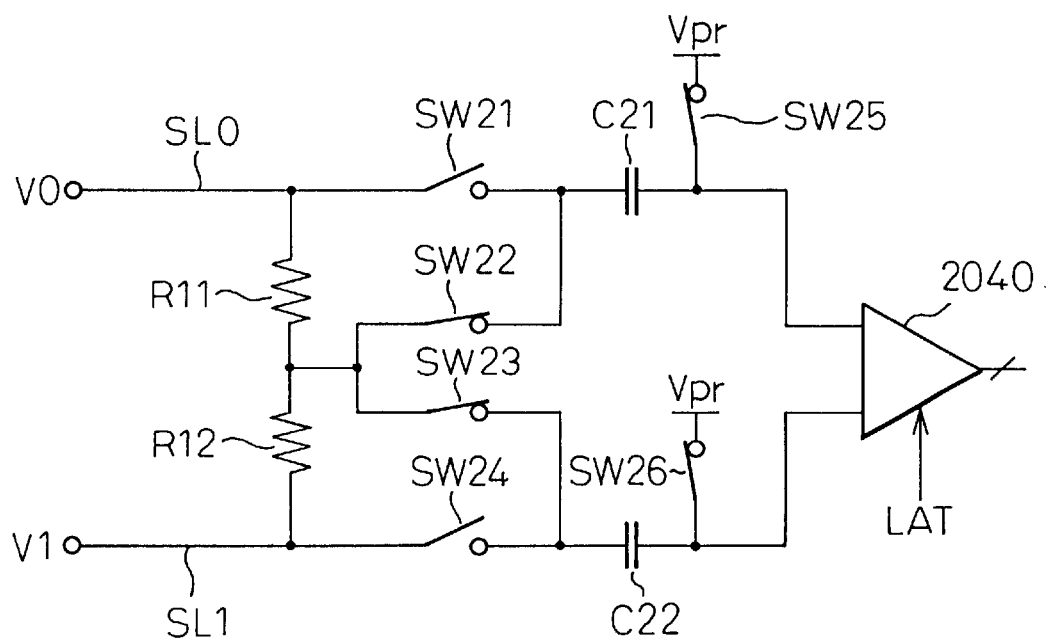
FIG. 22 is a circuit diagram showing a receiver (in a sample period) as a second embodiment according to the second mode of the present invention.
Figure 23:
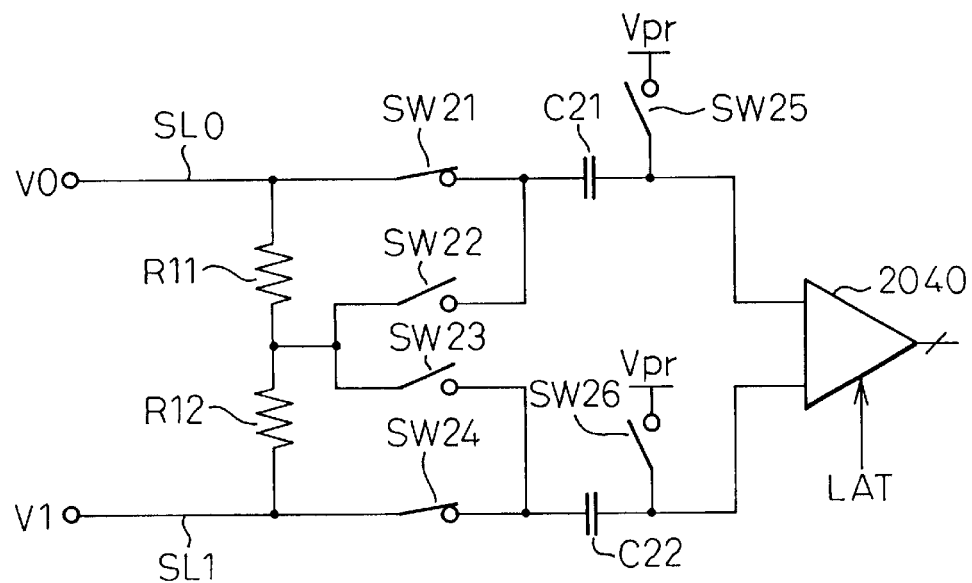
FIG. 23 is a circuit diagram showing the receiver (in a decision period) as the second embodiment according to the second mode of the present invention.

FIG. 22 is a circuit diagram showing a receiver (in a sample period) as a second embodiment according to the second mode of the present invention, and FIG. 23 is a circuit diagram showing the receiver (in a decision period) as the second embodiment according to the second mode of the present invention.

First, as shown in FIG. 22, in the sample period (precharge period), the switches SW21 and SW24 are turned off, and the switches SW22, SW23, SW25, and SW26 are turned on. That is, the common mode voltage is applied to one node of each of the capacitors C21 and C22 through the switch (SW22 or SW23) and the termination resistor (R11 or R12), and the other node is precharged to the precharge voltage Vpr through the input node of the latch circuit 2040. The common mode voltage here is the voltage at the node between the termination resistors R11 and R12.

Next, as shown in FIG. 23, in the decision period, the switches SW21 and SW24 are turned on, and the switches SW22, SW23, SW25, and SW26 are turned off. That is, the one node of each of the capacitors C21 and C22, at which the common mode voltage is applied, is now connected to the signal line SL0 or SL1 via the switch (SW21 or SW22); at this time, the precharge switches (SW25 and SW26) are turned off.

In this way, in the second embodiment, when the input nodes of the latch circuit 2040 are disconnected from the precharge voltage Vpr at the end of the precharge period, since the voltage at each input node is always held at a constant value (precharge voltage Vpr), the channel charges injected into the input nodes do not depend on the signal charges, and signal bit decisions with higher accuracy can be accomplished.

Figure 24:
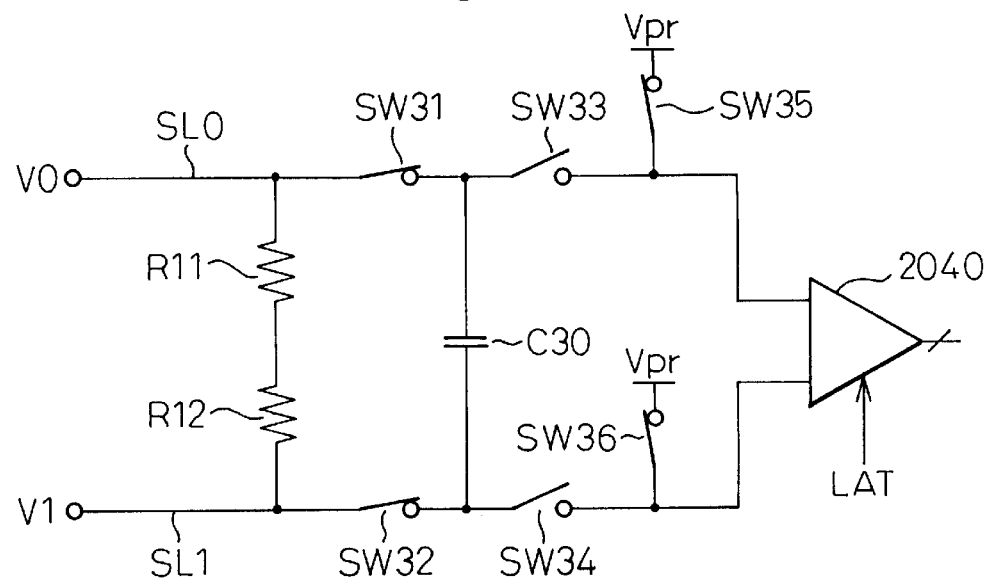
FIG. 24 is a circuit diagram showing a receiver (in a sample period) as a third embodiment according to the second mode of the present invention.
Figure 25:
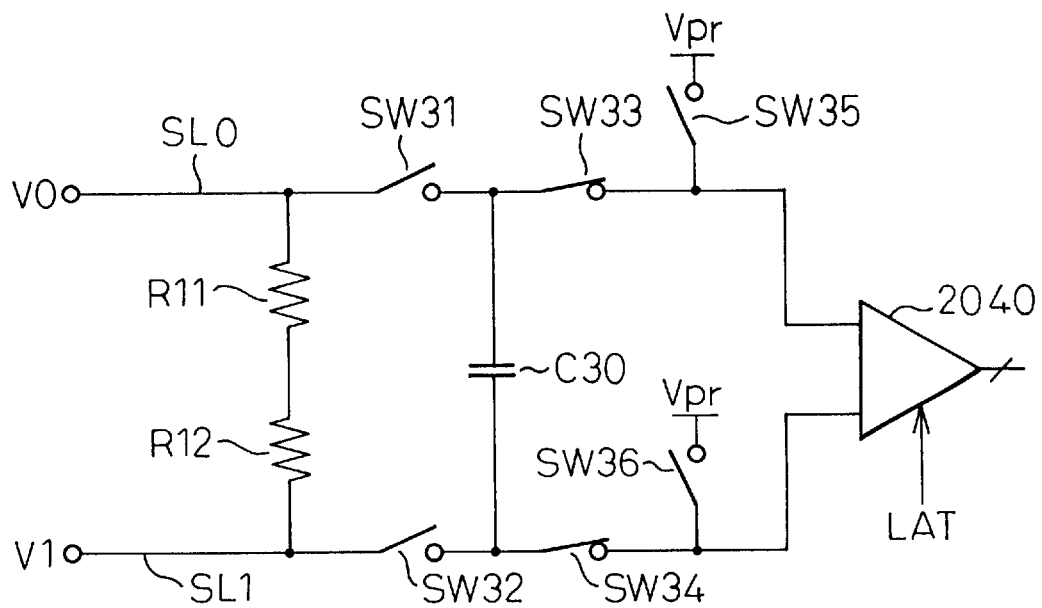
FIG. 25 is a circuit diagram showing the receiver (in a decision period) as the third embodiment according to the second mode of the present invention.

FIG. 24 is a circuit diagram showing a receiver (in a sample period) as a third embodiment according to the second mode of the present invention, and FIG. 25 is a circuit diagram showing the receiver (in a decision period) as the third embodiment according to the second mode of the present invention. In the third embodiment, the two coupling capacitors C11 and C12 in the first embodiment described with reference to FIGS. 19 and 20 are combined into a single capacitor C30 and, as in the second embodiment described with reference to FIGS. 22 and 23, the input nodes of the latch circuit 2040 are precharged to the precharge voltage Vpr during the sample period (precharge period).

That is, as shown, in FIG. 24, in the sample period, the switche's SW31, Sw32, SW35, and SW36 are turned on and the switches SW33 and SW34 are turned off, thus connecting the opposite ends of the coupling capacitor C30 to the signal lines SL0 and SL1, respectively. At this time, the input nodes of the latch circuit 2040 are precharged to the precharge voltage vpr.

Next, as shown in FIG. 25, in the decision period, the switches SW31, SW32, SW35, and Sw36 are turned off and the switches Sw33 and SW34 are turned on, as a result of which the opposite ends of the coupling capacitor C30 are disconnected from the signal lines SL0 and SL1, and instead connected to the input nodes of the latch circuit 2040.

The third embodiment removes the common mode voltage using a single coupling capacitor C30 (a so-called flying capacitor), and offers the advantage of being able to reduce the number of necessary capacitors and switches (switching transistors).

Figure 26:
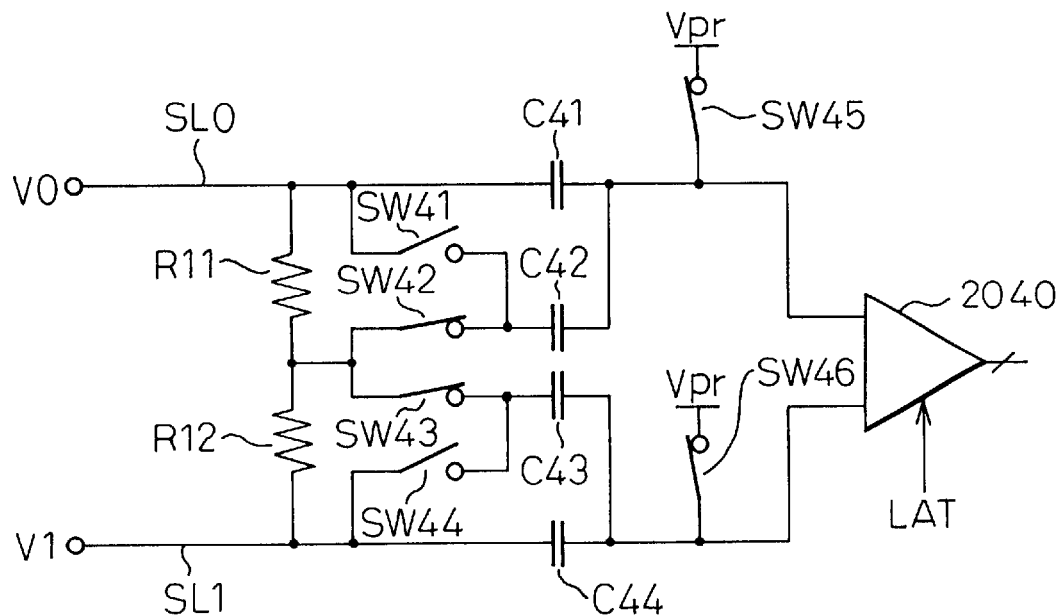
FIG. 26 is a circuit diagram showing a receiver (in a sample period) as a fourth embodiment according to the second mode of the present invention.
Figure 27:
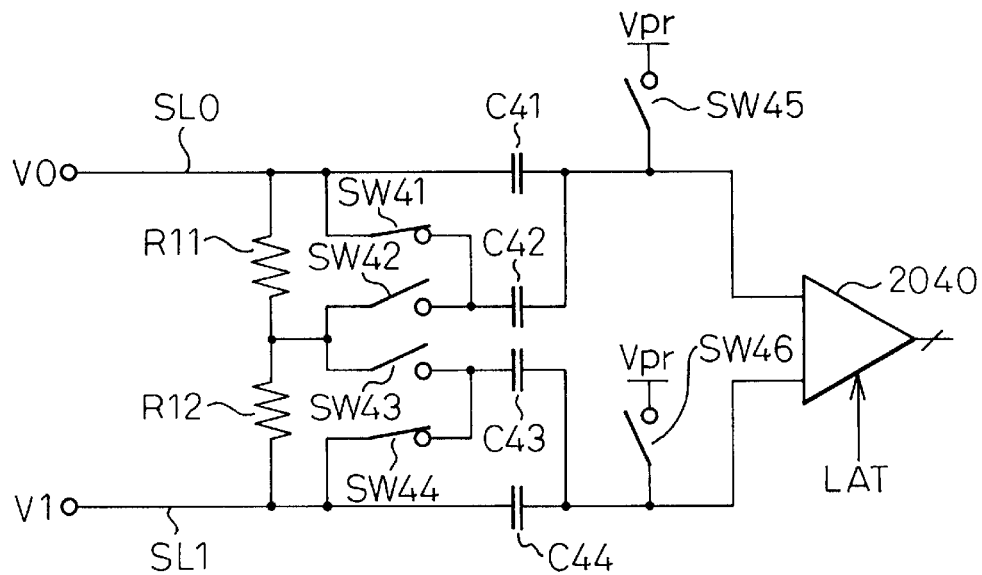
FIG. 27 is a circuit diagram showing the receiver (in a decision period) as the fourth embodiment according to the second mode of the present invention.

FIG. 26 is a circuit diagram showing a receiver (in a sample period) as a fourth embodiment according to the second mode of the present invention, and FIG. 27 is a circuit diagram showing the receiver (in a decision period) as the fourth embodiment according to the second mode of the present invention. The fourth embodiment implements PRD (Partial Response Detection) by including two additional coupling capacitors in the configuration of the second embodiment described with reference to FIGS. 22 and 23.

First, as shown in FIG. 26, in the sample period, the switches SW42, SW43, SW45, and SW46 are turned on and the switches SW41 and SW44 are turned off; in this condition, the common mode voltage is applied to one node of each of the coupling capacitors C42 and C43 via the switch (SW42, SW43) and the termination resistor (R11, R12). The other nodes of the coupling capacitors C42 and C43 are precharged to the precharge voltage Vpr via the input nodes of the latch circuit 2040. On the other, hand, the coupling capacitors C41 and C44 are permanently connected at one end to the signal lines SL0 and SL1 and at the other end to the input nodes of the latch circuit 2040.

Next, as shown in FIG. 27, in the decision period, the switches SW42, SW43, SW45, and SW46 are turned off and the switches SW41 and SW44 are turned on, thus connecting the coupling capacitors C42 and C43 in parallel with the coupling capacitors C41 and C44, respectively. At this time, the precharge switches (SW45 and SW46) are turned off. In the conventional PRD, the coupling capacitor nodes on the signal line side cycles between charging to a prescribed voltage and connection to the signal lines; in the fourth embodiment, instead of the prescribed voltage, the common mode voltage is applied to these nodes.

According to the fourth embodiment, the common mode voltage can be eliminated in the capacitor network implementing PRD; this makes it possible to eliminate the common mode voltage simultaneously with intersymbol interference, and a higher transmission rate can thus be achieved.

Figure 28:
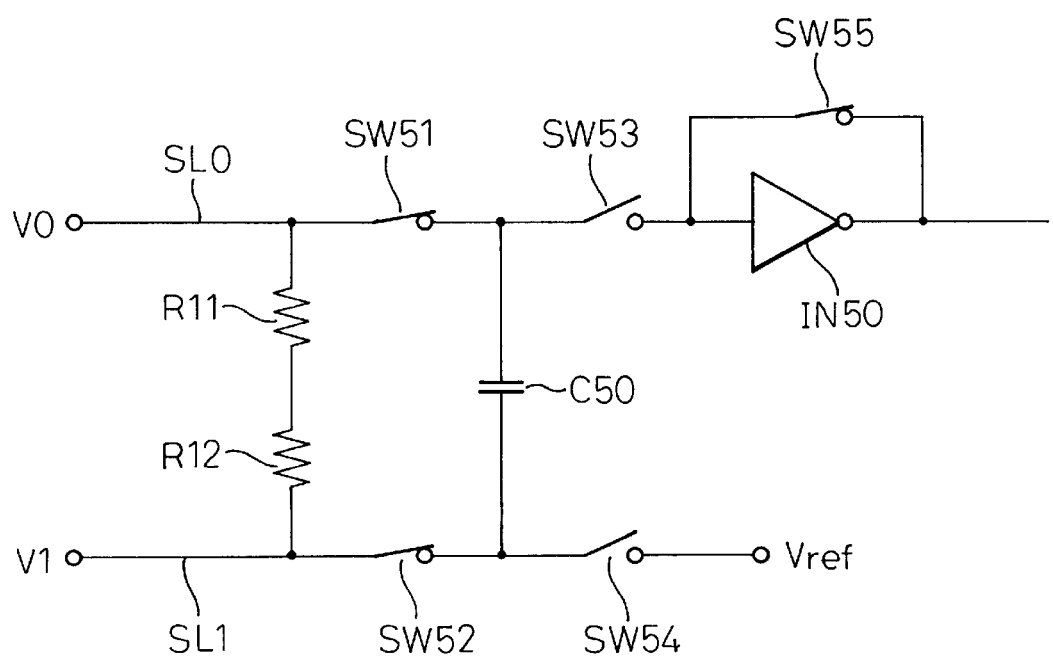
FIG. 28 is a circuit diagram showing a receiver (in a sample period) as a fifth embodiment according to the second mode of the present invention.
Figure 29:
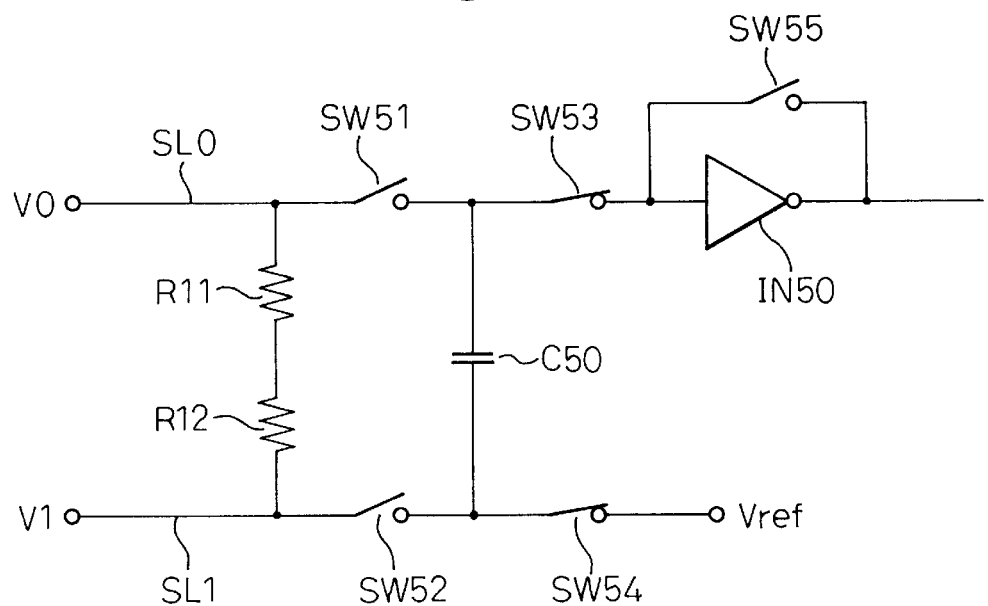
FIG. 29 is a circuit diagram showing the receiver (in a decision period) as the fifth embodiment according to the second mode of the present invention.

FIG. 28 is a circuit diagram showing a receiver (in a sample period) as a fifth embodiment according, to the second mode of the present invention, and FIG. 29 is a circuit diagram showing the receiver (in a decision period) as the fifth embodiment according to the second mode of the present invention. In the fifth embodiment, the capacitor network performs the elimination of the common mode voltage simultaneously with the conversion from a differential signal to a single-ended signal.

First, as shown in FIG. 28, in the sample period, the switches SW51, SW52, and SW55 are turned on and the switches SW53 and SW54 are turned off, thus connecting the opposite ends of the coupling capacitor (flying capacitor) C50 to the signal lines SL0 and SL1, respectively. At this time, the input node of a CMOS inverter IN50 is precharged by connecting its input and output together.

Next, as shown in FIG. 29, in the decision period, the switches SW51, SW52, and SW55 are turned off and the switches SW53 and SW54 are turned on, as a result of which the opposite ends of the capacitor C50 are disconnected from the signal lines SL0 and SL1 and one end is connected to the input of the inverter IN50 and the other end to'the reference voltage Vref.

In this way, in the fifth embodiment, since not only the elimination of the common mode voltage but also the conversion of the signal from differential to single-ended form is performed; in the capacitor network, the first stage of the receiver can be constructed using only one high-speed, high-sensitivity inverter (IN50).

Figure 30:
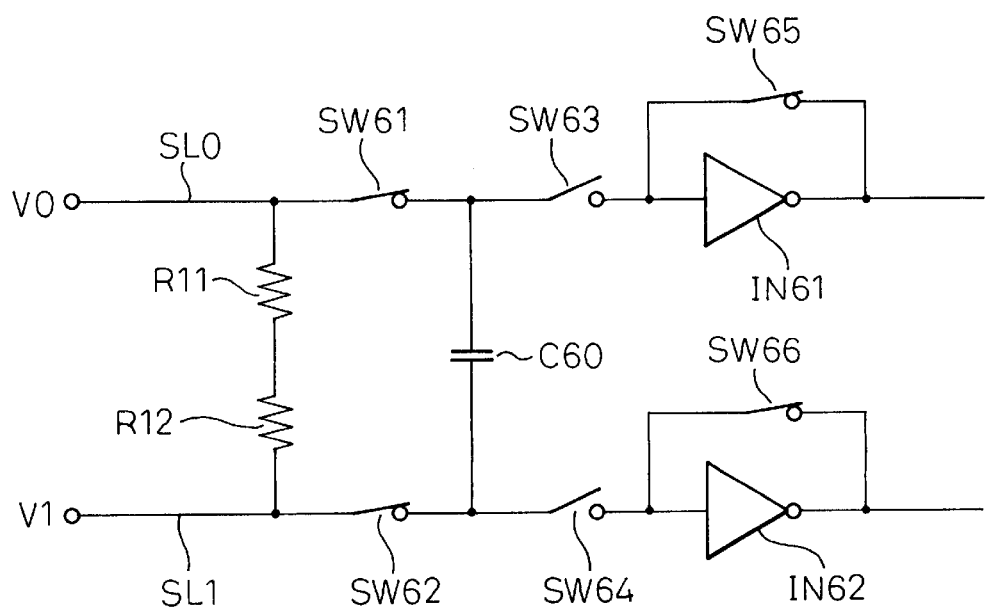
FIG. 30 is a circuit diagram showing a receiver (in a sample period) as a sixth embodiment according to the second mode of the present invention.
Figure 31:
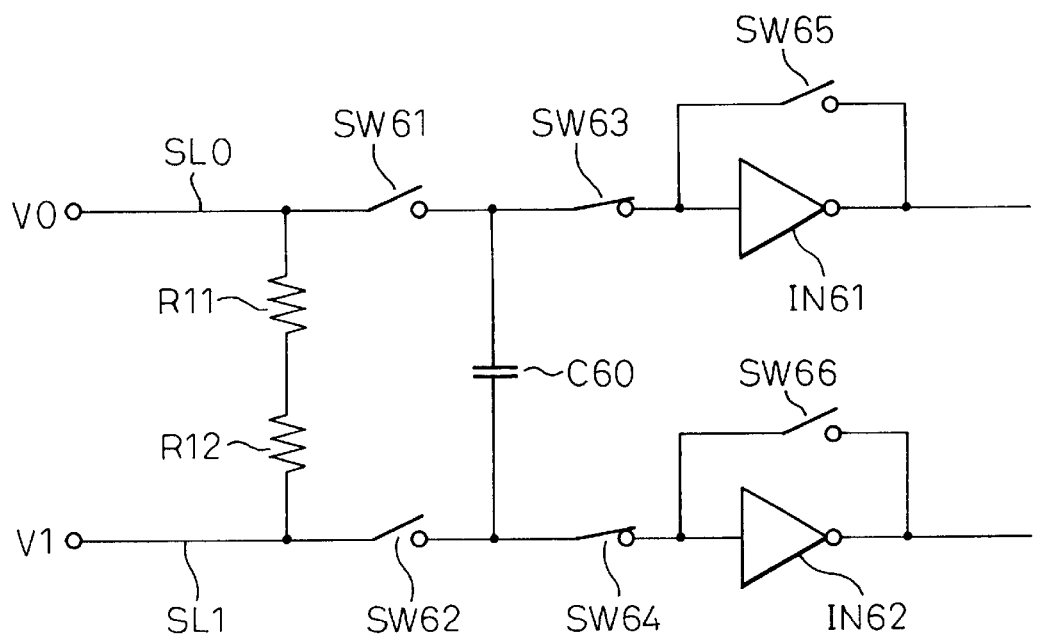
FIG. 31 is a circuit diagram showing the receiver (in a decision period) as the sixth embodiment according to the second mode of the present invention.

FIG. 30 is a circuit diagram showing a receiver (in a sample period) as a sixth embodiment according to the second mode of the present invention, and FIG. 31 is a circuit diagram showing the receiver (in a decision period) as the sixth embodiment according to the second mode of the present invention. The sixth embodiment differs from the foregoing fifth embodiment in that a total of two inverters, one for each signal line, are used as the first stage of the receiver.

First, as shown in FIG. 30, in the sample period, the switches SW61, SW62, SW65, and SW66 are turned on and the switches SW63 and SW64 are turned off, thus connecting the opposite ends of the coupling capacitor (flying capacitor) C60 to the signal lines SL0 and SL1, respectively. At this time, the input nodes of the CMOS inverters IN61 and IN62 are precharged by connecting their respective inputs and outputs together.

Next, as shown in FIG. 31, in the decision period, the switches SW61, SW62, SW65, and SW66 are turned off and the switches SW63 and SW64 are turned on, as a result of which the opposite ends of the capacitor C60 are disconnected from the signal lines SL0 and SL1, and are instead connected to the input nodes of the inverters IN61 and IN62, respectively.

Here, the arrangement of the inverters as shown in the sixth embodiment usually does not function as a differential amplifier but, as a whole, it functions as a differential amplifier since the common mode voltage is already eliminated by the capacitor network. With its high circuit symmetry, the sixth embodiment has the advantages of being resistant to power supply variations and being able to provide stable operation.

Figure 32:
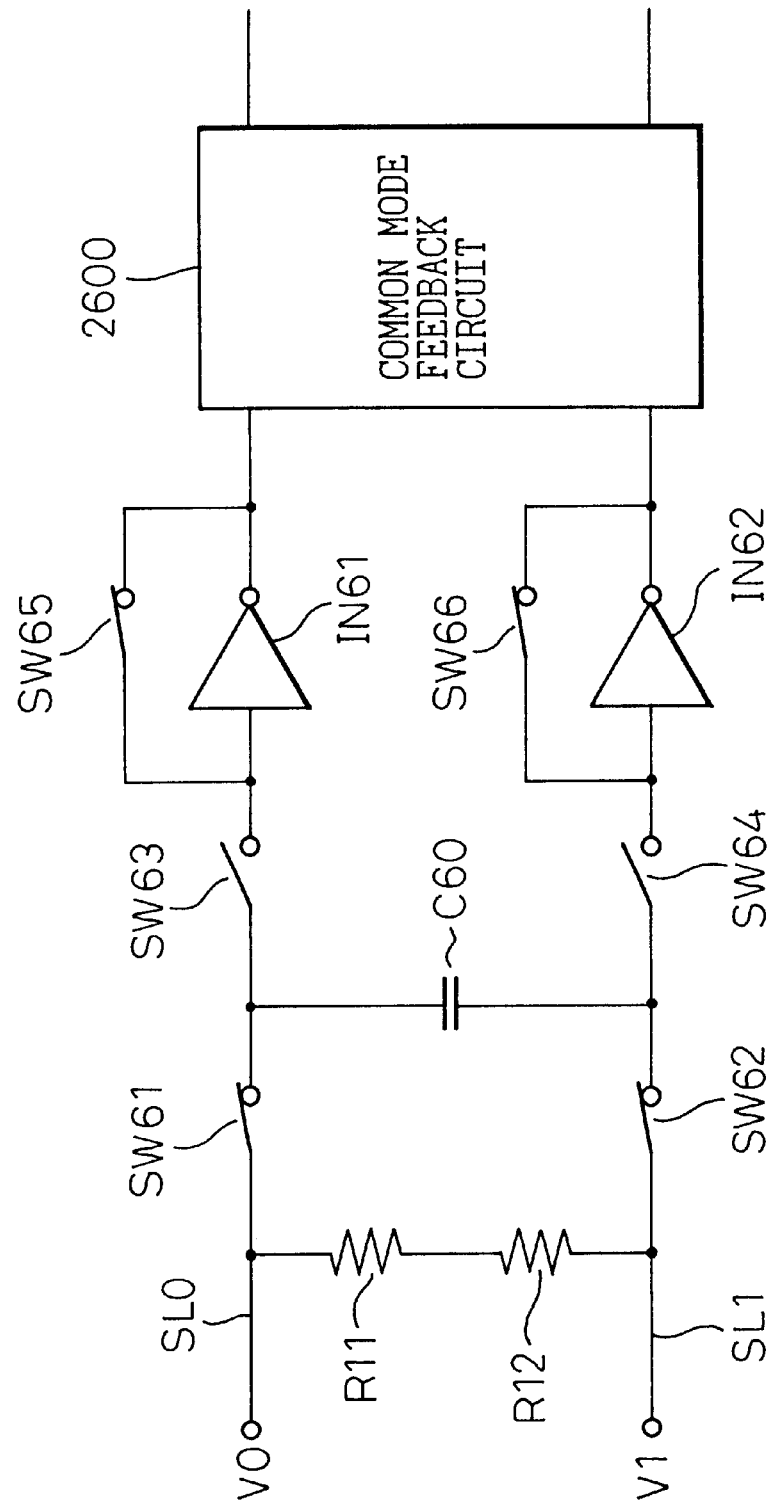
FIG. 32 is a circuit diagram showing a receiver (in a sample period) as a seventh embodiment according to the second mode of the present invention.
Figure 33:
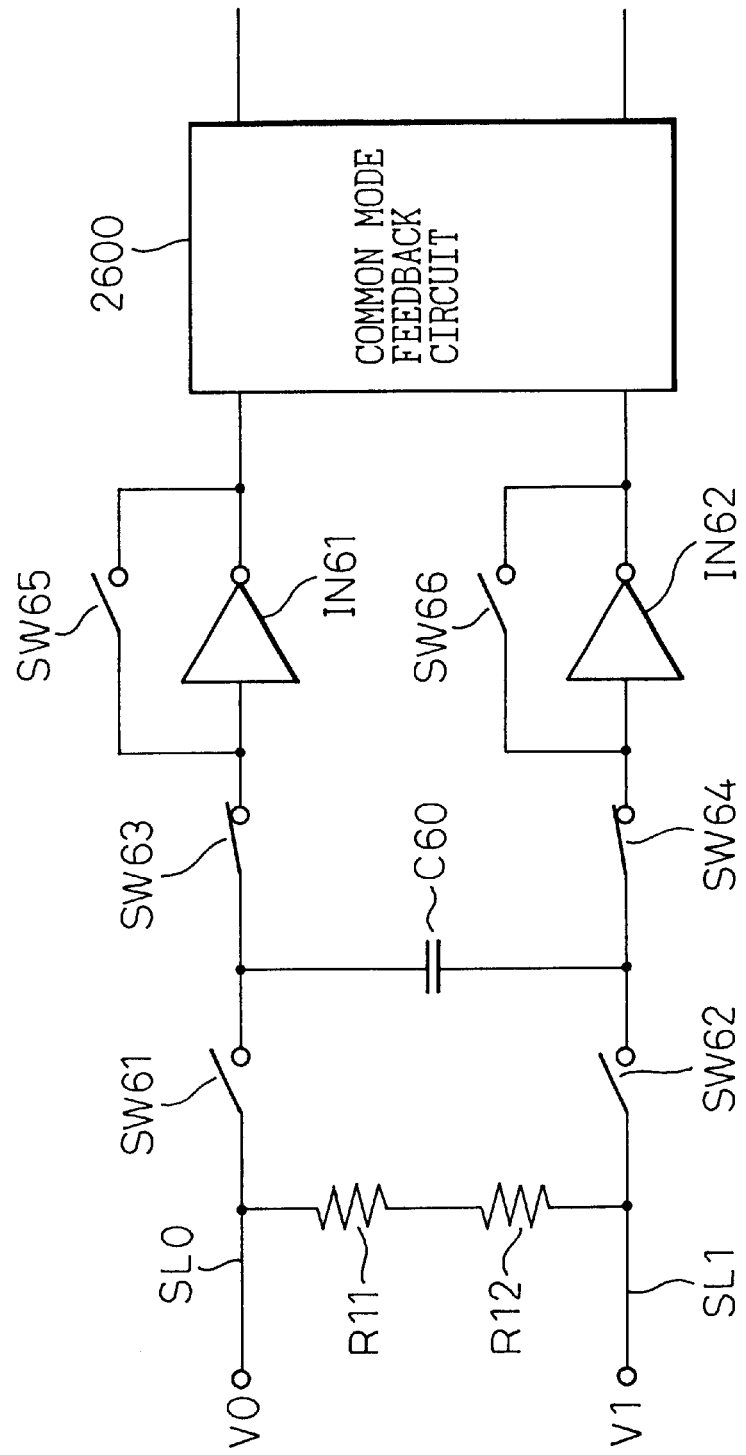
FIG. 33 is a circuit diagram showing the receiver (in a decision period) as the seventh embodiment according to the second mode of the present invention.

FIG. 32 is a circuit diagram showing a receiver (in a sample period) as a seventh embodiment according to the second mode of the present invention, and FIG. 33 is a circuit diagram showing the receiver (in a decision period) as the seventh embodiment according to the second mode of the present invention. In the seventh embodiment, the common mode voltage elimination ratio is increased by providing a common mode feedback circuit 2600 on the output side of the inverters IN61 and IN62 shown in the foregoing sixth embodiment of FIGS. 30 and 31. The switch operations in the receiver in the sample and decision periods are the same as those in the sixth embodiment.

Figure 34:
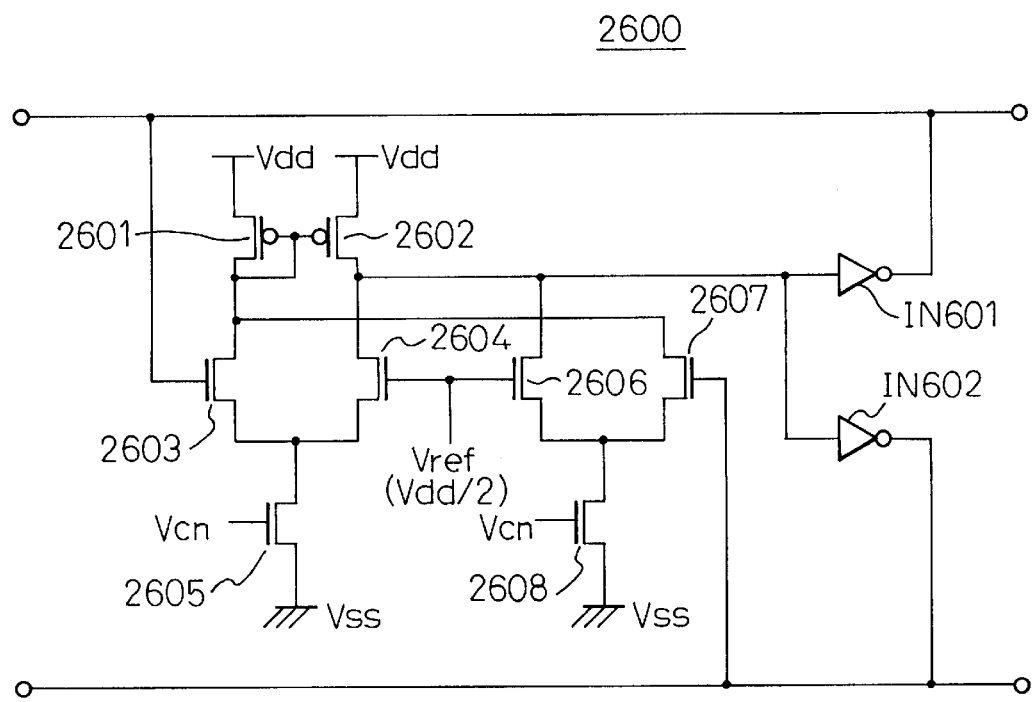
FIG. 34 is a circuit diagram showing one example of a common mode feedback circuit in the seventh embodiment shown in FIGS. 32 and 33.

FIG. 34 is a circuit diagram showing one example of the common mode feedback circuit 2600 in the seventh embodiment shown in FIGS. 32 and 33.

As shown in FIG. 34, the common mode feedback circuit 2600 comprises PMOS transistors 2601 and 2602, NMOS transistors 2603 to 2608, and inverters IN601 and IN602. The common mode feedback circuit 2600 detects the common mode voltage at the output of the inverter pair IN61, IN62, and feeds back a constant current so that the difference between the common mode voltage and the reference voltage Vref (for example, Vdd/2) becomes zero.

In this way, according to the seventh embodiment, not only can a higher common mode elimination capability be obtained, but stable operation can also be achieved because of the excellent output symmetry of the first-stage inverters (IN61, IN62).

Figure 35:
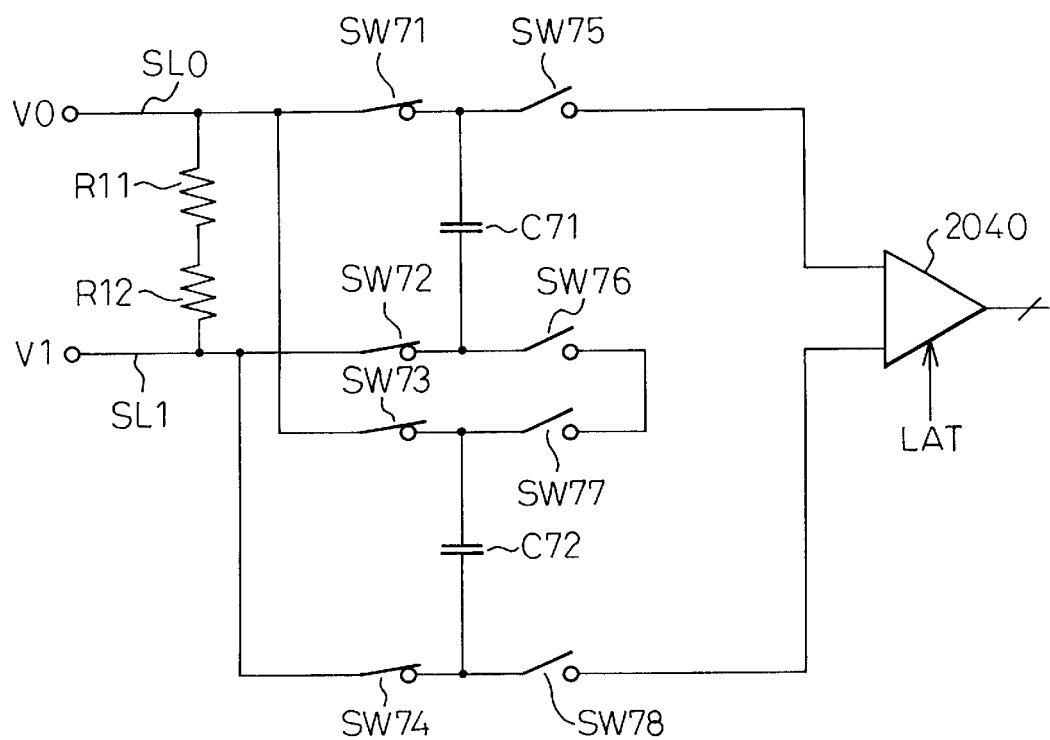
FIG. 35 is a circuit diagram showing a receiver (in a sample period) as an eighth embodiment according to the second mode of the present invention.
Figure 36:
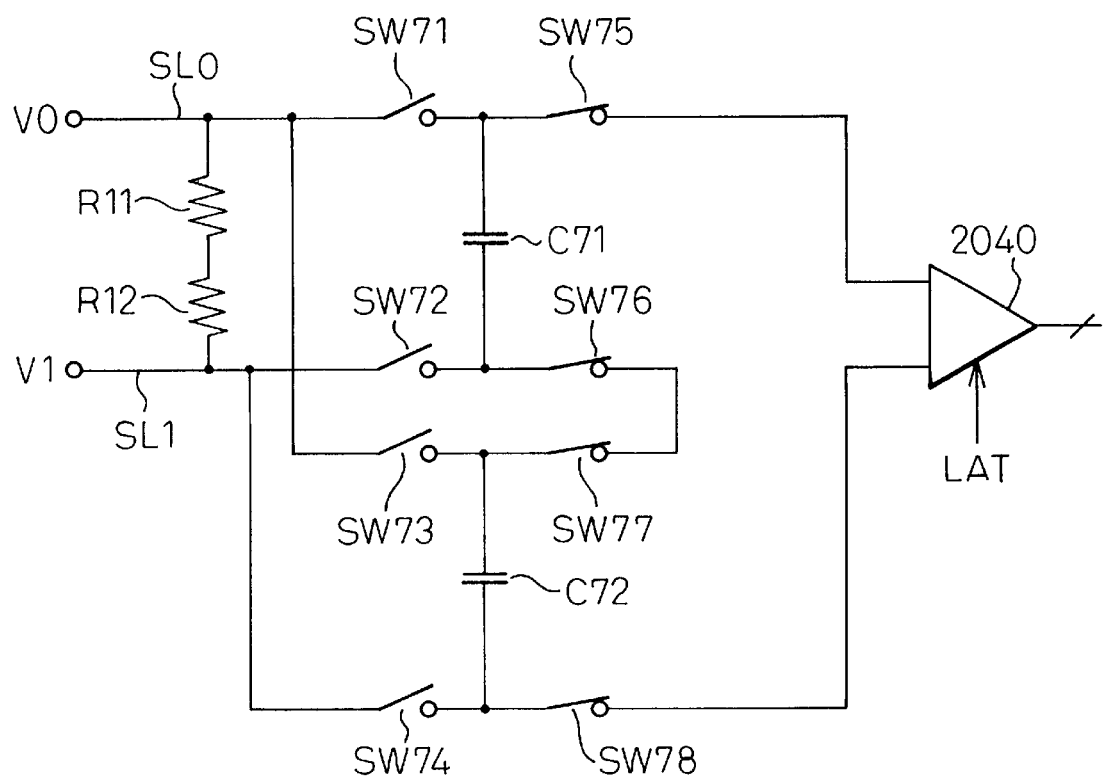
FIG. 36 is a circuit diagram showing the receiver (in a decision period) as the eighth embodiment according to the second mode of the present invention.

FIG. 35 is a circuit diagram showing a receiver (in a sample period) as an eighth embodiment according to the second mode of the present invention, and FIG. 36 is a circuit diagram showing the receiver (in a decision period) as the eighth embodiment according to the second mode of the present invention. In the eighth embodiment, two flying capacitors (C71 and C72) are provided; in the precharge period, the two capacitors C71 and C72 are connected in parallel between the signal lines SL0 and SL1 while, in the decision period, the two capacitors C71 and C72 are connected in series for connection to the input nodes of the latch circuit 2040.

More specifically, as shown in FIG. 35, in the sample period (precharge period), the switches SW71 to SW74 are turned on and the switches SW75 to SW78 are turned off, thus connecting the two capacitors C71 and C72 in parallel between the signal lines SL0 and SL1.

Next, as shown in FIG. 36, in the decision period, the switches SW71 to SW74 are turned off and the switches SW75 to SW78 are turned on, thus connecting the two capacitors C71 and C72 in series for connection to the input nodes of the latch circuit 2040. With this arrangement, the eighth embodiment can not only eliminate the common mode voltage, but also double the signal voltage produced at the outputs of the latch circuit 2040; accordingly, a receiver with higher sensitivity can be constructed.

As described above, according to the first to eighth embodiments in the second mode of the present invention, elimination of the common mode voltage, conversion of the signal from a differential to a single-ended form, amplification of the signal voltage, etc. can be accomplished using only passive components, as in the case of using a transformer; moreover, unlike the case of the transformer, a large number of devices can be integrated within the CMOS circuit. Accordingly, a receiver having high common mode noise immunity can be constructed without using external components.

As described in detail above, according to the present invention, a transceiver circuit can be provided that can evaluate and diagnose the signal transmission system, optimize reception/transmission parameters, and enhance the sensitivity of the receiver. Furthermore, according to the present invention, a receiver capable of eliminating a large common mode voltage can also be provided.

As previously described with reference to FIGS. 1 and 2, if a conventional differential amplifier is used to receive differential signals transmitted at high speed, there is a risk of making erroneous decisions because of the inability to correctly discriminate between signal data "0" and "1" due to intersymbol interference It is proposed to us e PRD (Partial Response Detection) as a technique for solving this problem.

Figure 37:
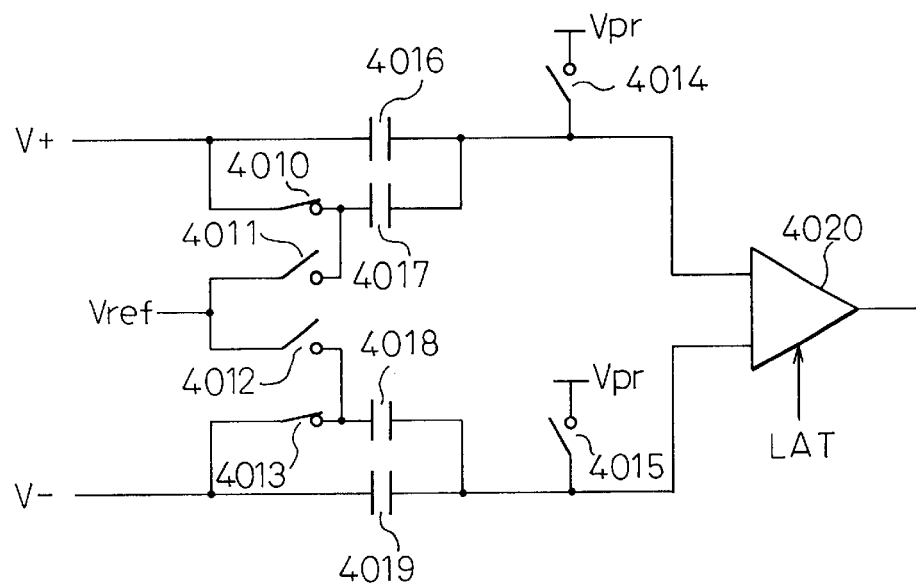
FIG. 37 is a block circuit diagram schematically showing one example of a prior art receiver.
Figure 38:
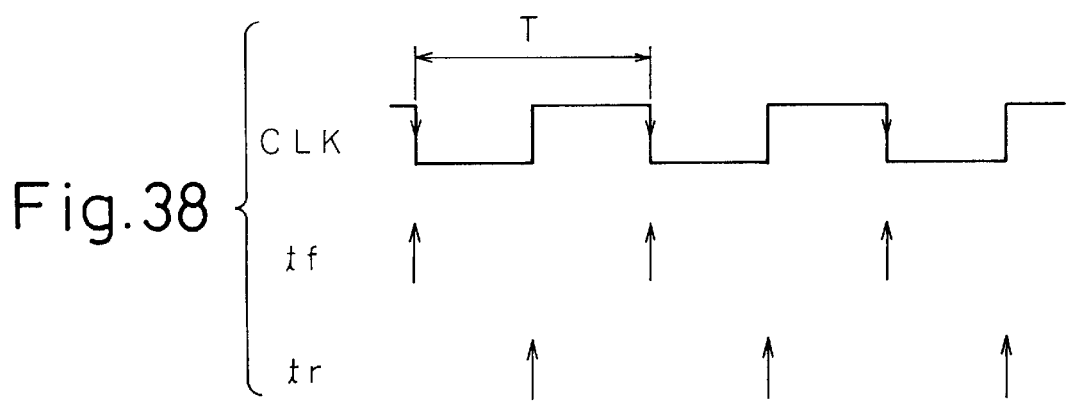
FIG. 38 is a diagram for explaining the problem associated with the receiver of FIG. 37.

FIG. 37 is a block circuit diagram schematically showing one example of a prior art receiver, and FIG. 38 is a diagram for explaining the problem associated with the receiver of FIG. 37.

As shown in FIG. 37, the receiver comprises a capacitor network and a decision circuit (latch 4020). The capacitor network consists of switches 4010 to 4015 and capacitors 4016 to 4019; one input (signal) V+of the receiver (4103) is connected to one input of the latch 4020 via the capacitor 4016 and the series connection of the switch 4010 and the capacitor 4017, and similarly, the other input V− of the receiver is connected to the other input of the latch 4020 via the capacitor 4019 and the series connection of the switch 4013 and the capacitor 4018.

The reference voltage Vref is applied to the node between the switch 4010 and the capacitor 4017 via the switch 4011 and also to the node between the switch 4013 and the capacitor 4018 via the switch 4012, while the precharge voltage Vpr is applied to the inputs of the latch 4020 via the switches 4014 and 4015, respectively. The capacitor network (4010 to 4019) performs an operation for estimating the intersymbol interference component contained in the differential signal, alternately with an operation for signal bit decision, to make a decision on the data.

More specifically, in the intersymbol interference component estimation operation, the switches 4011, 4012, 4014, and 4015 are turned on and the switches 4010 and 4013 off with the falling timing tf of the clock CLK in FIG. 38, thereby storing the voltage at the previous bit time into the capacitors. On the other hand, the signal decision operation is performed by turning the switches 4011, 4012, 4014, and 4015 off and the switches 4010 and 4013 on with the rising timing tr of the clock CLK in FIG. 38, and by subtracting part of the voltage value stored in the capacitors at the previous bit time from the signal value when making a bit decision at the present bit time, that is, by connecting the capacitors 4017 and 4018, where the signal voltage of the previous bit is stored, in parallel with the coupling capacitors 4016 and 4019 that connect the input lines to the decision circuit. With the receiver using PRD, a correct decision is made on the signal data by reducing the effects of intersymbol interference. The receiver is not limited in configuration to that shown in FIG. 37, but various other configurations may be used.

However, with the receiver using the PRD described above, the subtraction of intersymbol interference can be accomplished correctly only at the timing one bit time (T) later than the timing at which the signal value of the previous bit was stored, and after that time, the signal value of the latch 4020 (decision circuit) changes with changes in the signal voltage. That is, the decision circuit must be operated at extremely high speed with correct timing, which means, that the margin for the operation timing of the decision circuit is small.

Next, various embodiments-according to a third mode of the present invention will be described with reference to FIGS. 39 to 51.

Figure 39:
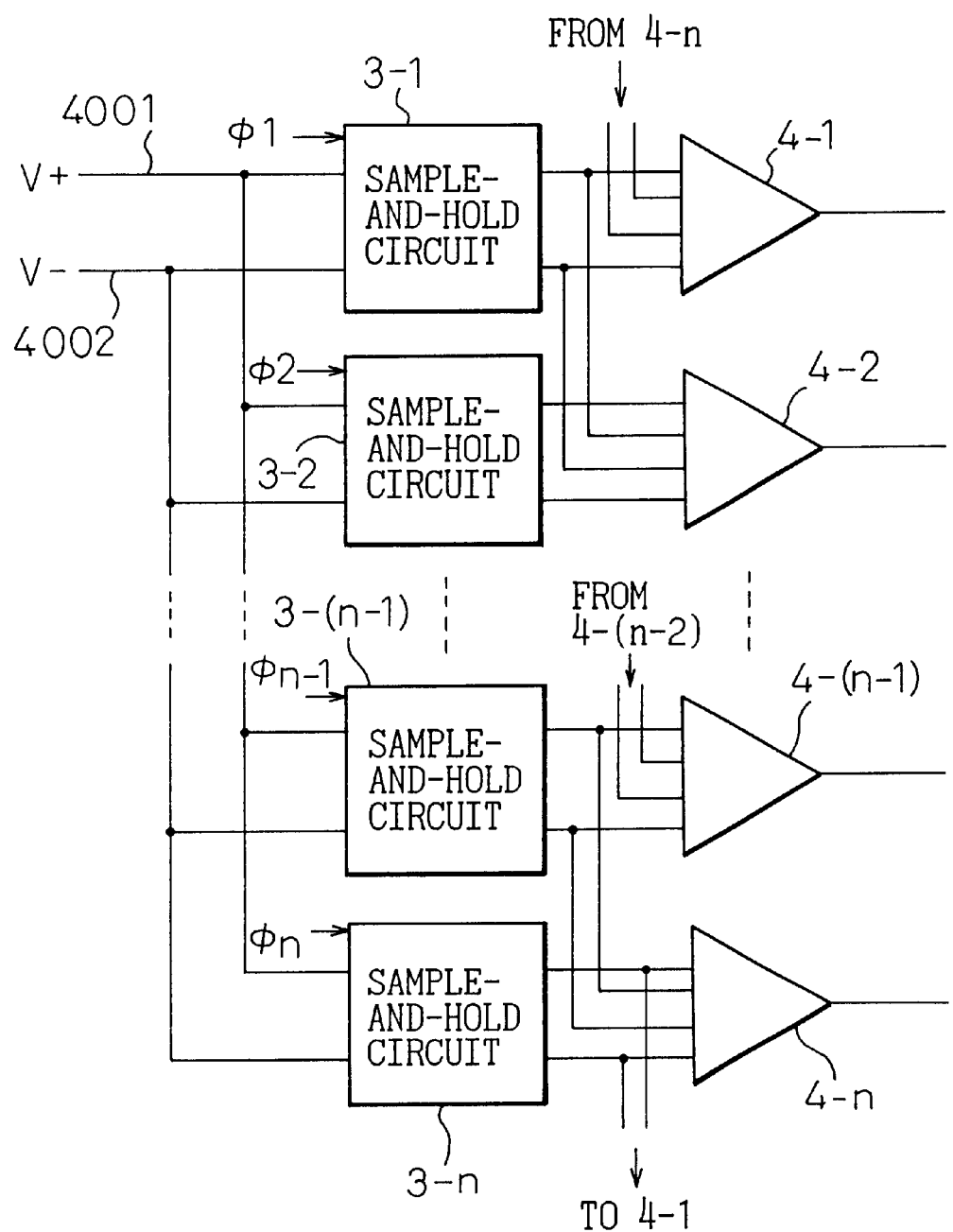
FIG. 39 is a block circuit diagram showing the basic configuration of a receiver according to a third mode of the present invention.
Figure 40:
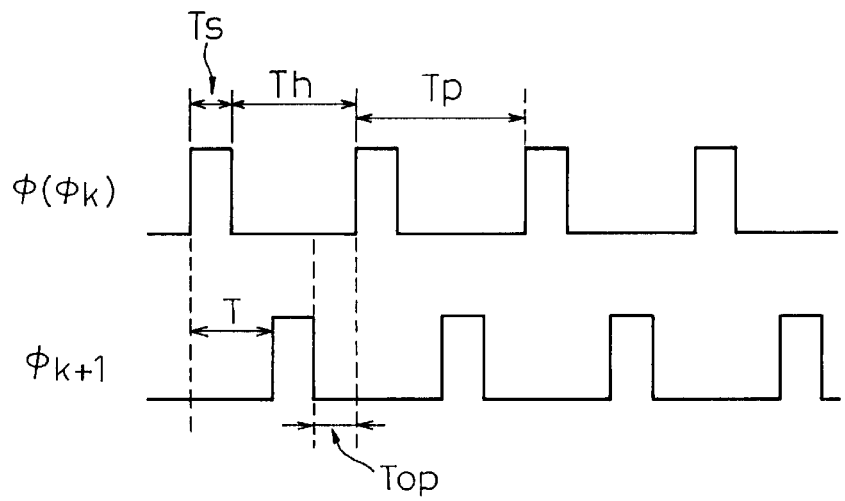
FIG. 40 is a timing diagram for explaining the operation of the receiver of FIG. 39.

FIG. 39 is a block circuit diagram showing the basic configuration of a receiver according to the present invention, and FIG. 40 is a timing diagram for explaining the operation in the receiver of FIG. 39. In FIG. 39., reference numerals 1 and 2 are input lines, 3-1 to 3-n are sample-and-hold circuits, and 4-1 to 4-n are decision circuits (latches). Here, the input lines need not necessary be complementary lines (two lines), but a single-ended input line (one line) may be employed.

The receiver circuit in the third mode of the present invention utilizes the sample-and-hold circuits 3-1 to 3-n comprising capacitors and switches, but various types of sample-and-hold circuits are available. The embodiments hereinafter given will be described by taking as an example the type in which the voltages from the signal lines (V+ and V−) are each connected to a capacitor via a transistor switch.

First, it is assumed that the transistor switch conducts during the high level "H"period of the clock φ. During the conduction period, the capacitor is charged by the signal voltage. If the product of the ON resistance of the switch and the sample capacitance is sufficiently smaller than the length ts of the high level "H" period of the clock φ, then the voltage on the sample capacitor almost faithfully follows the signal voltage.

Next, when the switch is turned off, the voltage on the sample capacitor is held at the signal value at the instant in time that the switch was turned off. Denoting the valid period of the held signal by Th, the sum of Ts and Th is equal to the period Tp of the clock φ(φk).

Here, when the plurality of sample-and-hold circuits 3-1 to 3-n are operated with multi-phase clocks 41 to on, the operating clock is displaced in time by bit time T between two successively operating sample-and-hold circuits 3-k and 3-(k+). Therefore, if the output valid period Th of each sample-and-hold circuit is longer than the bit time T, an overlap period Top occurs between the adjacent sample-and-hold circuits (3-k and 3-(k+1)) with one valid period overlapping into the next valid period. During this overlap period, the outputs of the two sample-and-hold circuits (3-k and 3-(k+1)) are held constant, allowing a timing margin equivalent to that period.

Thus, using multi-phase clocks, the receiver according to the third mode of the present invention increases the clock period Tp of each sample-and-hold circuit and reduces the sample period Ts, thereby increasing the overlap period Top and allowing a correspondingly longer time for the operation of the decision circuit. That is, the timing margin for the operation of the decision circuit can be increased. Furthermore, in the receiver employing the PRD according to the present invention, by allowing the valid output period of one sample-and-hold circuit to overlap into the valid output period of the next sample-and-hold circuit, a correspondingly longer time can be allowed for the operation of the decision circuit, increasing the timing margin and thus achieving high-speed operation.

Figure 41:
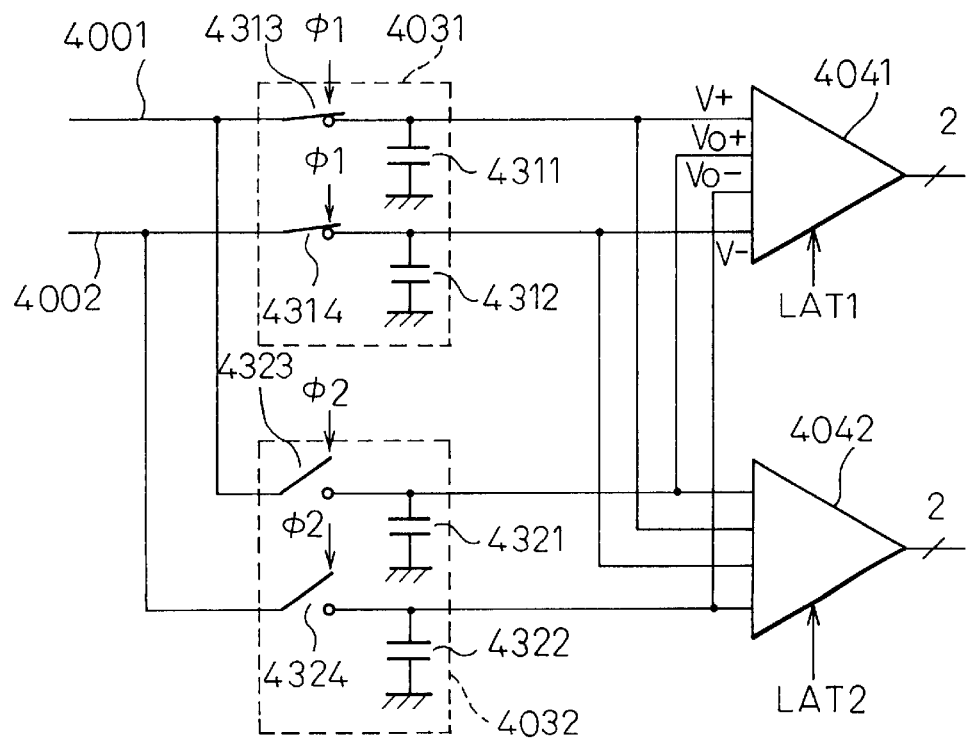
FIG. 41 is a block circuit diagram showing a first embodiment of the receiver according to the third mode of the present invention.
Figure 42:
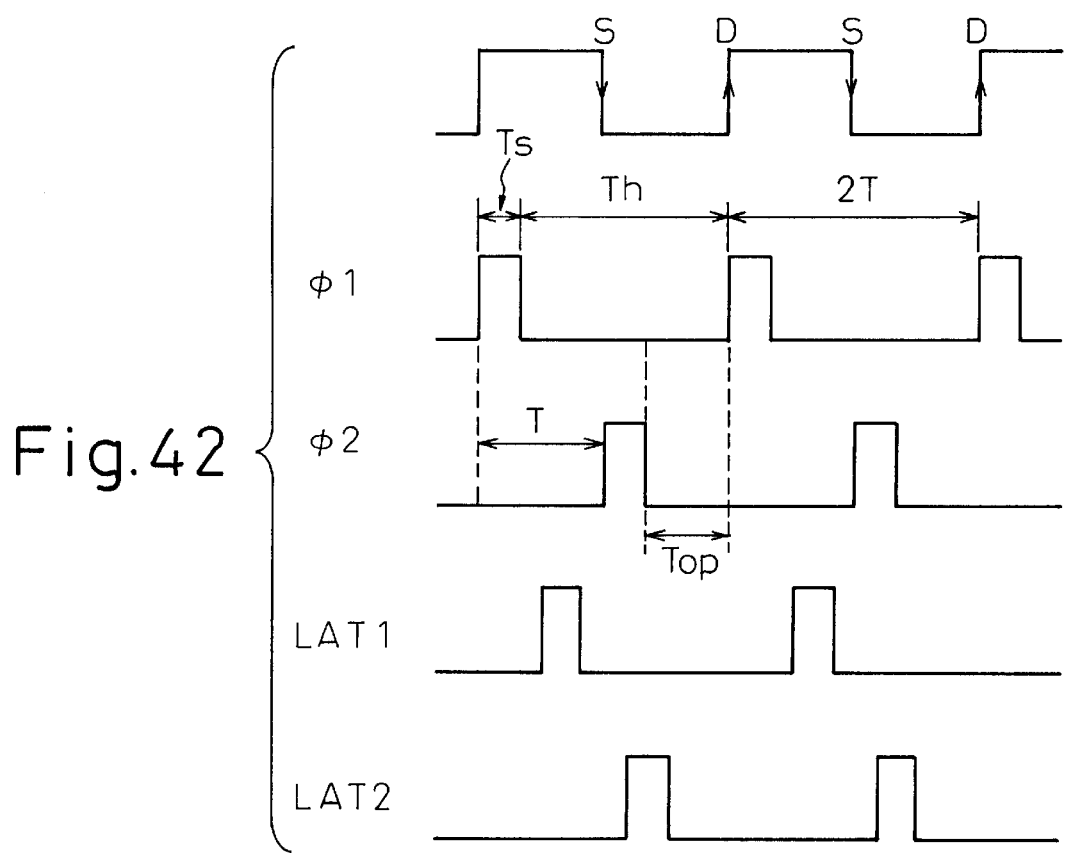
FIG. 42 is a timing diagram for explaining the operation of the receiver of FIG. 41.

FIG. 41 is a block circuit diagram showing a first embodiment of the receiver according to the present invention, and FIG. 42 is a timing diagram for explaining the operation of the receiver of FIG. 41. In FIG. 41, reference numerals 4001 and 4002 are signal lines, 4031 and 4032 are sample-and-hold circuits, and 4041 and 4042 are decision circuits (latches).

As shown in FIG. 41, the receiver of the first embodiment comprises two sample-and-hold circuits 4031 and 4032, and two decision circuits 4041 and 4042. Each of the sample-and-hold circuits 4031 and 4032 includes capacitors 4311 and 4312, or 4321 and 4322, and switches 4313 and 4314, or 4323 and 4324, and signals transmitted over the signal lines 4001 and 4002 are input into the capacitors 4311 and 4312, or 4321 and 4322, via the respective switches 4313 and 4314, or 4323 and 4324.

The switches 4313 and 4314 operate with the clock φ1, and are ON during the high level H period of the clock φ1 and OFF in other periods. Likewise, the switches 4323 and 4324 operate with the clock 42, and are ON during the high level H period of the clock 42 and OFF in other periods. The two sample-and-hold circuits 4031 and 4032 thus operate with the clocks 41 and 42, respectively, which, as shown in FIG. 42, have the same period 2T but are displaced from each other by time T (T is the bit time) with the low level L period (Top) of one clock overlapping into the low level period of the other clock. In FIG. 42, reference character S is the sampling timing, D is the detection (decision) timing, Ts is the high level H period of the clock 41, and Th is the valid period of the held signal.

The decision circuits 4041 and 4042 are regenerative latch circuits. The regenerative latch circuits 4041 and 4042 each comprise two input transistor pairs as described hereinafter.

Figure 43:
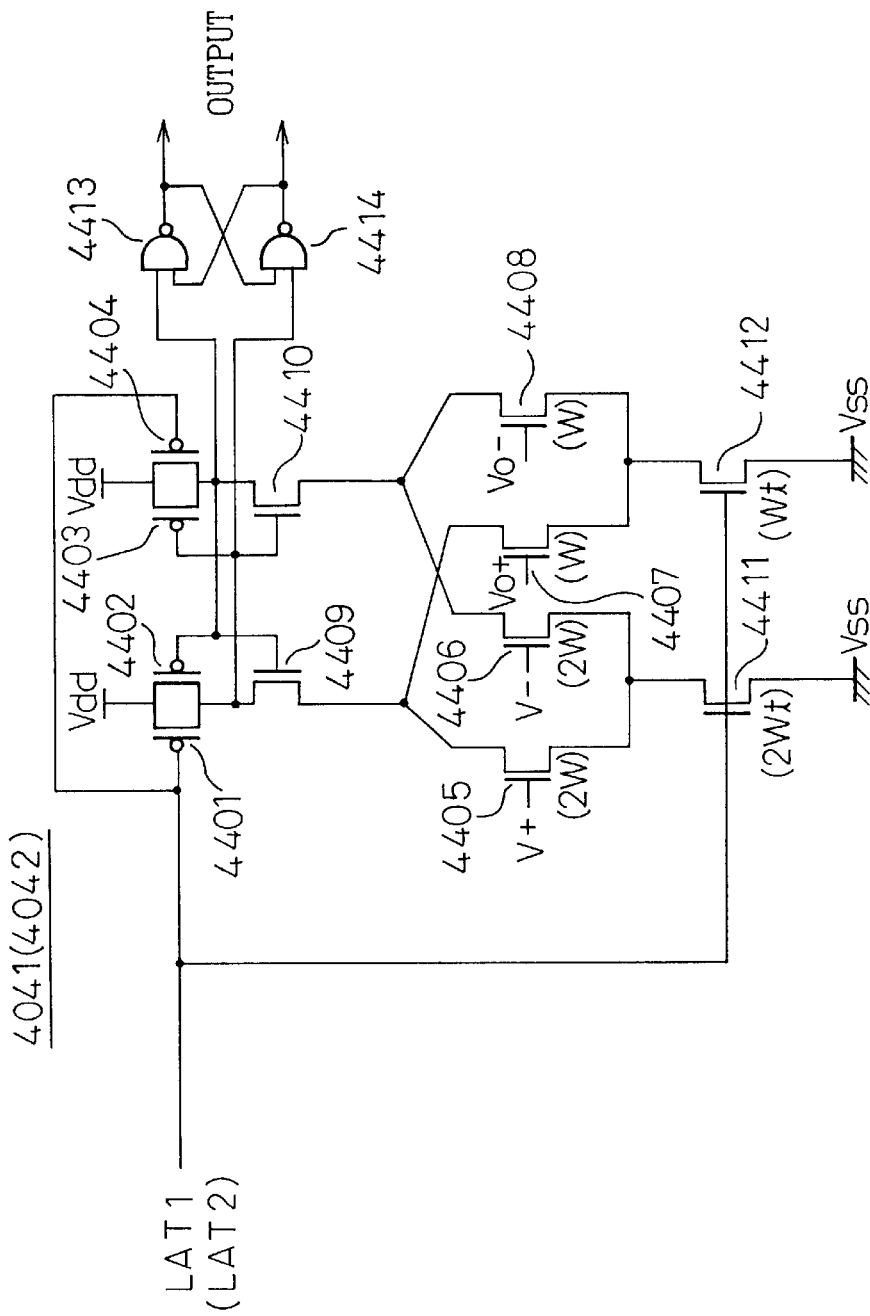
FIG. 43 is a circuit diagram showing one configuration example of a decision circuit in the receiver of FIG. 41.

FIG. 43 is a circuit diagram showing one configuration example of each latch in the receiver of FIG. 41.

As shown in FIG. 43, the decision circuit 4041 (4042) comprises P-channel MOS transistors 4401 to 4404, N-channel MOS transistors 4405 to 4412, and NAND gates 4413 and 4414; the transistors 4405 and 4406 constitute the first transistor pair for receiving signals V+ and V−, while the transistors 4407 and 4408 constitute the second transistor pair for receiving signals V0+ and V0−. Here, the gate width (2W) of the transistors 4405 and 4406 and the gate width (2Wt) of the transistor 4411 are chosen to be twice the gate width (W) of the transistors 4407 and 4408 and the gate width (Wt) of the transistor 4412, respectively. In the decision circuit 4041, for example, the outputs (V+and V−) of one sample-and-hold circuit 4031 at the preceding stage are supplied to the gates of the transistors 4405 and 4406 in the first transistor pair, and the outputs (V0+ and V0−) of the other sample-and-hold circuit 4032 are supplied to the gates of the transistors 4407 and 4408 in the second transistor pair with the opposite polarity from that of the first transistor pair. Here, the ratio of the gate width of the transistors 4405, 4406, and 4411 to the gate width of the transistors 4407, 4408, and 4412 is not limited to 2:1, but may be varied considering the effect that the signal (V0+, V0−) at the immediately preceding bit time has on the signal (v+, V−) at the present bit time.

With the above arrangement, the decision circuit 4041 makes a decision based on the value obtained by subtracting 50% of the signal (VO30 , VO−) at the immediately preceding bit time from the signal (V+, V−) at the present bit time.

The decision circuit 4042 performs the same operation as that of the decision circuit 4041, but with the phase delayed by the bit time T.

In the first embodiment, since the decision circuits 4041 and 4042 perform the decision operation during the period in which the outputs of the two sample-and-hold circuits 4031 and 4032 are both held constant, if the decision timing is displaced by the overlap period (Top), it will have no effect on the result of the decision, providing a greater margin for high-speed operation compared with the prior art circuit.

Figure 44:
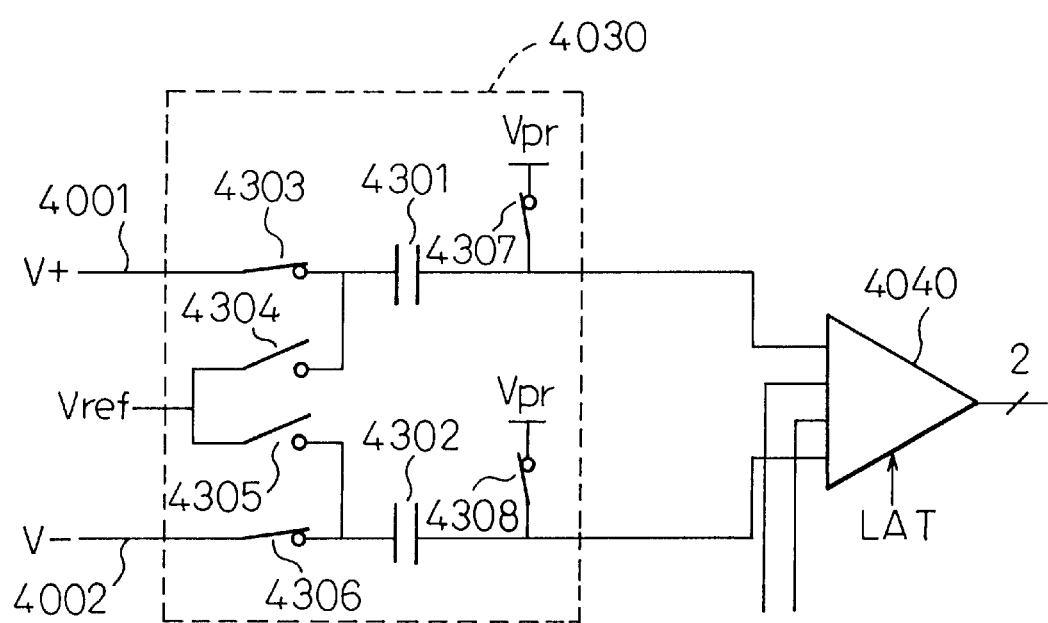
FIG. 44 is a circuit diagram showing a modified example of a sample-and-hold circuit in the receiver of FIG. 41.

FIG. 44 is a circuit diagram showing a modified example of the sample-and-hold circuit 4031, 4032 in the receiver of FIG. 41.

As shown in FIG. 44, the sample-and-hold circuit 4030 in this modified example comprises capacitors (hold capacitors) 4301 and 4302 and switches 4303 to 4308. During the sample period, the switches 4303, 4306, 4307, and 4308 are ON and the switches 4304 and 4305 are OFF, so that the hold capacitors 4301 and 4302 are connected at one end to the signal lines 4001 and 4002 and at, the other end to the inputs of the decision circuit 4040, and the input end of the decision circuit 4040 is charged to the precharge voltage Vpr. During the hold period, on the other hand, the switches 4303, 4306, 4307, and 4308 are OFF and the switches 4304 and 4305 are ON, so that the one end of each of the hold capacitors 4301 and 4302 is disconnected from the signal line 4001 or 4002, respectively, and instead connected to the reference, potential Vref.

Generally, in a sample-and-hold circuit, the channel charge occurring upon the switching off of the transistor flows into the hold capacitor, causing an error, but in the case of the modified example shown here, since the charge is constant and independent of the signal amplitude, the advantage is that, as long as differential, signals are handled, one is offset by the other and the output is not affected.

Figure 45:
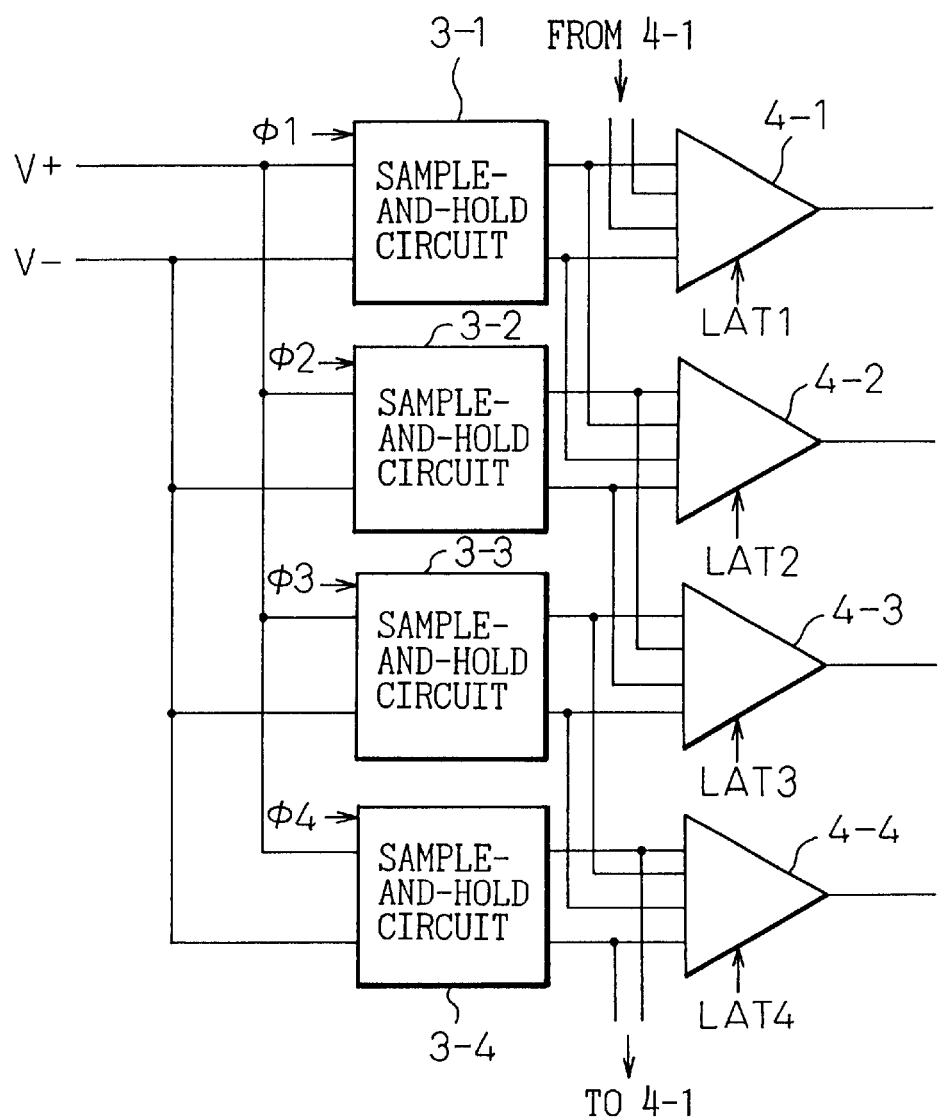
FIG. 45 is a circuit diagram showing a second embodiment of the receiver according to the third mode of the present invention.
Figure 46:
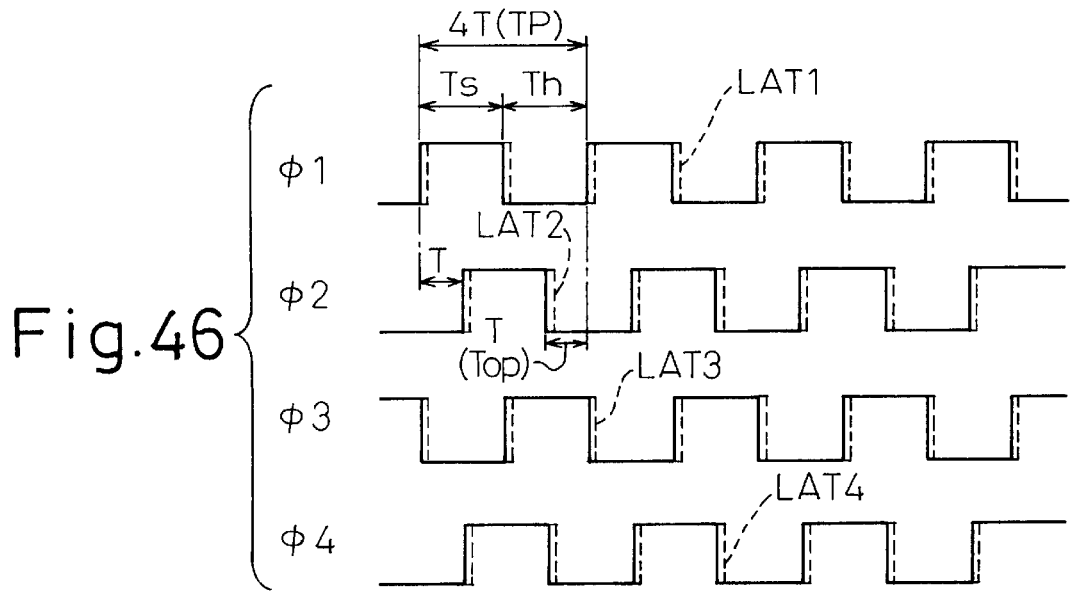
FIG. 46 is a timing diagram for explaining the operation of the receiver of FIG. 45.

FIG. 45 is a circuit diagram showing a second embodiment of the receiver according to the present invention, and FIG. 46 is a timing diagram for explaining the operation of the receiver of FIG. 45. In FIG. 45, reference numerals 3-1 to 3-4 are sample-and-hold circuits, and 4-1 to 4-4 are decision circuits (latches).

As shown in FIG. 45, the second embodiment comprises four sample-and-hold circuits 3-1 to 3-4 and four decision circuits 4-1 to 4-4, and signals (clocks) φ1 to φ4 are supplied to drive the respective sample-and-hold circuits 3-1 to 3-4. Here, the driving signals 41 to φ4 to the sample-and-hold circuits 3-1 to 3-4 are four-phase clocks with a period Tp equal to 4 bit times (4T), as shown in FIG. 46, and the latch signals LAT1 to LAT4 for controlling the latch timings of the decision circuits 4-1 to 4-4 are generated with a slight delay relative to the signals φ1 to φ4. The high level H period Ts of each clock φ(φ1 to φ4) is equal to 2 bit times (2T), and the valid period Th of the held signal is also equal to 2 bit times (2T). An overlap period Top of 1 bit time (T) occurs with one output valid period overlapping the next output valid period between two sample-and-hold circuits operating with adjacent phases (for example, between the sample-and-hold circuits 3-1 and 3-2), and therefore, a timing margin equal to the bit time T can be provided for the operation of each of the decision circuits (latches) 4-1 to 4-4. More specifically, in the second embodiment, since the timing margin for the operation of each decision circuit can be set sufficiently large to allow a time equal to the bit time (T), the decision circuit can be operated with a sufficient margin even in the case of ultra high-speed signal transmission of, for example, about 10 Gb/s.

Figure 47:
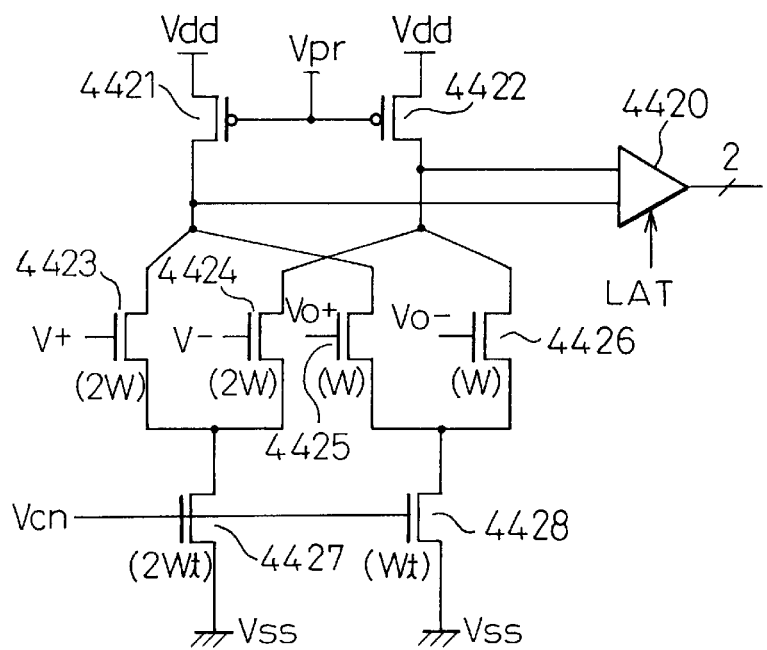
FIG. 47 is a circuit diagram showing an essential portion (decision circuit) of a third embodiment of the receiver according to the third mode of the present invention.

FIG. 47 is a circuit diagram showing an essential portion (decision circuit) of a third embodiment of the receiver according to the present invention.

As shown in FIG. 47, the decision circuit of the third embodiment comprises a latch 4420, P-channel MOS transistors 4421 and 4422, and N-channel MOS transistors 4423 to 4428, and the output voltages (V+, V− and VO+, V0−) of the sample-and-hold circuits at the preceding stage are connected to differential transconductors each having a voltage-current conversion function. Each differential transconductor uses a differential pair (4423 and 4424 or 4425 and 4426) having a tail current as a constant current, and these differential pairs are connected to the load devices formed from the P-channel transistors (4421 and 4422), respectively. That is, in the third embodiment, a weighted sum of the outputs of the sample-and-hold circuits is generated in the form of a sum of currents at the stage of the decision circuit, and a decision is made on that value. In this way, the third embodiment, compared with the directly connected latch configuration, provides excellent linearity in generating the weighted sum and achieves decisions with high accuracy.

Here, the gate width (2w) of the transistors 4423 and 4424 and the gate width (2Wt) of the transistor 4427 are chosen to be, for example, twice the gate width (W) of the transistors 4425 and 4426 and the gate width (Wt) of the transistor 4428, respectively, and a decision is made on the value obtained by subtracting 50% of the signal (VO+, VO−) at the immediately preceding bit time from the signal (V+, V−) at the present bit time and by weighting the result of the subtraction. As previously mentioned, the ratio of the gate width of the transistors 4423, 4424, and 4427 to the gate width of the transistors 4425, 4426, and 4428 is not limited to 2:1, but may be varied considering the effect that the signal at the immediately preceding bit time has on the signal at the present bit time.

Figure 48:
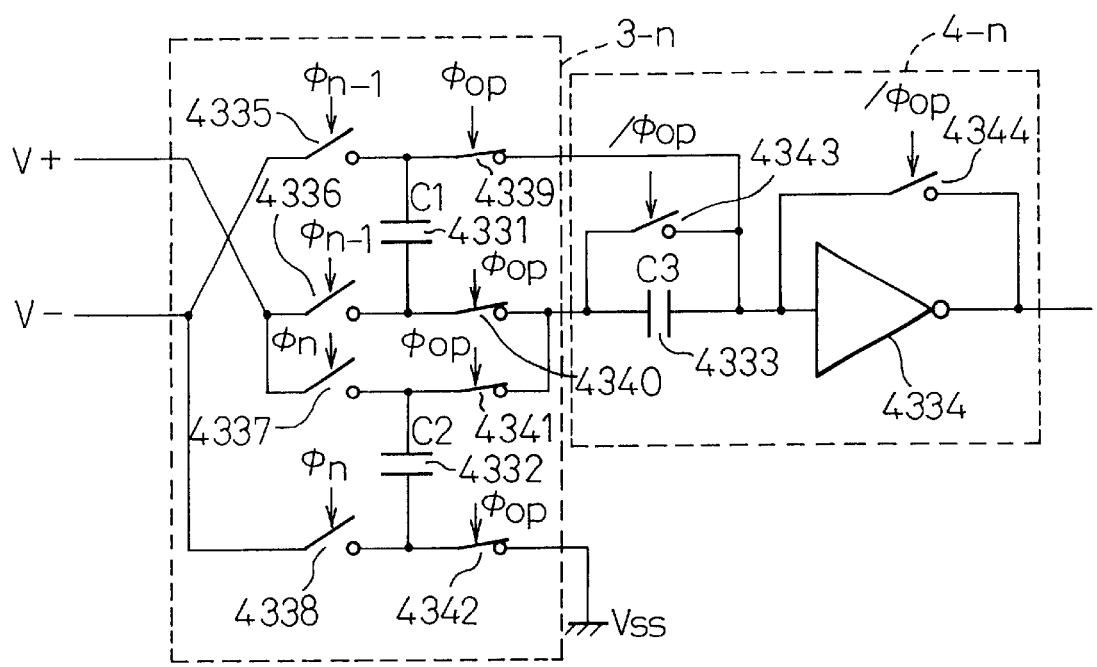
FIG. 48 is a circuit diagram showing a fourth embodiment of the receiver according to the third mode of the present invention.

FIG. 48 is a circuit diagram showing a fourth, embodiment of the receiver according to the present invention; only one sample-and-hold circuit (3-*n*) and one decision circuit (4-*n*) are shown here.

As shown in FIG. 48, the sample-and-hold circuit (3-*n*) comprises capacitors 4331 and 4332 and switches 4335 to 4342, and the connection of the two hold capacitors 4331 and 4332 is controlled by the switches 4335 to 4342, which in turn are controlled by the n-th and (n−1)th control signals φn and φn−1. The decision circuit (4-*n*) comprises a capacitor 4333, an inverter 4334, and switches 4343 and 4344. Here, reference character φop is a signal that is output during the overlap period of control signals /φn−1 and /φn, and /φop is a signal whose level is inverted relative to the signal φop.

In the receiver of the fourth embodiment, in the decision period, the capacitor 4332 holding the signal voltage at the present bit time is connected in series with the capacitor 4331 holding the signal voltage at the past bit time which in turn is connected in parallel to the other coupling capacitor 4333. As a result, the signal value input to the latch equals the signal value at the present bit time minus WWx (the signal value at the past bit time). Here, when the value of the capacitor 4331 is denoted by C1, the value of the capacitor;4332 by C2, and the value of the capacitor 4333 by C3, WW is determined by the ratio of the capacitances 4331 and 4333 connected in parallel, that is, WW=C1/(C1+C3). In the fourth embodiment, since the weighted sum is determined by the capacitance ratio (C1, C2, C3) of the capacitors 4331 to 4333, the linearity can in effect be increased.

Figure 49:
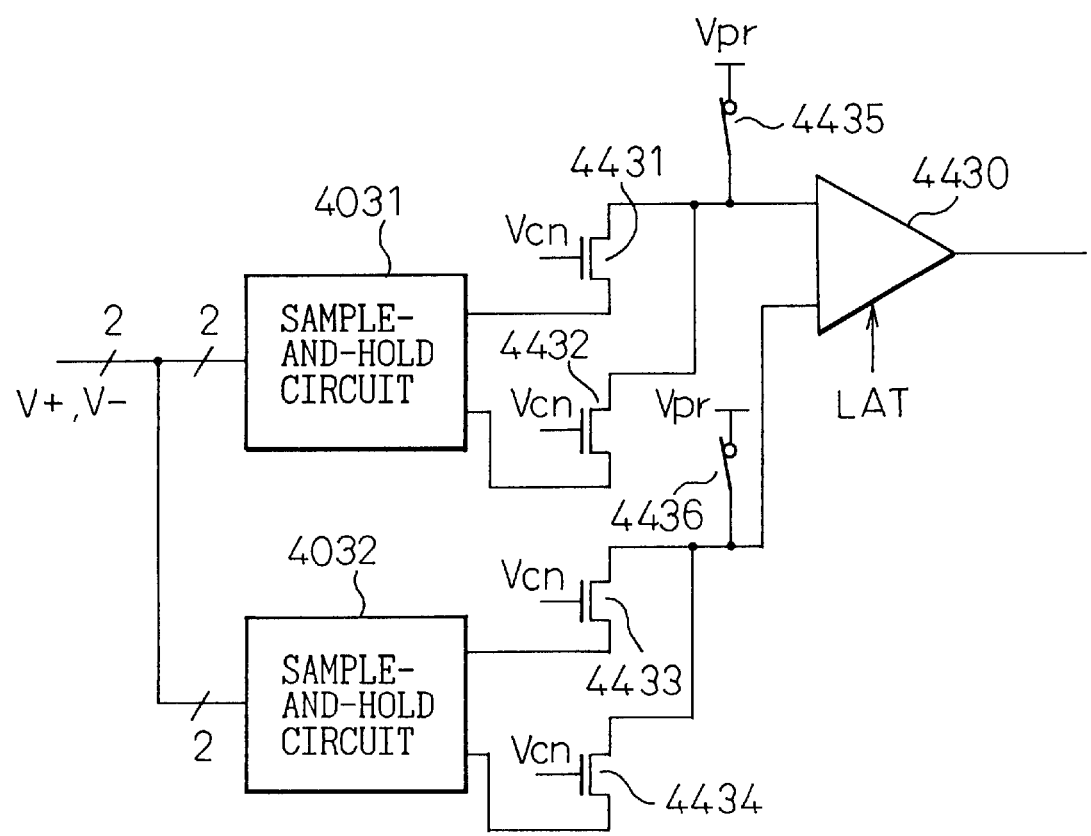
FIG. 49 is a circuit diagram showing a fifth embodiment of the receiver according to the third mode of the present invention.

FIG. 49 is a circuit diagram showing a fifth embodiment of the receiver according to the present invention. In FIG. 49, reference numerals 4031 and 4032 are sample-and-hold circuits which, for example, are the same in configuration as those in the first embodiment described with reference to FIG. 41, 4430 is a latch (decision circuit), 4431 to 4434 are N-channel MOS transistors, and 4435 and 4436 are switches.

As shown in FIG. 49, in the fifth embodiment, in the decision period the capacitors in the sample-and-hold circuits (the capacitors 4311, 4312, 4321, and 4322 shown in FIG. 41) are connected to the sources of the N-channel MOS transistors 4431 to 4434 whose gates are biased to a constant potential (the so-called gate grounding type). Since the transistors 4431 to 4434 are operated in the constant current mode, the flow of charge from the hold capacitor (4311, 4312, 4321, 4322) into the source discharges the drain-side node with a constant current, and a change in charge equivalent to the amount of the charge discharged occurs at the drain side. This means that a change in charge corresponding to the weighted sum of the signal charge at the present time bit and the signal charge one bit time before occurs at the drain side. This mode of operation is the same as the operating principle of the so-called charge transfer amplifier.

According to the fifth embodiment, the weighted sum of signals and the signal amplification occur at the same time. Further, since the gate-source voltage of each transistor used for charge transfer is automatically biased near to the threshold voltage (Vth), variations in transistor Vth are compensated for, achieving high-sensitivity amplification that is not affected by the variations in Vth. Thus, according to the fifth embodiment, a receiver with high sensitivity can be easily achieved.

Figure 50:
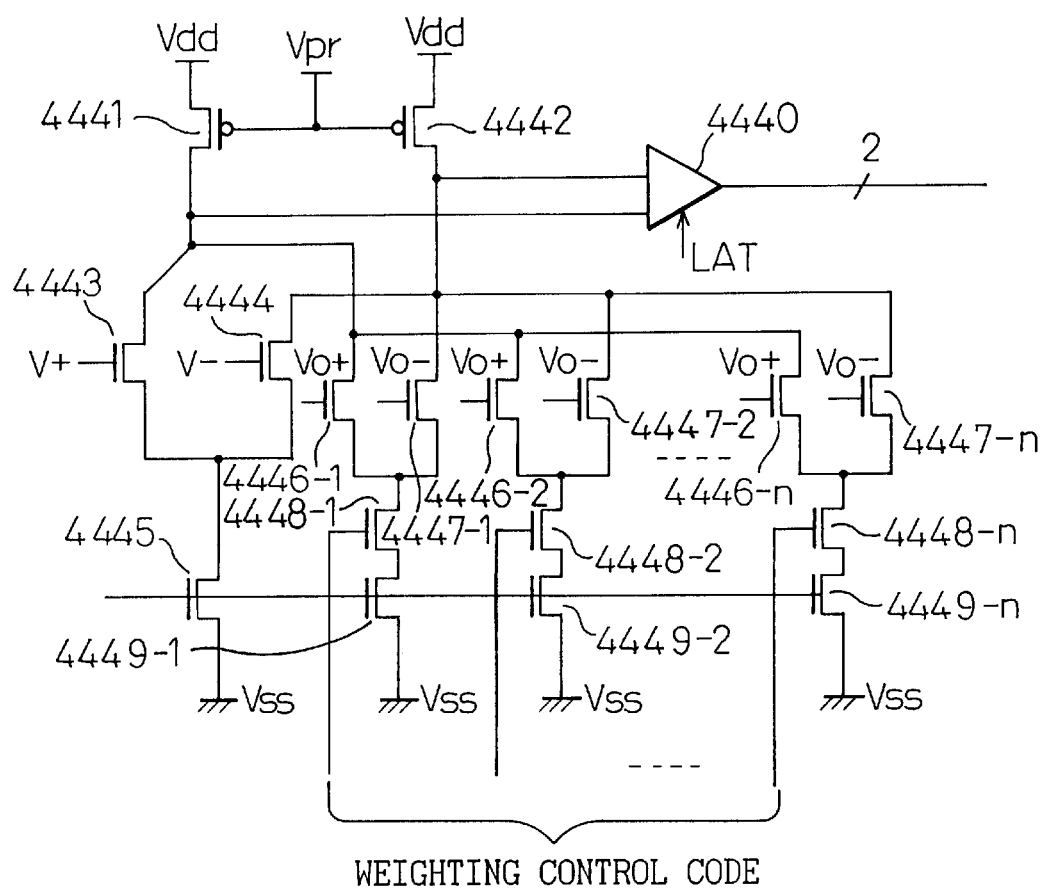
FIG. 50 is a circuit diagram showing an essential portion (decision circuit) of a sixth embodiment of the receiver according to the third mode of the present invention.

FIG. 50 is a circuit diagram showing an essential portion (decision circuit) of a sixth embodiment of the receiver according to the present invention.

As shown in FIG. 50, the decision circuit of the sixth embodiment comprises a latch 4440, P-channel MOS transistors 4441 and 4442, and N-channel MOS transistors, 4443 to 4445, 4446-1 to 4446-*n*, 4447-1 to 4447-*n*, 4448-1 to 4448-*n*, and 4449-1 to 4449-*n*.

In the decision circuit of the sixth embodiment, unlike the decision circuit of the third embodiment shown in FIG. 47, the transconductor for converting the signal one bit time earlier into a current is constructed from a parallel connection of a plurality of transconductors (4446-1, 4447-1, 4448-1, and 4449-*n* to 4446-*n*, 4447-*n*, 4448-*n*, and 4449-*n*), and the number of transconductors, each operating by switching its tail current, is made controllable using a weighting control code. The same weighting control code is applied to all the decision circuits.

In the sixth embodiment, it is possible to control equalization parameters, for example, for PRD, and equalization parameters that match the quality of the transmission line can be selected. It will be appreciated that the equalization parameters can be adjusted likewise, not only in the configuration that uses the transconductors but also in the configuration that uses the capacitive coupling or charge transfer as in the fourth or fifth embodiment.

Figure 51:
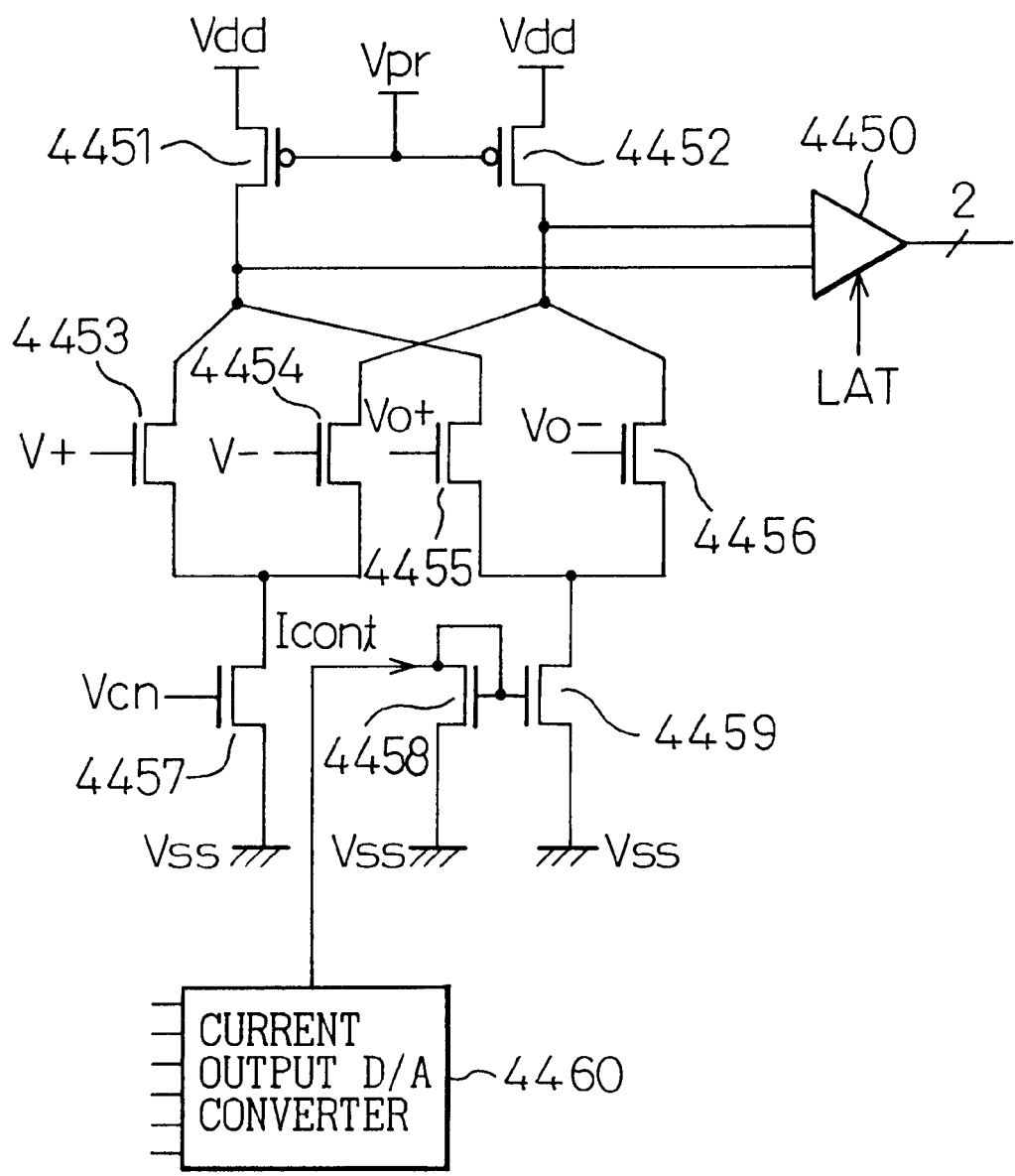
FIG. 51 is a circuit diagram showing an essential portion (decision circuit) of a seventh embodiment of the receiver according to the third mode of the present invention.

FIG. 51 is a circuit diagram showing an essential portion (decision circuit) of a seventh embodiment of the receiver according to the present invention.

As shown in FIG. 51, the decision circuit of the seventh embodiment comprises a latch 4450, P-channel MOS transistors 4451 and 4452, N-channel MOS transistors 4453 to 4459, and a current output D/A converter 4460.

In the decision circuit of the seventh embodiment, unlike the decision circuit of the third embodiment shown in FIG. 47, the tail current of the transconductor for converting the sampled signal into a current is controlled by the current output D/A converter 4460, for example, of 6 bits, to adjust the weighted sum.

According to the seventh embodiment, since the weighted sum can be controlled with an accuracy equivalent to the, resolution of the D/A converter, it is easy to increase the resolution of the control, and as a result, further optimum equalization can be accomplished, and thus a receiver with high sensitivity can be achieved.

As described in detail above, according to the present invention, since the timing margin can be increased for the operation of the decision circuit in the PRD receiver, a receiver can be constructed that is capable of higher-accuracy and higher-speed signal transmission.

Next, a fourth mode of the present invention will be described, but before that, the prior art corresponding to the fourth mode and the problem associated with the prior art will be described first.

Figure 52:
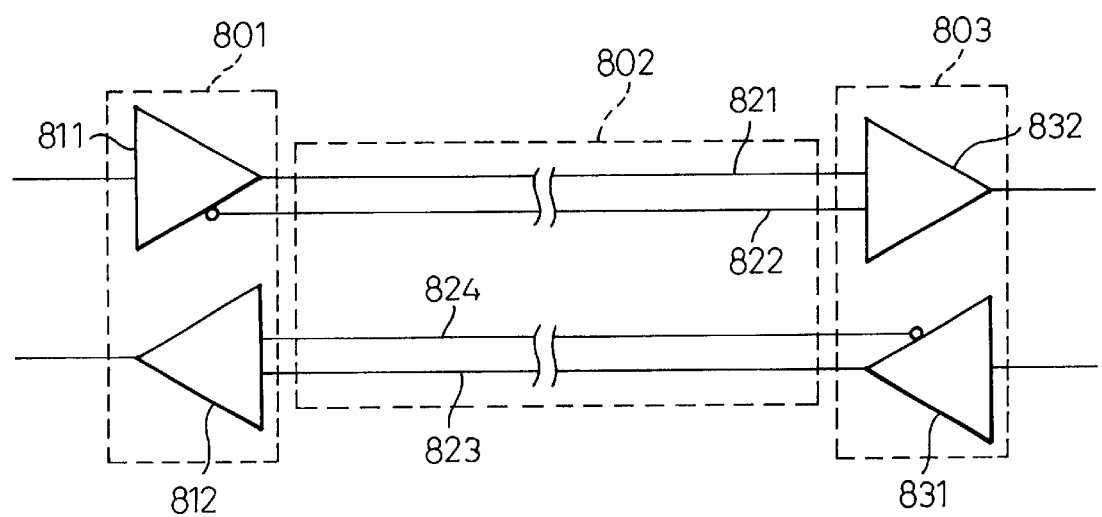
FIG. 52 is a circuit diagram schematically showing one example of a prior art signal transmission system.

FIG. 52 is a circuit diagram schematically showing one example of the prior art signal transmission system. In FIG. 52, reference numerals 801 and 803 are transceiver circuits, and 802 is a signal transmission line (cable).

As shown in FIG. 52, the prior art signal transmission system comprises the transceiver circuits 801 and 803 and the signal transmission line 802 connecting between the transceiver circuits. The transceiver circuit 801 is mounted on a board or in an enclosure (for example, a server) at one end, whiles the transceiver circuit 803 is mounted on a board or in an enclosure (for example, a main storage device) at the other end. Here, when this signal transmission system is applied for signal transmission between circuit blocks accommodated on one LSI chip, for example, the transceiver circuits 801 and 803 are contained in different circuit blocks. The signal lines (821, 822 and 824,823) are shown here as complementary signal lines, but the so-called single-ended signal line configuration may be employed.

Each transceiver circuit 801, 803 contains a driver 811, 831 and a receiver 812, 832. The driver 811 in the transceiver circuit 801 is connected to the receiver 832 in the transceiver circuit 803 via the signal lines (complementary signal lines) 821 and 822, while the driver 831 in the transceiver circuit 803 is connected to the receiver 812 in the transceiver circuit 801 via the complementary signal lines 823 and 824.

In recent years, the amount of data transmission between LSI chips or between boards or enclosures has been increasing rapidly and, to cope with these increasing data amounts, there is a need to increase the signal transmission speed per terminal (pin). Increasing the signal transmission speed is necessary, for example, to avoid an increase in package cost due to increased pin count. As a result, the speed of signal transmission between LSIs, etc. in recent years has come to exceed 1 Gbps, and in the future (three to eight years from now) it is expected to reach an extremely high value of about 4 Gbps to 10 Gbps.

However, in such high-speed signal transmission exceeding 1 Gbps, for example, in signal transmission between server and main storage device, bandwidth per signal transmission line is limited by such factors as high-frequency component losses due to the skin effect of the transmission line and high-frequency component reflections due to parasitic inductance and capacitance, etc. These limitations on the signal transmission bandwidth can be alleviated, for example, by using large-core cables, but if large capacity signal (data) transmission is to be achieved, for example, by bundling many signal lines in parallel, it should be noted that cable diameter is also limited because there is a limit to the diameter of the cable bundle.

That is, if large-capacity signal transmission is to be achieved with the prior art signal transmission system such as shown in FIG. 52, not only are many pins and signal lines required, but the maximum length of the signal transmission line is also limited because of limitations, etc. on the thickness of each signal line.

Figure 53:
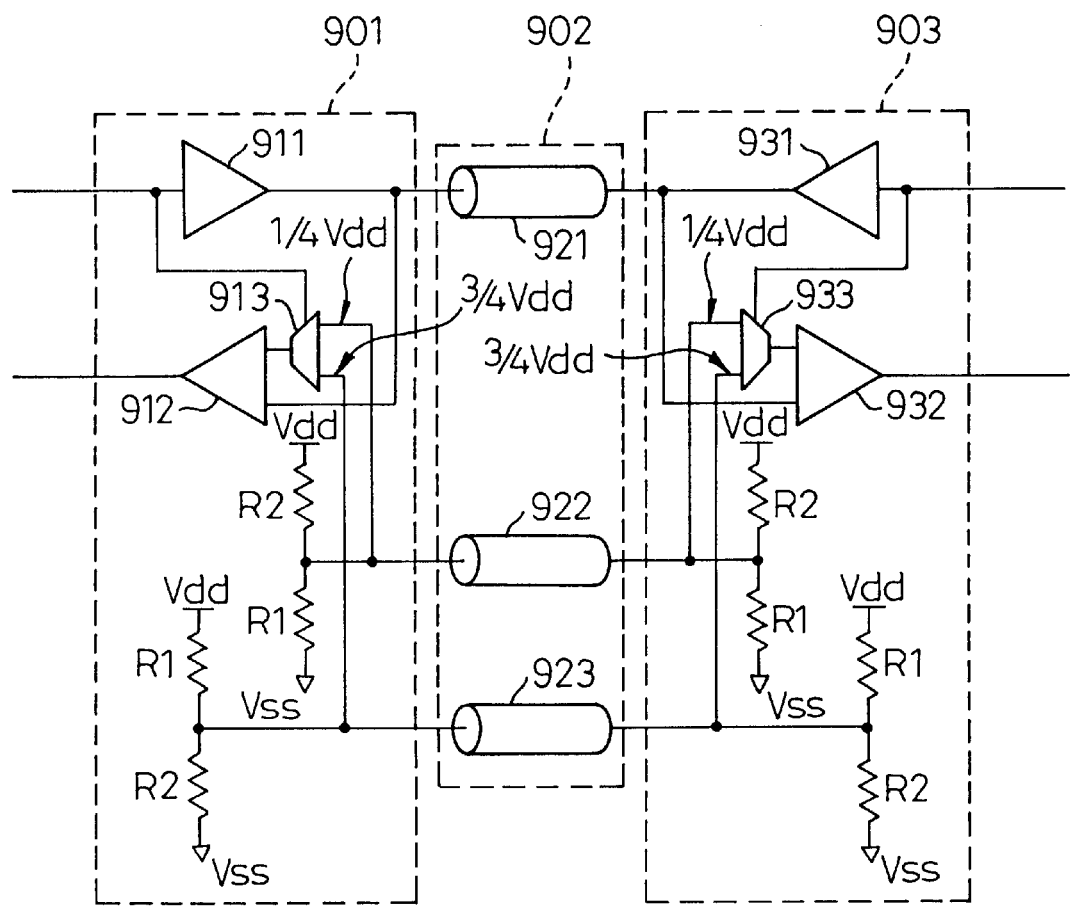
FIG. 53 is a circuit diagram schematically showing another example of a prior art signal transmission system.

A bidirectional transmission technology has been known in the prior art as a signal transmission method that can reduce the number of signal lines. An example of a signal transmission system that achieves accurate signal transmission (decision) by employing this bidirectional signal transmission technology is proposed by M. Haycock et al., in "A 2.5 Gb/s Bidirectional Signaling Technology," Hot Interconnects Symposium V, pp. 149–156, Aug. 21–23, 1997. FIG. 53 is a circuit diagram schematically showing another example of the prior art-signal transmission system; the signal transmission system proposed by M. Haycock et al. is, specifically shown here.

In FIG. 53, reference numeral 901 and 903 are transceiver circuits, and 902 is a signal transmission line (cable). As shown in FIG. 53, the prior art signal transmission system comprises the transceiver circuits 901 and 903 and the signal transmission line 902 connecting between the transceiver circuits.

Each transceiver circuit 901, 903 includes a driver (constant-voltage driver) 911, 931, a receiver (differential amplifier) 912, 932, a selector 913, 933, and a plurality of resistor pairs. R1/R2 for generating two reference voltages (1/4-Vdd and 3/4-Vdd). The drivers 911 and 931 are connected via a signal line 921 for bidirectional signal transmission. Both ends of the signal lines (reference voltage lines) 922 and 923 are supplied with resistor divided prescribed voltages (for example, 1/4-Vdd to the reference voltage line 922 and 3/4-Vdd to the reference voltage line 923), and the two reference voltages (1/4-Vdd and 3/4-Vdd) are supplied to each selector 933.

In the signal transmission system shown in FIG. 53, when the driver 911 in the transceiver circuit 901 at one end outputs a low level LI (Vss: 0 volt), the reference voltage of 1/4-Vdd is selected by the selector 913 and applied to the receiver (differential amplifier) 912. The receiver 912 judges against the reference voltage of 1/4-Vdd the output of the driver 931 supplied via the signal line 921 from the transceiver circuit 903 at the other end. More specifically, when the output of the driver 911 at one end is low "L", if the output of the driver 931 at the other end is also low "L", then logically the voltage on the signal line 921 (the input voltage to the receiver 912) is low "L" (Vss: 0 volt); on the other hand, if the output of the driver 931 at the other end is high "H" (Vdd), then logically the voltage on the signal line 921 is 1/2-Vdd. In this way, in the signal transmission system of FIG. 53, when the output of the driver 911 is low "L", the input to the receiver 912 varies within the range of 0 to 1/2-Vdd; therefore, by comparing (differentially amplifying), it with the intermediate reference voltage of 1/4-Vdd, the signal level from the driver 931 at the other end (the transceiver circuit 903 at the other end) is correctly determined.

Further, when the driver 911 in the transceiver circuit 901 at one end outputs a high level "H" (Vdd), the reference voltage of 3/4-Vdd is selected by the selector 913 and applied to the receiver 912. The receiver 912 judges against the reference voltage of 3/4-Vdd the output of the driver 931 supplied via the signal line 921 from the transceiver circuit 903 at the other end. More specifically, when the output of the driver 911 at one end is high "H", if the output of the driver 931 at the other end is low "L", then logically the voltage on the signal line 921 is 1/2-Vdd; on the other hand, if the output of the driver 931 at the other end is also high "H" (Vdd), then logically the voltage on the signal line 921 is Vdd. In this way, in the signal transmission system of FIG.

53, when the output of the driver 911 is high "H", the input to the receiver 912 varies within the range of 1/2-Vdd to Vdd; therefore, by comparing it with the intermediate reference voltage of 3/4-Vdd, the signal level from the driver 931 at the other end is correctly determined.

However, in the above prior art bidirectional signal transmission system, the decision on the output signal of the driver 931 in the transceiver circuit 903 at the other end, for example, cannot be made by the receiver 912 in the transceiver circuit 903 at one end until after the voltage change caused by the output signal of the driver 931 has appeared at the input of the receiver 912 and the difference voltage with respect to the selected reference voltage has become large enough, that is, the signal level has been determined. Furthermore, in this prior art bidirectional signal transmission system, the received signal must not be substantially displaced in phase with respect to the transmitted signal (synchronization must be maintained between the transmitted and received signals), and this constraint has imposed a serious limitation on the maximum length of the signal line (wiring line) (for example, to about 10 cm in the case of 10 Gbps).

Referring now to FIGS. 54 to 70, various embodiments of the fourth mode of the present invention will be described in detail below.

Figure 54:
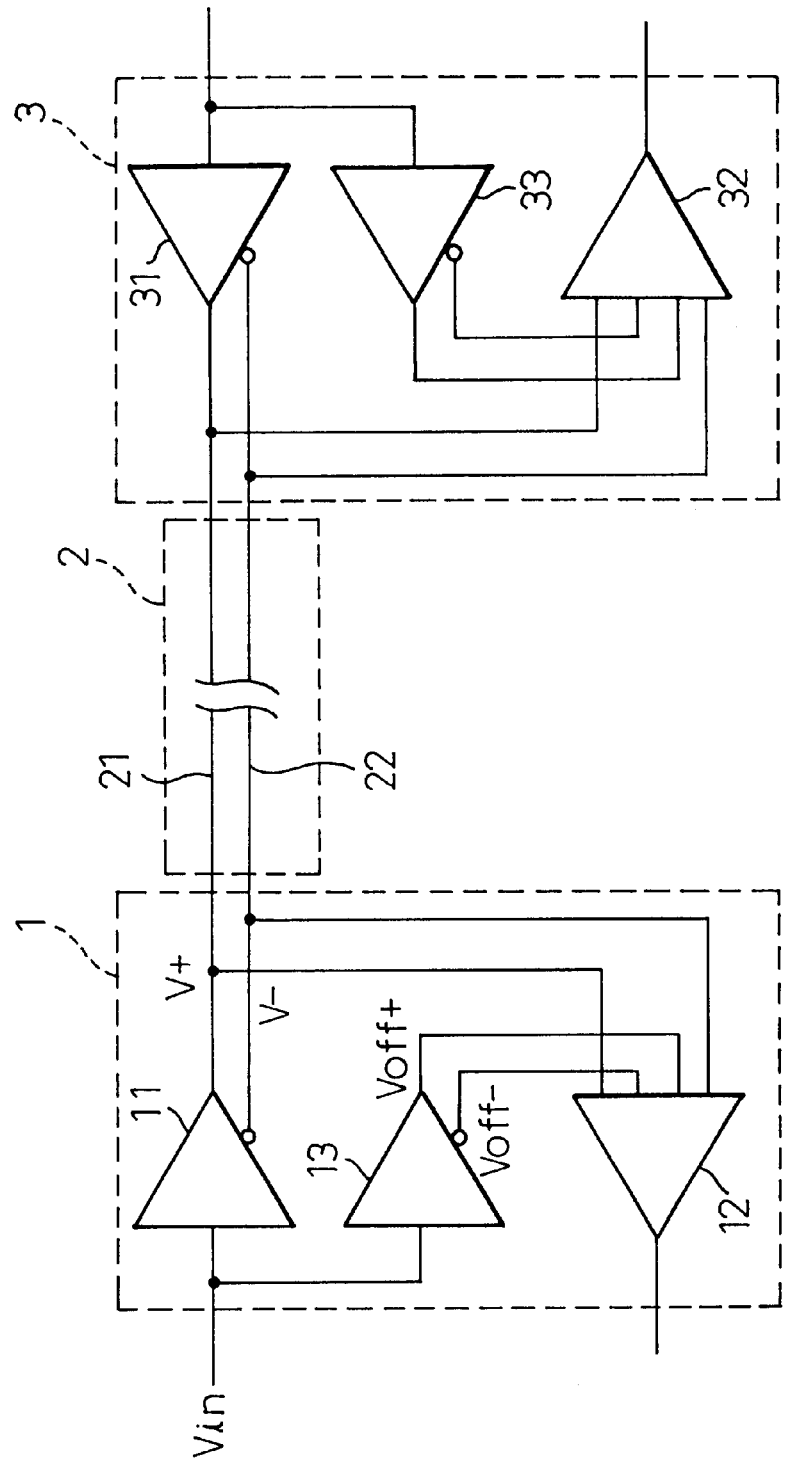
FIG. 54 is a block circuit diagram showing the basic configuration of a transceiver circuit according to the present invention.

FIG. 54 is a block circuit diagram showing the basic configuration of the transceiver circuit according to the present invention. In FIG. 54, reference numerals 1 and 3 are transceiver circuits, and 2 is a signal transmission line (cable). As shown in FIG. 54, the signal transmission system according to the fourth mode of the present invention comprises the transceiver circuits 1 and 3 and the signal transmission line 2 connecting between the transceiver circuits.

Each transceiver circuit 1, 3 includes a driver 11, 31, a receiver 12, 32, and a compensation voltage generating circuit 13, 33. In FIG. 54 and other figures depicting the embodiments hereinafter given, the signal transmission is shown as being carried out over complementary signal lines 21 and 22, but it will be appreciated that the signal transmission can also be accomplished using the so-called single-ended signal line.

As can be seen from FIG. 54, in the transceiver circuit (the signal transmission system and signal transmission method) according to the fourth mode of the, present invention, bidirectional transmission is employed to increase the efficiency of use of the signal transmission line. That is, the complementary signal outputs (V+ and V−) of the driver 11 in the transceiver circuit 1 at one end are connected to the inputs of the receiver 12 in the transceiver circuit 1 at the same end, and also connected via the signal line 2 (21, 22) to the complementary signal outputs of the driver 31 in the transceiver circuit 3 at the other end.

Usually, in point-to-point signal transmission, signals can be transmitted in only one direction at a time, and when transmitting signals in both directions using a single transmission line (signal transmission line), the transmission is accomplished by switching between the driver and receiver. If bidirectional signal transmission is possible without having to switch between the driver and receiver, the signal transmission rate per transmission line can be increased. This is because the signal transmission line inherently has the property of being able to carry a signal in one direction and another signal in the opposite direction at the same time. If means for separating signals transmitting in one direction and those transmitting in the opposite direction are provided at both ends of the transmission line, signals can be transmitted in both directions at a time over a single transmission line, and the transmission rate per transmission line can then be doubled compared with the transmission rate previously possible.

In the present invention, when one end of the transmission line (for example, the transceiver circuit 1) is looked at, the signal (V+, V−) input to the receiver 12 consist of the signal transmitted from the driver 31 at the opposite end, superimposed on the voltage caused by the driver 11 at the one end. In view of this, in the transceiver circuit (for example, the transceiver circuits 1) according to the fourth mode of the present invention, the compensation voltage generating circuit 13 generates an offset voltages (Voff+, Voff−) corresponding to the voltage (interference voltage) caused by the driver 11 at the same end, and supplies it to the receiver 12, which-then removes from the received waveform the interference voltage caused by the driver 11 so that the signal (transmitted from the driver 31 at the opposite end) can be correctly received (discriminated) even when signals are being transmitted in both directions at the same time.

More specifically, in the transceiver circuit 1 at one end, for example, since the signal (Vin) that the driver 11 at the same end is transmitting is known, the compensation voltage generating circuit 13 (basically the same in configuration as the driver) generates the interference voltage (offset voltage, Voff+, Voff−) associated with the output of the driver 11; by removing this interference voltage (Voff+, Voff−) from the received waveform (V+, V−), the receiver 12 can make a correction-decision on the output of the driver 31 in the transceiver circuit 3 at the opposite end. Signal decision at the receiver 32 in the transceiver circuit 3 at the opposite end is also performed in like manner.

Furthermore, in the present invention, unlike the prior art bidirectional signal transmission shown in FIG. 53, correct signal decisions can be made if there exists an arbitrary phase displacement between the received and transmitted signals. This is because signal reception can be performed with any timing by using a circuit that generates the correct compensation offset voltage at the signal decision timing, as will described later.

In this way, according to the present invention, the phase relationship between the transmitted and received signals is allowed td take any arbitrary value, and the phase value is also allowed to vary with time; this offers the advantages that there are no limitations on the length of the signal transmission line, and that there is no need to precisely synchronize the received signal to the transmitted signal.

Figure 55:
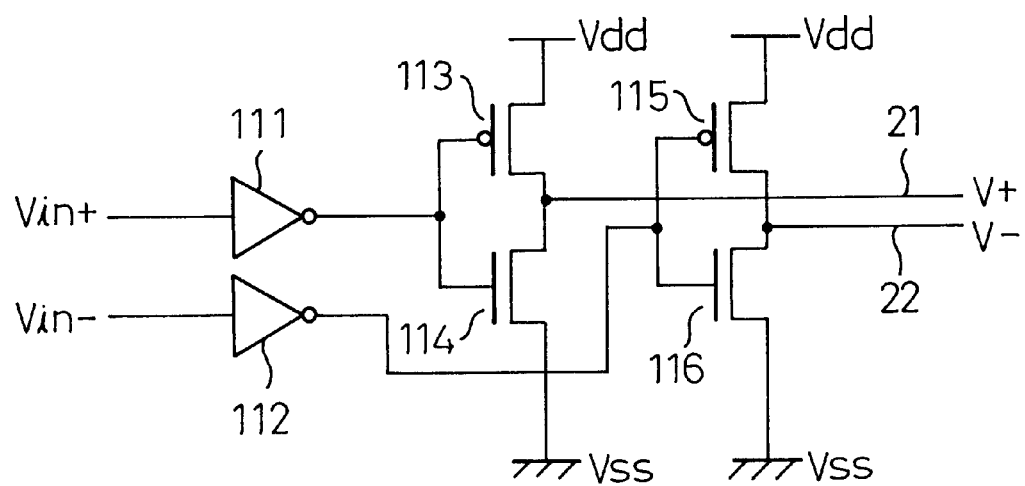
FIG. 55 is a circuit diagram showing a driver in a transceiver circuit as a first embodiment according to a fourth mode of the present invention.

FIG. 55 is a circuit diagram showing a driver in a transceiver circuit as a first embodiment according to the fourth mode of the present invention; the driver shown here corresponds to the driver 11 (31) in the transceiver circuit 1 (3) shown in FIG. 54. In FIG. 55, the signals input to the driver 11 are also shown as complementary signals (Vin+ and Vin−). In FIG. 55, reference numerals 111 and 112 are inverters, 113 and 115 are F-channel MOS transistors (PMOS transistors), and 114 and 116 are N-channel MOS transistors (NMOS transistors).

In the driver of the first embodiment, the output stage is configured as a push-pull inverter stage. That is, the positive logic input signal Vin+is fed via the inverter 111 to the push-pull inverter (consisting of the PMOS transistor 113 and NMOS transistor 114) and transmitted out on the signal transmission line 21, while the negative logic input signal Vin−is fed via the inverter 112 to the push-pull inverter (consisting of the PMOS transistor 115 and NMOS transistor 116) and transmitted out on the signal transmission line 22.

The signal line 21 that carries the positive logic output signal from the driver 11 in the transceiver circuit (1) at one end is connected to the positive logic output of the driver 31 in the transceiver circuit (3) at 35 the other end, and likewise, the signal line 22 that carries the negative logic output signal from the driver 11 is connected to the negative logic output of the driver 31. Further, in the transceiver circuit (1) at one end, the outputs (signal lines 21 and 22) of the driver 11 are connected to the inputs of the receiver (12), while in the transceiver circuit (3) at the other end, the outputs (signal lines 21 and 22) of the driver 31 are connected to the inputs of the receiver (32). Specifically, the driver 11 transmits NRZ (Non-Return to Zero) signals onto the signal lines at a data transmission rate of, for example, 1.25 Gbps.

Figure 56:
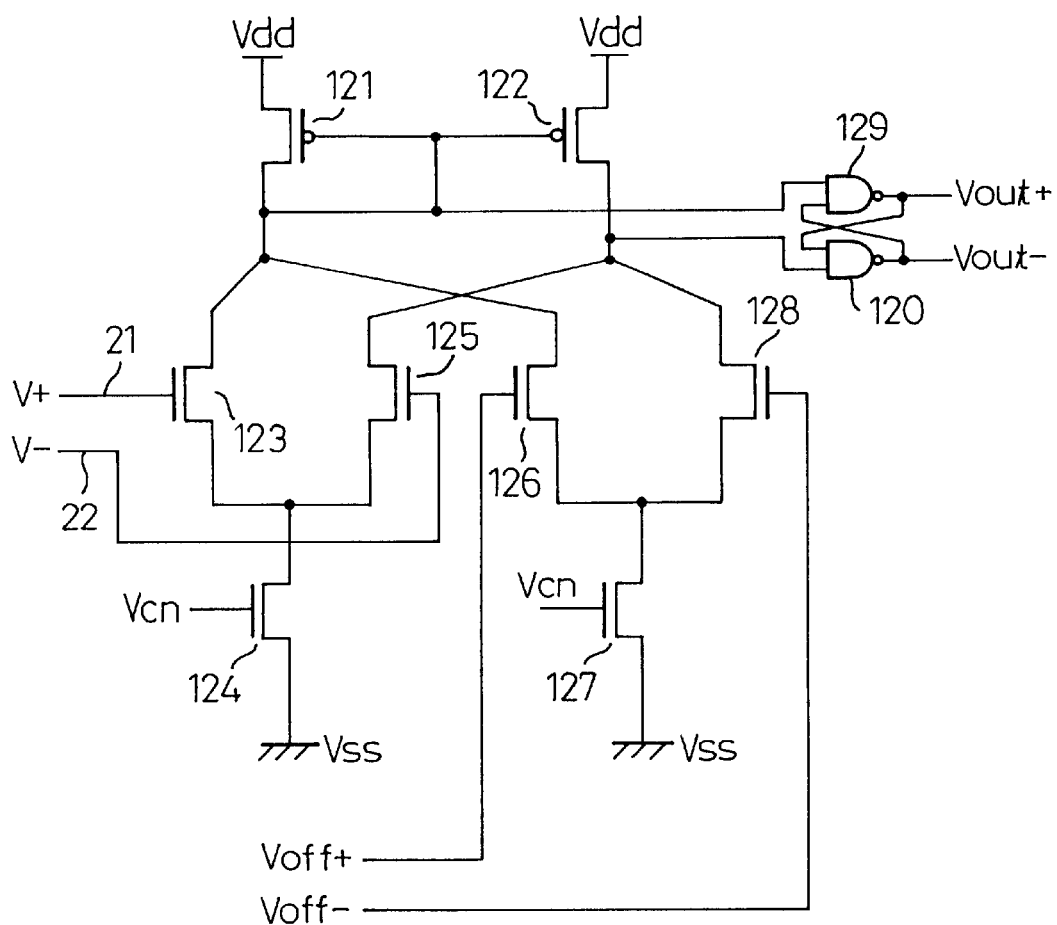
FIG. 56 is a circuit diagram showing a receiver in a transceiver circuit as a second embodiment according to the fourth mode of the present invention.

FIG. 56 is a circuit diagram showing a receiver in a transceiver circuit as a second embodiment according to the fourth mode of the present invention; the receiver shown here corresponds to the receiver 12 (32) in the transceiver circuit 1 (3) shown in FIG. 54. In FIG. 56, reference numerals 121 and 122 are PMOS transistors, 123 to 128 are NMOS transistors, and 120 and 129 are NAND gates. Further, reference character Vcn indicates the bias voltage applied to the gates of the NMOS transistors 124 and 127.

As shown in FIG. 56, the receiver 12 is constructed from two differential amplifier circuits, and takes as an input the offset voltage (Voff+, Voff−) from the compensation voltage generating circuit (13) in addition to the normal input signal (Vin+, Vin−). That is, in the receiver 12, the offset voltage Voff+, Voff is subtracted from the normal input signal Vin+, Vin−, and the decision on whether the signal is a high level "H" signal (a 1) or a low level "L" signal (a 0) is made using the regenerative latch constructed from a pair of cross-coupled NAND gates 120 and 129.

The receiver 12 thus cancels out the interference voltage (offset voltage) associated with the output signal of the driver 11 from the receiver input, and correctly receives (discriminates) the output signal of the driver (31) supplied via the signal lines 21 and 22 from the transceiver circuit (3) at the other end. The circuit configuration of the compensation voltage generating circuit (13), here is, for example, the same as that of the driver 11. The same circuit as the transceiver circuit (1) comprising the driver 11, receiver 12, and compensation voltage generating circuit 13 is provided at the opposite end of the signal lines 21 and 22.

The above embodiment has been described by taking as an example the case in which all signal transmission is performed using differential signals (complementary signals), but as previously noted, the present invention can also be applied to the so-called single-ended signal transmission.

As described above, only the voltage based purely on the driver (11), not containing the effects of the signal input from the driver (31) at the opposite end, appears at the output (offset voltage Voff+, Voff−) of the compensation voltage generating circuit (13: a replica driver having the same configuration as the driver); therefore, by subtracting the offset voltage (Voff+, Voff−) from the input signal (Vin+, Vin−), signal reception in bidirectional transmission becomes possible.

If, for example, the driver is constructed from a plurality of driver units. (for example, 4, 8, or 16 driver units), as in the fifth embodiment described later with reference in FIG. 59, the replica driver may be constructed using the same configuration as that of one of the driver units constituting the driver.

Figure 57:
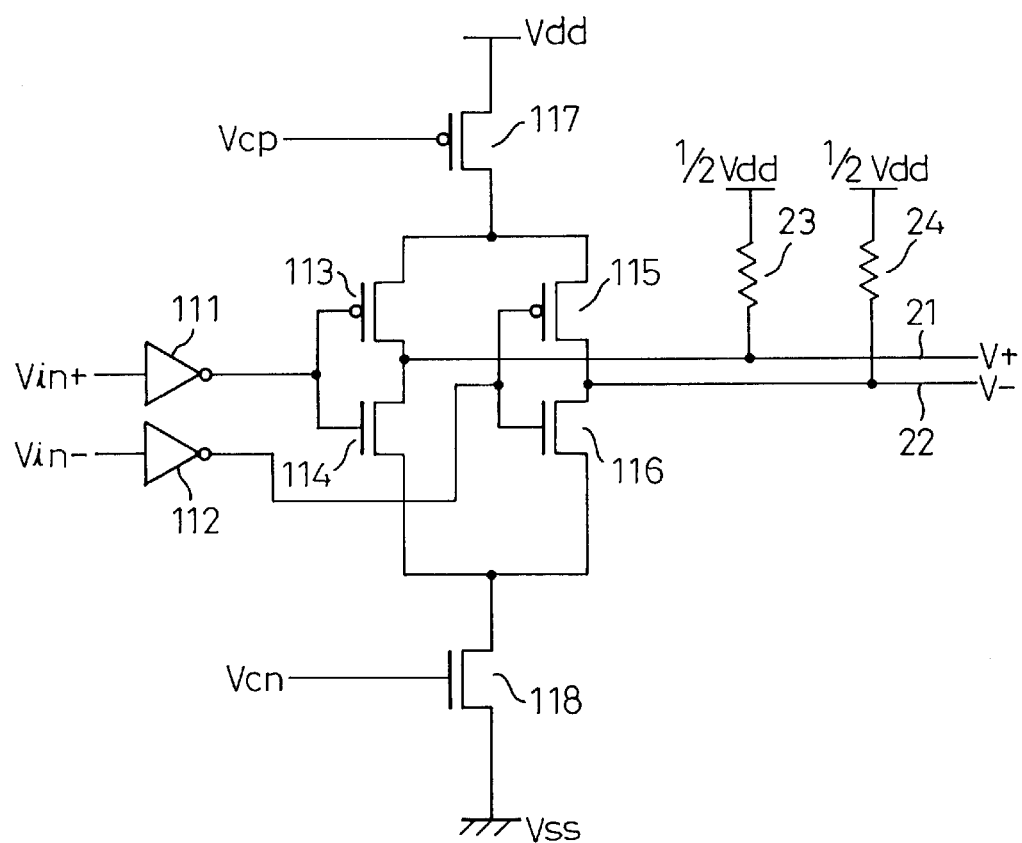
FIG. 57 is a circuit diagram showing a driver in a transceiver circuit as a third embodiment according to the fourth mode of the present invention.

FIG. 57 is a circuit diagram showing a driver 11 (31) in a transceiver circuit as a third embodiment according to the fourth mode of the present invention. The driver of the third embodiment shown in FIG. 57 differs from the driver previously shown in FIG. 55, in that a PMOS transistor 117 and an NMOS transistor 118 are provided between the final-stage inverters (113, 114 and 115, 116) and the high and low voltage supply lines' (Vdd and Vss), respectively, for constant current driving, and in that resistors (termination resistors: impedance providing means) 23 and 24 pulled to an intermediate voltage (½-Vdd) are provided on the driver outputs (signal lines) 21 and 22. Here, reference characters Vcp and Vcn indicate the bias voltages applied to the gates of the PMOS transistor 117 and NMOS transistor 118, respectively.

The driver of the third embodiment is constructed so that the output impedance of the driver remains constant independently of the output state (regardless of whether the output is a high level "H" or a low level "L", or regardless of whether it is in a low to high transition period or in a high to low transition period); more specifically, the final state is constructed from a constant-current driver (constant-current inverter) and its outputs are terminated with parallel termination resistors 23 and 24 to maintain the output impedance constant. Here, the resistance values of the resistors 23 and 24 are chosen to match the characteristic impedances of the signal lines 21 and 22.

In this way, according to the third embodiment, since the driver (11) at one end acts as a termination resistor for the signal transmitted from the driver (31) at the other end (opposite end), waveform disturbances due to signal reflections can be suppressed, and high-speed signal transmission can thus be achieved.

Figure 58:
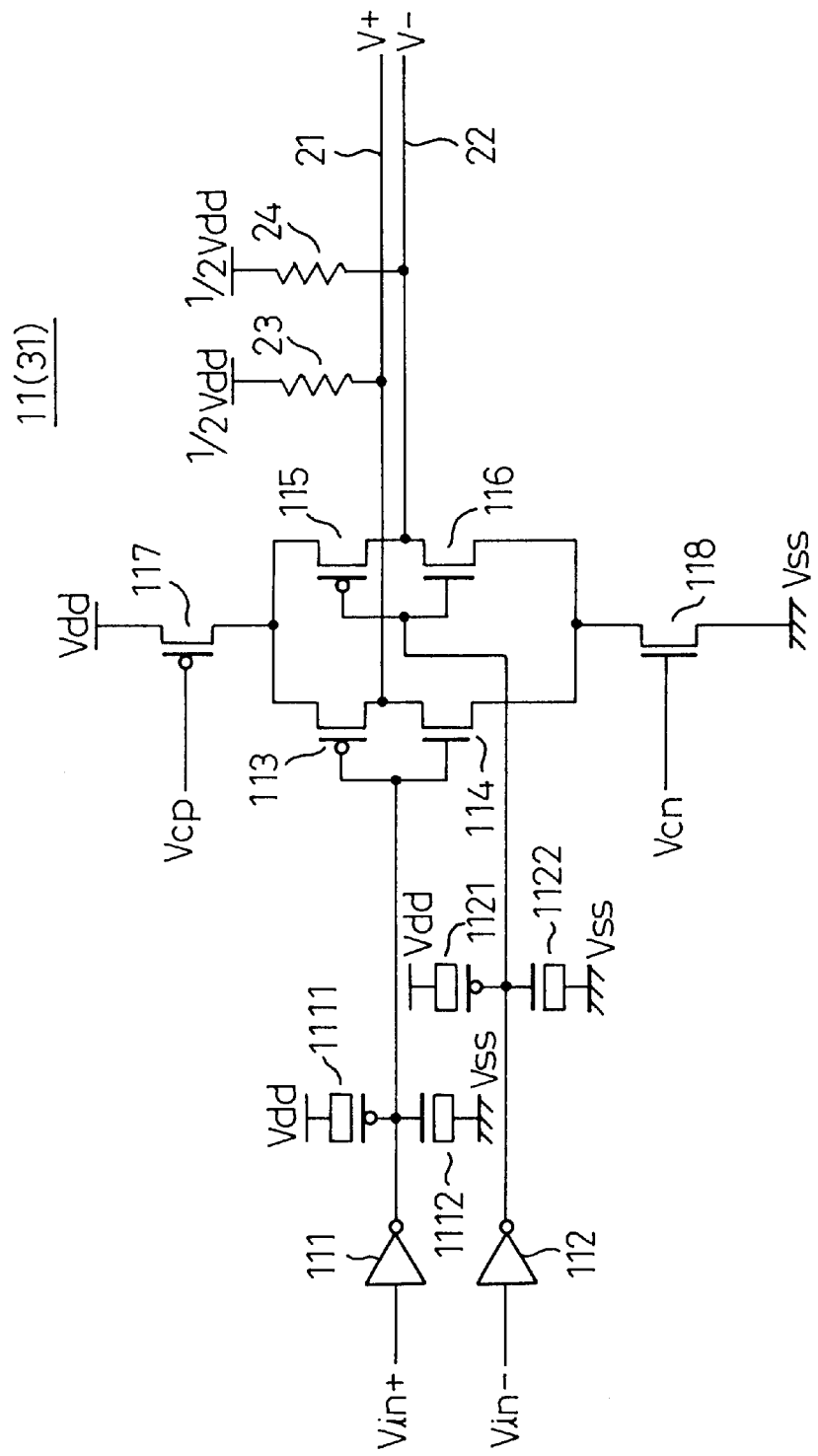
FIG. 58 is a circuit diagram showing a driver in a transceiver circuit as a fourth embodiment according to the fourth mode of the present invention.

FIG. 58 is a circuit diagram showing a driver 11 (31) in a transceiver circuit as a fourth embodiment according to the fourth mode of the present invention. The driver of the fourth embodiment shown in FIG. 58 differs from the driver of FIG. 57 described above in that capacitors 1111 and 1112 and capacitors 1121 and 1122 are provided at the inputs of the respective final-stage inverters to moderate the sharpness of the signal to be output from the driver and thereby make the rise time (transient time) substantially equal (equivalent) to the bit time T. Here, the capacitors 1111 and 1121 are MOS capacitors each consisting of a PMOS transistor and an NMOS transistor, and the capacitors 1112 and 1122 are MOS capacitors each consisting of two NMOS transistors. The transient time of the transmit signal output from the driver may instead be set at about 50% of the bit time T.

In this way, in the driver of the fourth embodiment, the rise time of the driver output is lengthened by providing the capacitors 1111 and 1112 between the input of the final-stage inverter (113, 114), which outputs positive logic, and the high and low voltage supply lines (Vdd and Vss), respectively, and the capacitors 1121 and 1122 between the input of the final-stage inverter (115, 116), which outputs negative logic, and the high and low voltage supply lines (Vdd and Vss), respectively.

The reason is that if the output signal of the driver rises sharply (the rise time of the driver output is short), the decision period of the received signal overlaps into the rise (or fall) period, introducing a substantial error when removing the driver-caused voltage in the compensation process. That is, if there is a: skew between the compensation voltage generated by the compensation voltage generating circuit (13) and the actual driver voltage, an error (an error voltage due to displacement in time) equivalent to [Skew]×[Rate of Voltage Change] occurs, and the error voltage increases during the period (the rise or fall period) over which the rate of change of the driver output is large. In contrast, according to the fourth embodiment, since the rise time of the driver output is increased, the rate of change of the driver-ca-used voltages decreases, correspondingly reducing the error voltage due to the skew and thus enabling correct signal decisions to be made by the receiver (12).

Figure 59:
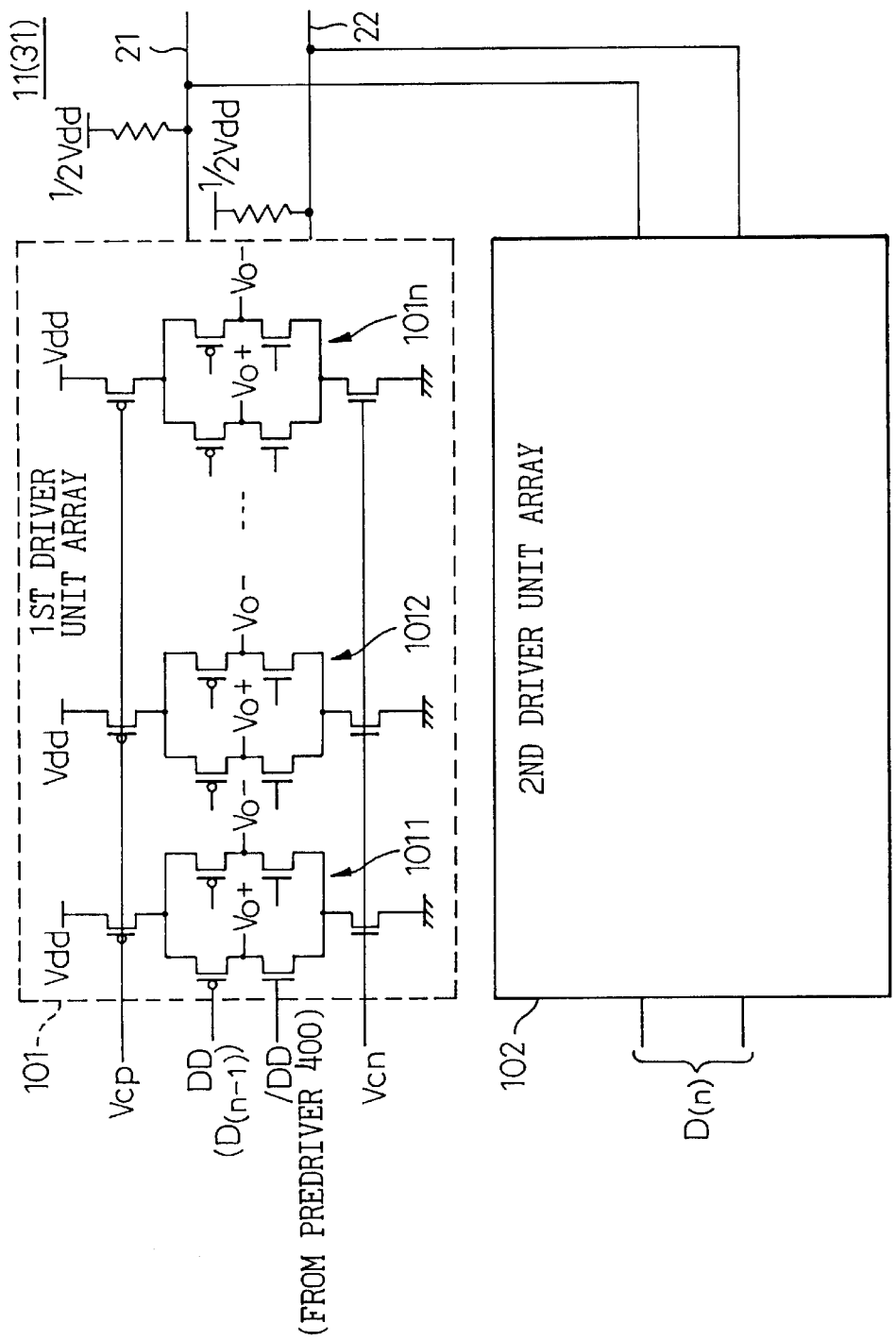
FIG. 59 is a circuit diagram showing a driver in a transceiver circuit as a fifth embodiment according to the fourth mode of the present invention.

FIG. 59 is a circuit diagram showing a driver 11 (31) in a transceiver circuit as a fifth embodiment: according to the fourth mode of the present invention. In FIG. 59, reference numeral 101 is a first driver unit array, and 102 is a second driver unit array. When capacitors are used to moderate the sharpness of the driver output, as in the foregoing fourth embodiment, the circuit configuration can be simplified, but it is difficult to correctly set capacitance values. In view of this, in the fifth embodiment, the driver output is suitably moderated (the transient characteristic is adjusted) using the driver unit arrays.

That is, as shown in FIG. 59, the driver of the fifth embodiment comprises the first driver unit array 101 consisting of a plurality of constant-current driver units 1011 to 101*n* connected in parallel and the second driver unit array 102 consisting of a plurality of constant-current driver units connected in parallel; in this configuration, the number of driver units to be operated in each driver unit array is adjusted as the time elapses so as to make the rise time (or fall time, i.e., transient time) substantially equal to the bit time T. The second driver unit array 102 is the same in configuration as the first driver unit array 101, and the respective outputs of each of the first and second driver unit arrays are connected to the respective signal lines 21 and 22.

The first driver unit array 101 is supplied, for example, with the (n−1)th data D (n−1), while the second driver unit array 102 is supplied, for example, with the n-th data D(n). More specifically, the driver 11 is constructed from the two driver unit arrays 101 and 102, and data, for example, one bit before is input to the first driver unit array 101 and the present bit data is supplied to the second driver unit array 102. In this case, the next bit data is supplied to the first driver unit array 101.

Figure 60:
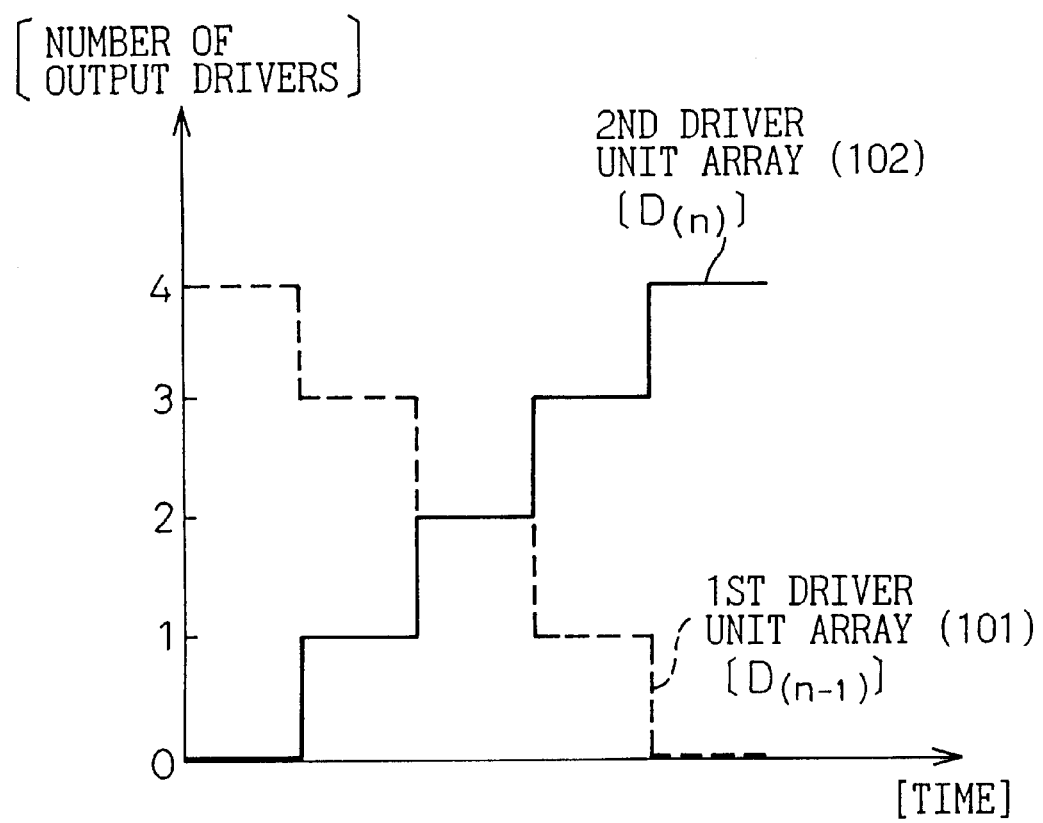
FIG. 60 is a diagram for explaining the operation of the driver shown in FIG. 59.

FIG. 60 is a diagram for explaining the operation of the driver shown in FIG. 59. In the graph of FIG. 60, the number of driver units outputting currents is plotted along the ordinate and the time along the abscissa. FIG. 60 assumes the case in which the driver unit arrays 101 and 102 each consist of four constant-current drivers, but it will be appreciated that the number of driver units constituting each array can be varied as desired.

As shown in FIG. 60, the number of active driver units in the first driver unit array 101 decreases incrementally from four to zero as the time elapses, while the number of active driver units in the second driver unit array 102 increases incrementally from zero to four as the time elapses; here, control is performed so that, between the first and second driver unit arrays, the total number of driver units outputting currents is four at any instant in time. Thus, the falling portion of the waveform of the data D(n−1) is made less steep by the first driver unit array 101, and the rising portion of the waveform of the data D(n) is made less steep by the second driver unit array 102.

Figure 61:
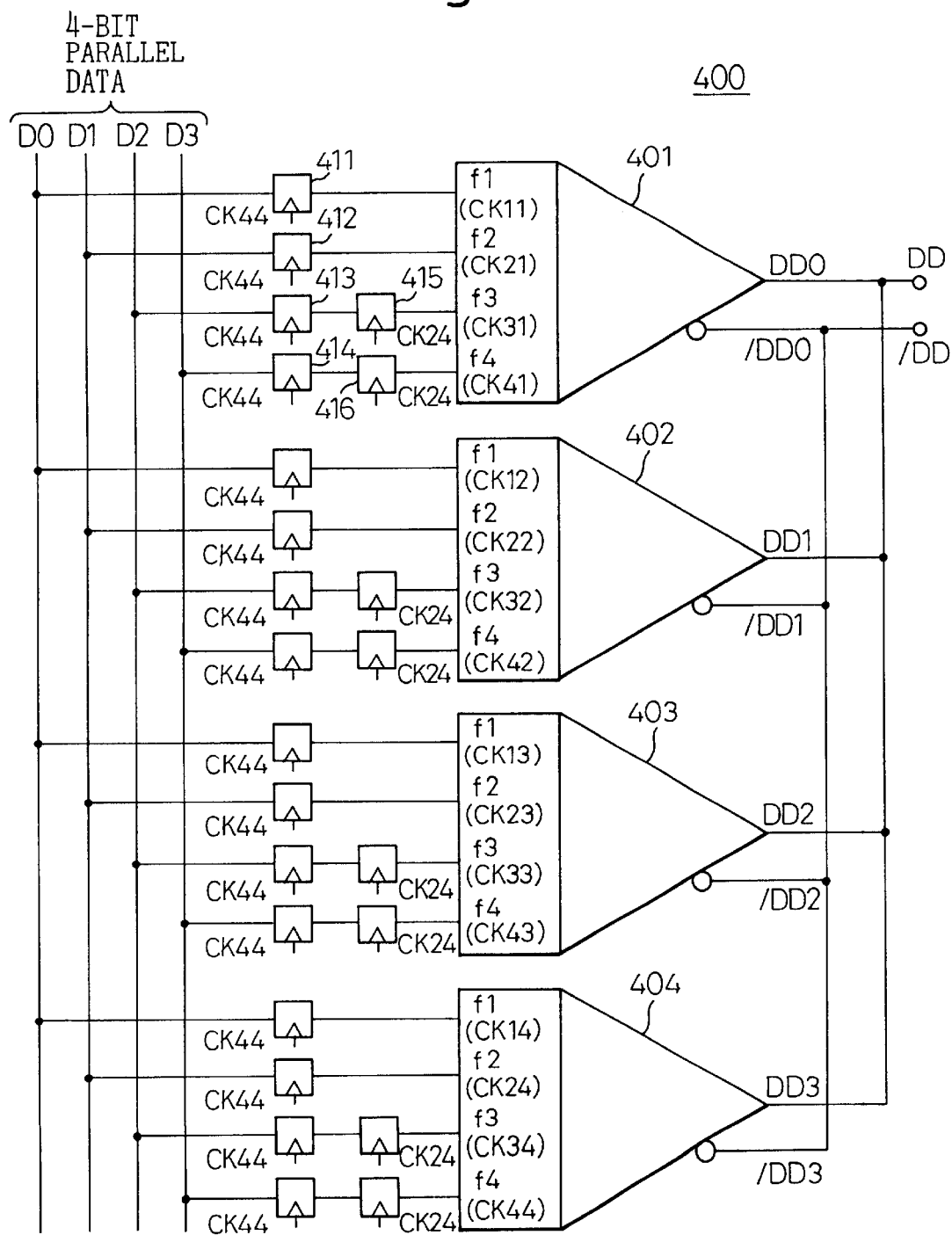
FIG. 61 is a block circuit diagram showing one example of a predriver for use with the driver shown in FIG. 59.
Figure 62:
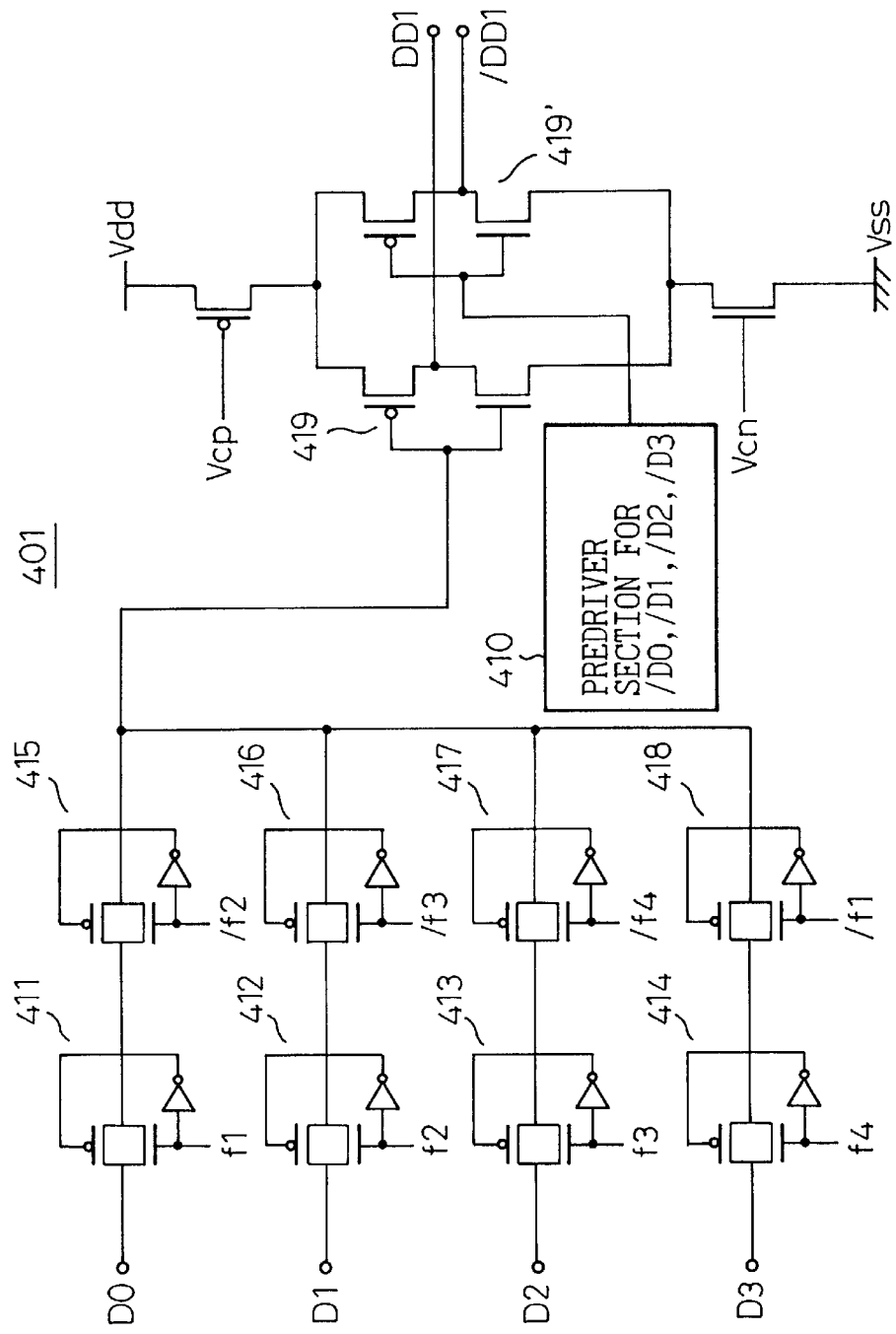
FIG. 62 is a circuit diagram showing one example of a multiplexer in the predriver shown in FIG. 61.

FIG. 61 is a block circuit diagram showing one example of a predriver for use with the driver shown in FIG. 59, and FIG. 62 is a circuit diagram showing one example of a multiplexer in the predriver shown in FIG. 61. FIGS 61 and 62 show an example of a predriver for processing parallel data of four bits (N=4); of the four-bit differential data (complementary signals) D0, /D0; D1, /D1; D2, /D2; and D3, /D3, circuitry responsible for the processing of the positive logic signals D0, D1, D2, and D3 is shown here.

As shown in FIG. 61, the predriver 400 comprises a plurality of latch circuits (411 to 416) for latching, for example, four-bit parallel data, D0, D1, D2, and D3, and multiplexers (401 to 404) each for capturing the outputs of the respective latch circuits with prescribed clocks and for outputting the captured data. More specifically, data D0 to D3 are supplied to the latch circuits 411 to 414 which latch the data, for example, by the rising edge of a clock CK44, and the outputs of the latch circuits 413 and 414 are latched into the latch circuits 415 and 416, respectively, by the rising edge of a clock CK24; then, the outputs of the latch circuits 411, 412, 415, and 416 are supplied to the multiplexer 401.

The multiplexer 401 comprises a plurality of transfer gates 411 to 418 whose switching operations are controlled by prescribed clocks, and the output (D0) of the latch circuit 411, for example, is supplied to an inverter (constant-current driving inverter) 419 via the transfer gate 411, which is controlled by a clock CK11 (f1), and the transfer gate 415, which is controlled by a clock /CK21 (/f2). Likewise, the output (D1) of the latch circuit 412 is supplied to the inverter 419 via the transfer gate 412, which is controlled by a clock CK21 (f2), and the transfer gate 416, which is controlled by a clock /CK31 (/f3).

In each of the multiplexers 401 and 404, the different transfer gates 411 to 418 are controlled by different clocks. Further, in FIG. 62, the outputs of a predriver section 410 which processes the negative logic data /D0 to /D3, and which has the same configuration as that for processing the positive logic data D0 to D3, are supplied to an inverter 419', and complementary (differential) signals DD1 and /DD1 are output from the inverters 419 and 419', respectively. The output signals of the multiplexers 401 to 404, DD0, /DD0; DD1, /DD1; DD2, /DD2; and DD3, /DD3, are combined into the outputs DD and /DD (D(n−1)) which are supplied to each driver unit (1011 to 10*n*).

Figure 63A:
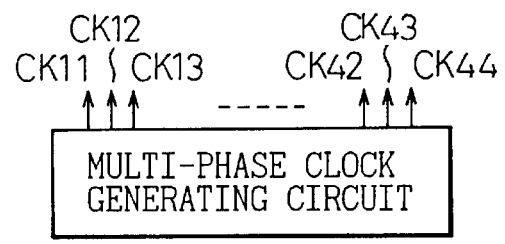
Figure 63B:
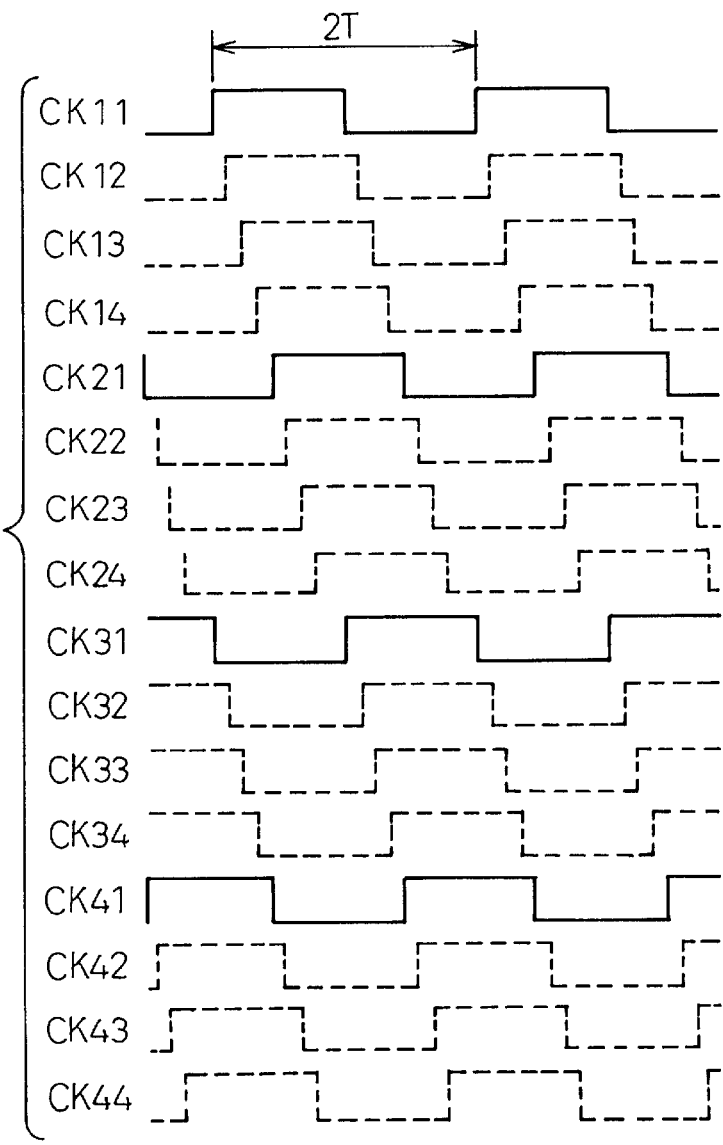

FIGS. 63A and 63B are diagrams for explaining multi-phase clocks applied to the predriver shown in FIG. 61. FIG. 63A is a block diagram of a multi-phase clock generating circuit for supplying multi-phase clocks (4*n*-phase clocks: CK11 to CK14; CK21 to CK24 CK31 to CK34; and CK41 to CK44) to the predriver 400, and FIG. 63B is a diagram showing timing waveforms of the multi-phase clocks (4*n*-phase clocks).

In this way, in the fifth embodiment, the plurality of driver units 1011, 1012, . . . , 101*n* in each driver unit array (101) are driven by the predriver controlled, for example, by multi-phase clocks CK1, /CK1, CK2, /CK2, ckn, /kcn, and the current in the driver stage is sequentially switched. Here, the predriver 400 (each of the driver units 1011 to 101*n*) is controlled by 4*n*-phase clocks, CK11 to CKI4; CK21 to CK24; CK31 to CK34; and CK41 to CK44, whose clock cycle is set, for example, at twice the bit time T, and the current in the driver stage is sequentially switched.

Figure 64:
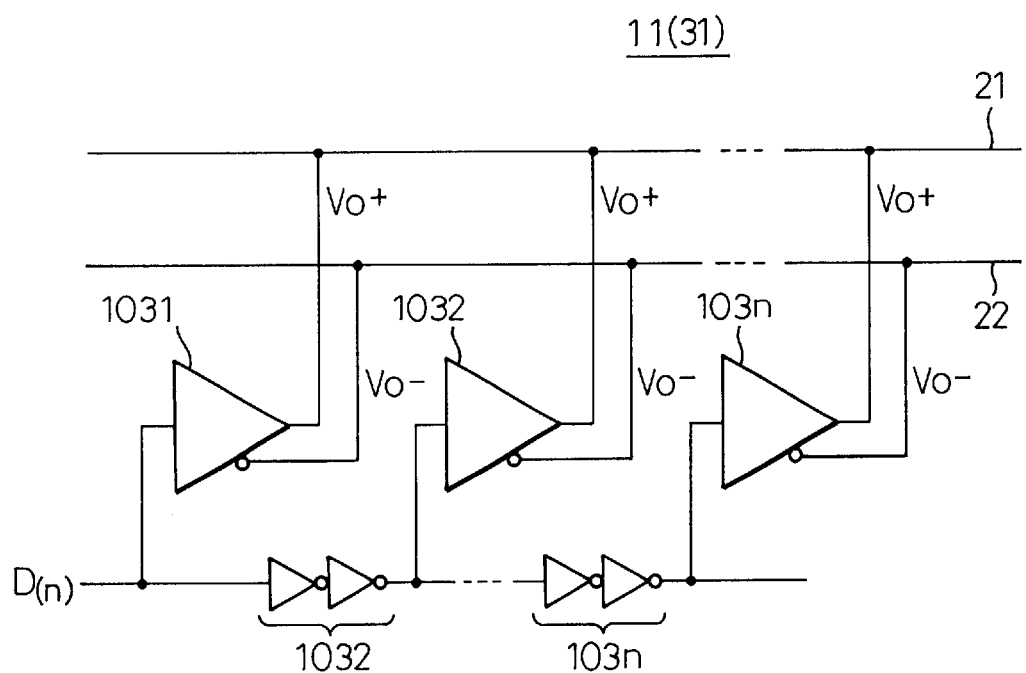
FIG. 64 is a circuit diagram showing a driver in a transceiver circuit as a sixth embodiment according to the fourth mode of the present invention.

FIG. 64 is a circuit diagram showing a driver 11 (31) in a transceiver circuit as a sixth embodiment according to the fourth mode of the present invention. In FIG. 64, reference numerals 1031 to 103*n* are constant-current driver units, and 1032 to 103*n* are delay stages. It should be noted here that in FIG. 64, data D(n) is shown as the so-called single-ended signal, not as a complementary signal.

As shown in FIG. 64, in the sixth embodiment, the rise (or fall) time of the driver output is increased by sequentially delaying the data D(n) through the delay stages 1032, . . . , 103*n*, implemented by chains of inverters connected directly and in series, and by supplying the thus delayed data to the plurality of constant-current driver units 1031, 1032, . . . , 103*n*.

According to the fifth and sixth embodiments, compared with the fifth embodiment which defines the rise (fall) time using capacitors, the rise (fall) time can be controlled with higher accuracy and, since large capacitance is not needed, the area occupied by the circuit can be reduced.

Figure 65:
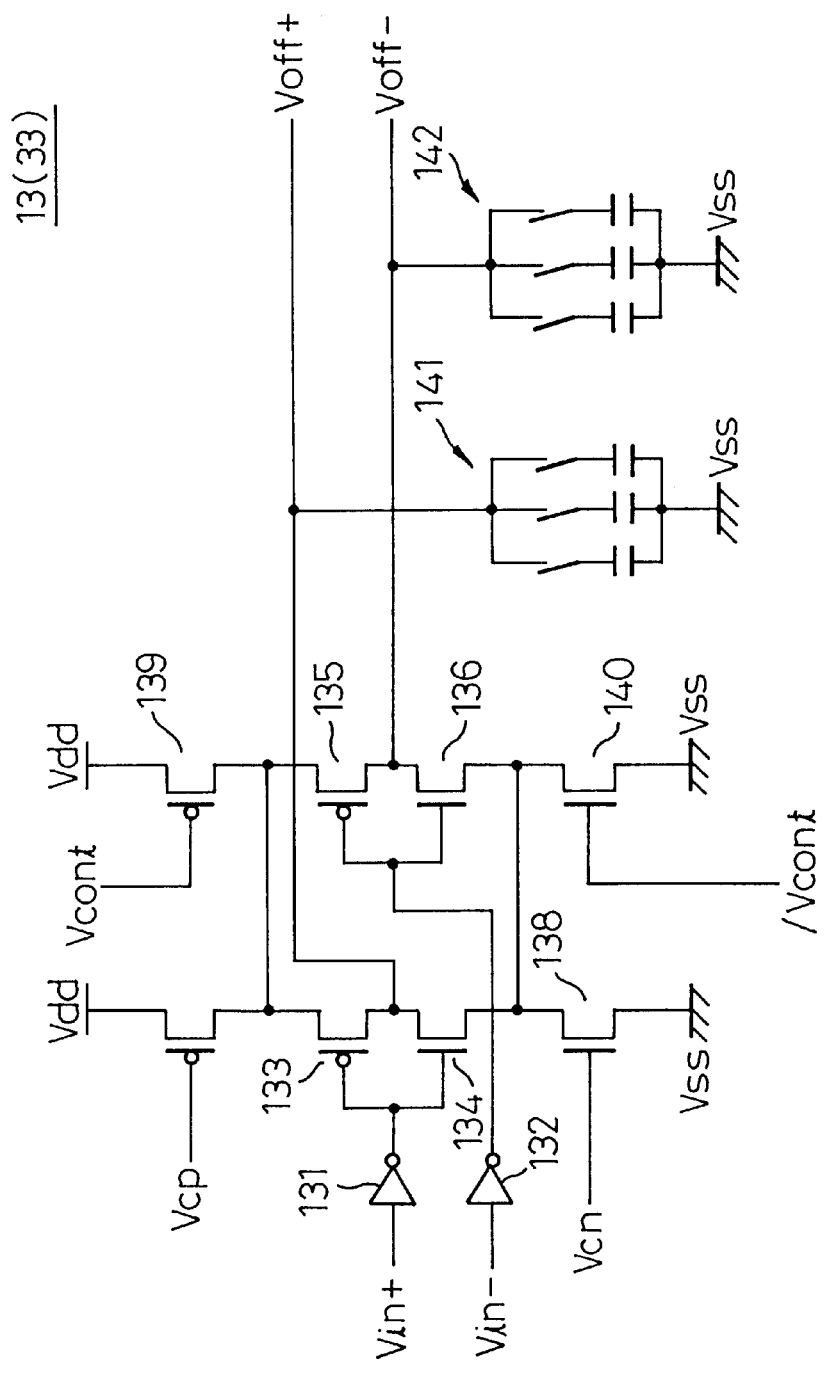
FIG. 65 is a circuit diagram showing a compensation voltage generating circuit in a transceiver circuit as a seventh embodiment according to the fourth mode of the present invention.

FIG. 65 is a circuit diagram showing a compensation voltage generating circuit 13 (33) in a transceiver circuit as a seventh embodiment according to the fourth mode of the present invention.

AS shown in FIG. 65, the compensation voltage generating circuit 13 is configured basically as a replica driver similar to the constant-current driver 11 shown in FIG. 57. The compensation voltage generating circuit 13 of the seventh embodiment is constructed not only to output the signals (compensation voltage) Voff+ and Voff− corresponding to those of the driver (main driver) 11, but also to be able to increase or decrease the output signals by means of a PMOS transistor 139 and an NMOS transistor 140 using control signals Vcont and /Vcont. Further, in the seventh embodiment, capacitor switch sections 141 and 142, each consisting of a plurality of capacitors and switches, are provided at the respective outputs of the compensation voltage generating circuit so that the rise time of the output (compensation voltage Voff+, Voff−) can be adjusted by switching the capacitors. Here, provisions may be made to automatically perform the capacitor switching in the; capacitor switch sections 141 and 142, for example, during power-on initialization.

The replica driver (compensation voltage generating circuit) 13 can be constructed using smaller transistors than those used in the main driver 11, for example, to reduce power consumption, but in that case, because of differences in drive capability, output load capacitance, etc., an error (displacement) is caused in the compensation voltage (offset voltage Voff+, Voff−) generated to compensate for the interference voltage associated with the output of the driver 11. To address this, the compensation voltage generating circuit of the seventh embodiment adjusts the rise time of the compensation voltage using the capacitor switch sections 141 and 142, thereby enhancing the accuracy of the compensation voltage and increasing the signal reception sensitivity of the receiver 12 (32).

Figure 66:
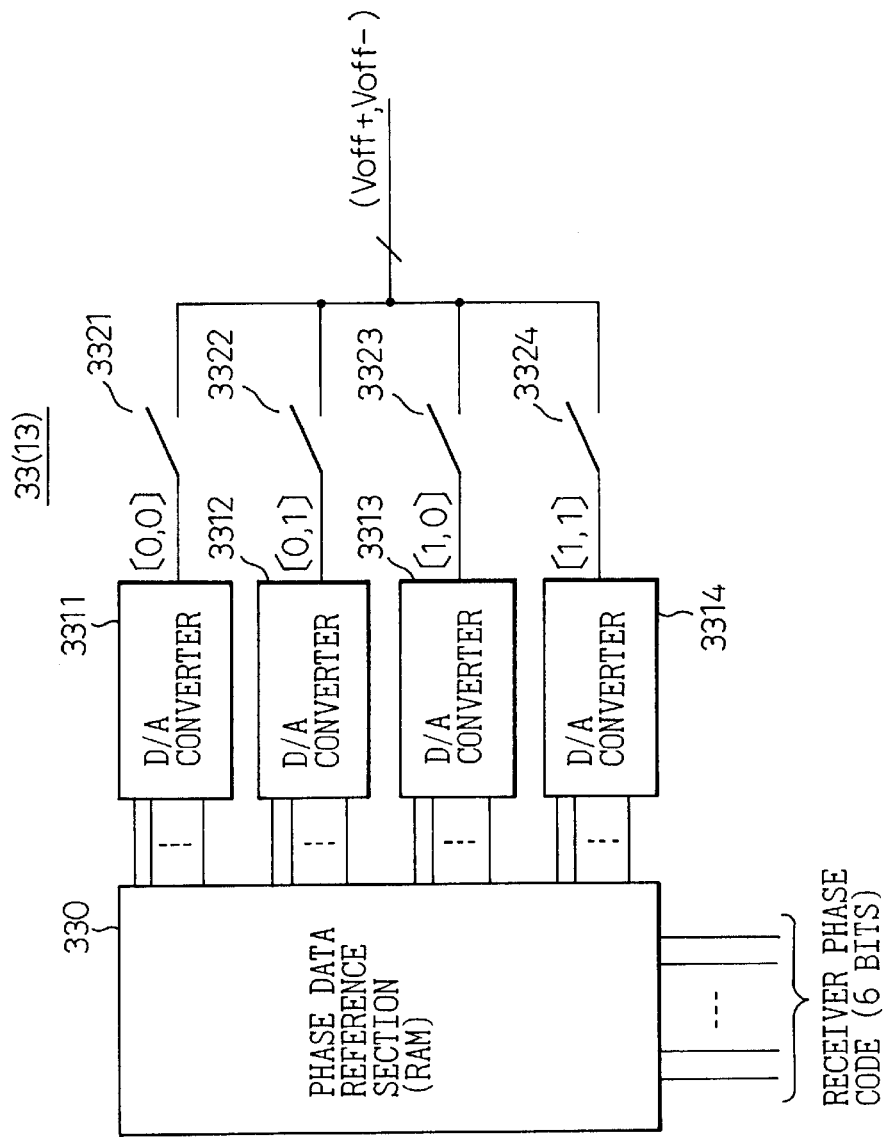
FIG. 66 is a block circuit diagram schematically showing a compensation voltage generating circuit in a transceiver circuit as an eighth embodiment according to the fourth mode of the present invention.

FIG. 66 is a block circuit diagram schematically showing a compensation voltage generating circuit 33 (13) in a transceiver circuit as an eighth embodiment according to the fourth mode of the present invention. In FIG. 66, reference numeral 330 is a phase data reference section, 3311 to 3314 are D/A converters (compensation voltage generators), and 3321 to 3324 are switches. For convenience the compensation voltage generating circuit 33 at the other end is depicted in FIG. 66 (and in FIGS. 67 and 68), but it will be recognized that the compensation voltage generating circuit 13 at the one end is the same as the one shown here.

As shown in FIG. 66, the compensation voltage generating circuit of the eighth embodiment includes, for example, four compensation voltage generators (D/A converters) 3311 to 3314. When the output sequence of two bits is [0, 0] (that is, when the present output data of the driver 11 is at a low level "L", and the immediately preceding output data is also at a low level "L"), the first compensation voltage generator 3311 is selected by the switch 3321; when the output sequence of two bits is [0, 1] (that is, when the present output data of the driver 11 is at a low level "L", and the immediately preceding output data is at a high level, "H"), the second compensation voltage generator 3312 is selected by the switch 3322; when the output sequence of two bits is [1, 0] (that is, when the present output data of the driver 11 is at a high level "H", and the immediately preceding output data is at a low level "L"), the third compensation voltage generator 3313 is selected by the switch 3323; and when the output sequence of two bits is [1, 1] (that is, when the present output data of the driver 11 is at a high level "H", and the immediately preceding output data is also at a high level "H"), the fourth compensation voltage generator 3314 is selected by the switch 3324.

The phase data reference section 330, which is constructed, for example, from a RAM (Random Access Memory), receives a receiver phase code (for example, a 6-bit signal) indicating the signal decision timing (the phase of the receive clock) of the receiver 32, and supplies data corresponding to the receiver phase code to the compensation voltage generators (D/A converters) 3311 to 3314 for driving. The reason that a RAM is used for the phase data reference section 330 is that data corresponding to each receiver phase code is written, for example, at power-on initialization, for use in operation.

Generally, the difference between the transmit clock and the receive clock is no larger than the frequency deviation of the crystal oscillator, and the phase difference between the two clocks varies slowly from cycle to cycle. This means that the four compensation voltage generators 3311 to 3314 need only operate at a low frequency. Then, depending on the value of the 2-bit transmit data ([0, 0], [0, 1], [1, 0], or [1, 1]) following the present data, the corresponding one of the four compensation voltage generators 3311 to 3314 is selected, and thus the necessary compensation voltage (offset voltage) Voff+, Voff− is obtained. The compensation voltage is supplied to the receiver 32 and used to eliminate the interference voltage associated with the output of the driver 11; as a result, the receiver 32 can correctly discriminate the signal transmitted from the driver 11 at the opposite end. Here, the number of bits in the driver output sequence is set to 2 based on the premise that it is sufficient to consider the output level of the present bit in relation to the output level of the immediately preceding bit, but the number of bits in the driver output sequence may be increased, for example, to 3 or more, though in that case, the number of compensation voltage generators, etc. has to be increased.

In this way, according to the eighth embodiment, the compensation voltage can be generated with higher accuracy without the need for a high speed operating replica driver.

Figure 67:
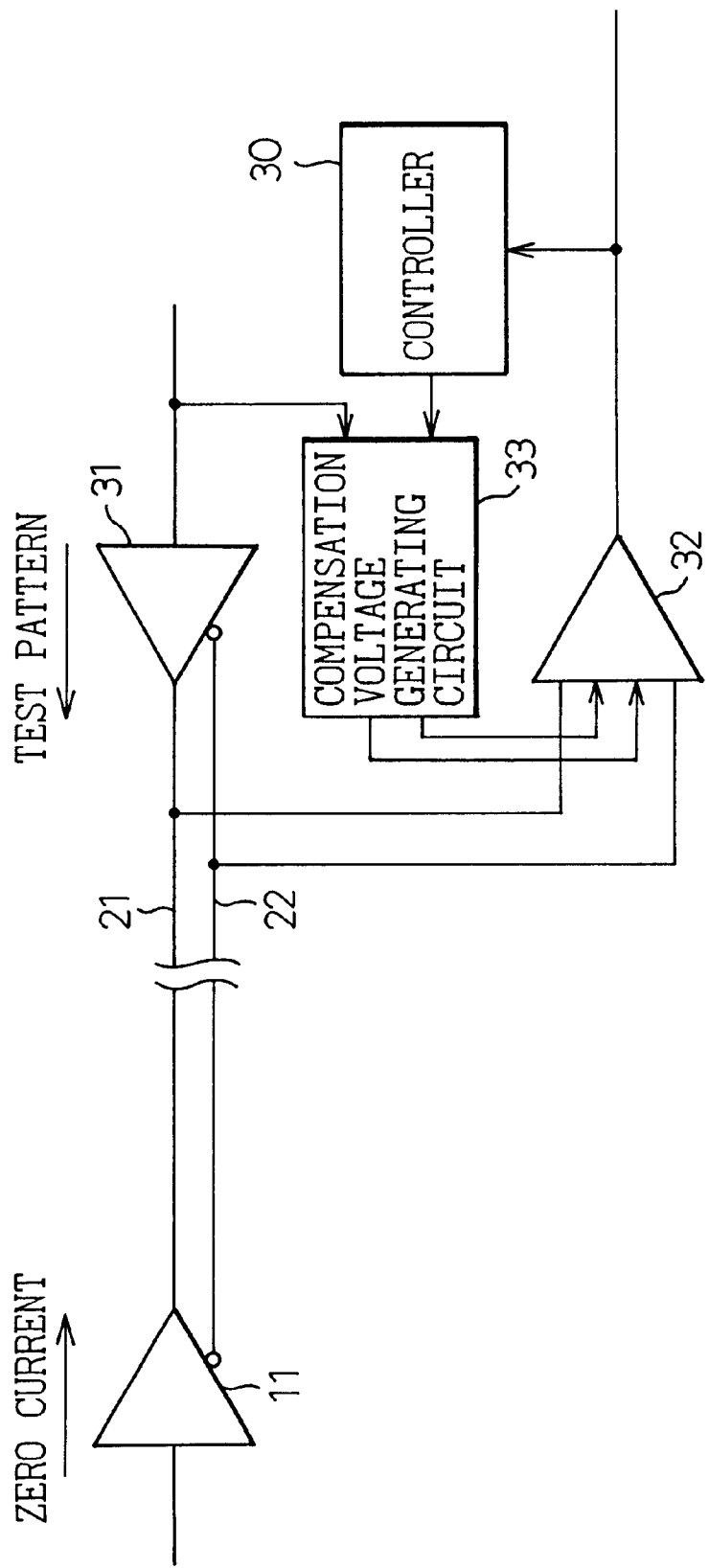
FIG. 67 is a block circuit diagram showing a compensation voltage generating circuit in a transceiver circuit as a ninth embodiment according to the fourth mode of the present invention.

FIG. 67 is a block circuit diagram showing a compensation voltage generating circuit in a transceiver circuit as a ninth embodiment according to the fourth mode of the present invention, illustrating the processing corresponding to the write operation to the phase data reference section (RAM) 330 during initialization in the foregoing eighth embodiment.

In the ninth embodiment shown in FIG. 67, prior to actual signal reception, for example, during power-on initialization, the output of the driver 11 at one end is set to zero level (the output current is zero), and a test pattern is transmitted from the driver 31 at the other end. Then, the compensation voltage (offset voltage) is increased or decreased with respect to the phase of a particular receive clock, to determine the compensation voltage for the boundary across which the decision in the receiver 32 changes from a 0 and a 1 or from a 1 to a 0, and the resulting value is written to the RAM in the compensation voltage generating circuit 33. This initialization is performed for each transceiver circuit, with the chip mounted on board, and the writing of the compensation voltage necessary for each transceiver circuit is thus accomplished.

Here, the temporal resolution is, for example, one bit time divided by 64 and the compensation voltage resolution is defined for example, by 6-bit data. Then, these data are obtained for every two successive bits, that is, for each of the 2-bit output sequences [0, 0], [0, 1], [1, 0], and [1, 1], and are written to the RAM (130). The temporal and compensation voltage resolutions can be varied as needed, and further, the number of bits in the driver output sequence may be set to 3 or more, instead of 2.

In this way, according to the ninth embodiment, accurate offset compensation (generation of the compensation voltages) incorporating all factors such as fluctuations of the drive capability of the driver, load values, etc. can be accomplished, and higher-sensitivity signal reception becomes possible.

Figure 68:
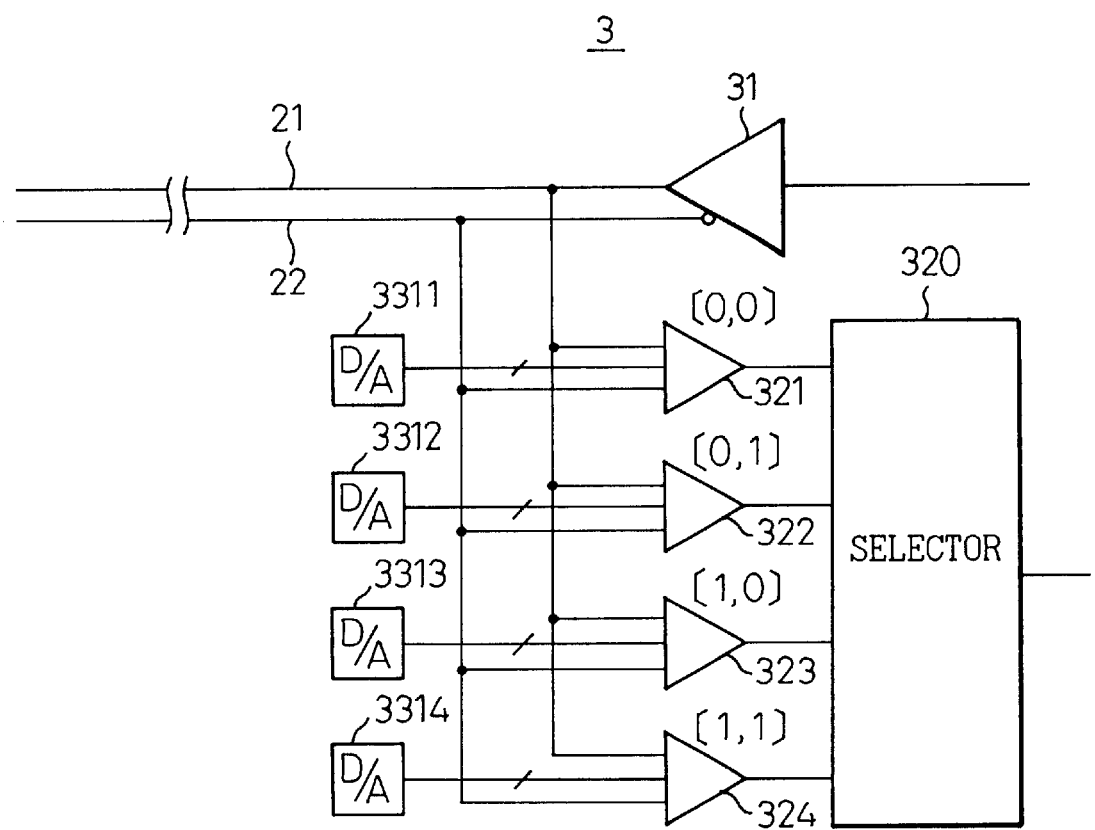
FIG. 68 is a block circuit diagram schematically showing a transceiver circuit as a 10th embodiment according to the fourth mode of the present invention.

FIG. 68 is a block circuit diagram schematically showing a transceiver circuit 3 as a 10th embodiment according to the fourth embodiment of the present invention.

In the 10th embodiment, the outputs of the compensation voltage generators (D/A converters) 3311 to 3314 in the eighth embodiment shown in FIG. 66 are directly coupled to four drivers 321 to 324, respectively, without the intervention of the switches 3321 to 3324, etc. and the output of one of the drivers 321 to 324 is selected according to the 2-bit output sequence (data sequence). That is, the output of the compensation voltage generator 3311 for the data sequence [0, 0] is directly fed into the driver 321; likewise, the outputs of the compensation voltage generators 3312, 3313, and 3314 for the data sequences [0, 1], [1, 0], and [1, 1], respectively, are fed into the drivers 322, 323, and 324 for the data sequences [0, 1], [1, 0], and [1, 1], respectively, and the output of the driver corresponding to the data sequence actually output by the driver 31 is selected by a selector 320 for output. Here, the four drivers 321 to 324 receive the compensation voltages from the corresponding compensation voltage generators 3311 to 3314, and simultaneously perform decision operations on the signal received from the driver 11 at the opposite end. The number of bits in the data sequence (driver output sequence) may be set to 3 or more, instead of. 2, to increase the accuracy of processing, though in that case, the number of compensation voltage generators and drivers has to be increased.

In this way, according to the 10th embodiment, since the compensation voltage (offset voltage) supplied to each driver changes with a low-frequency, errors due to parasitic capacitance, etc. hardly occur, and higher accuracy signal reception (signal decision) can be achieved.

Figure 69:
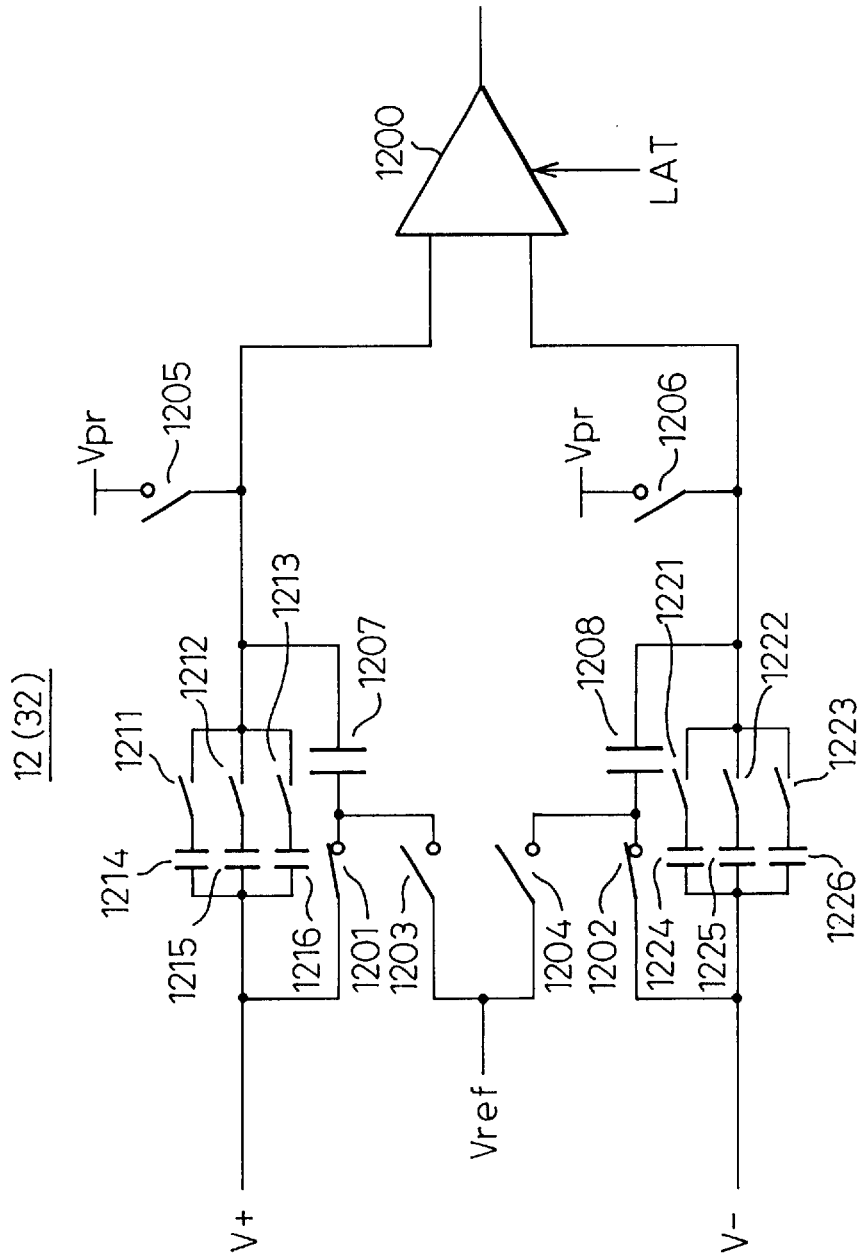
FIG. 69 is a circuit diagram showing a receiver in a transceiver circuit as an 11th embodiment according to the fourth mode of the present invention.

FIG. 69 is a circuit diagram showing a receiver in a transceiver circuit as an 11th embodiment according to the fourth mode of the present invention.

As shown in FIG. 69, the 11th embodiment uses PRD (Partial Response Detection) for the receiver, and signal decisions are made by estimating intersymbol interference using a capacitor network and a decision circuit (latch 1200). Here, the driver shown in FIG. 56 can be used for the decision circuit 1200. The latch signal LAT is a signal for controlling the operation of the driver of FIG. 56; for example, PMOS transistors may be inserted between the high voltage supply line (Vdd) and the transistors 121 and 122, respectively, and the latch signal LAT may be applied to the gates of the PMOS transistors.

The capacitor network comprises switches 1201 to 1206, 1211 to 1213, and 1221 to 1223, and capacitors 1207, 1208, 1214 to 1216, and 1224 to 1226. Compared with the conventional PRD circuit, this capacitor network additionally includes a parameter adjusting circuit consisting of the switches 1211 to 1213 and 1221 to 1223 and the capacitors 1214 to 1216 and 1224 to 1226, and adjusts the equalization parameters by controlling the connection of the capacitors 1214 to 1216 and 1224 to 1226 using the switches 1211 to 1213 and 1221 to 1223.

In the receiver of the 11th embodiment, to determine the equalization parameters, a test pattern is sent out from the driver 31 at the opposite end, and the compensation voltage Voff+, Voff− for the receiver 12 (the compensation voltage for the latch 1200) is increased or decreased thereby seeking the point at which the output of the decision circuit changes from a low level "L" to a high level WHO. At this time, the output current of the driver 11 at the same end is held to zero. In this way, the value of intersymbol interference to be compensated for is obtained, and optimum equalization parameters are determined by the control processor (that is, the on/off states of the switches 1211 to 1213 and 1221 to 1223 are controlled). The switches 1211 to 1213 and 1221 to 1223 and the capacitors 1214 to 1216 and 1224 to 1226 are shown as being provided three for each input of the decision circuit 1200 but this number may be changed as desired, and the value of each individual capacitor may also be changed.

In this way, according to the 11th embodiment, since intersymbol interference due to high-frequency losses on the signal line (signal transmission line) can also be compensated for, higher-speed signal transmission can be achieved.

Figure 70:
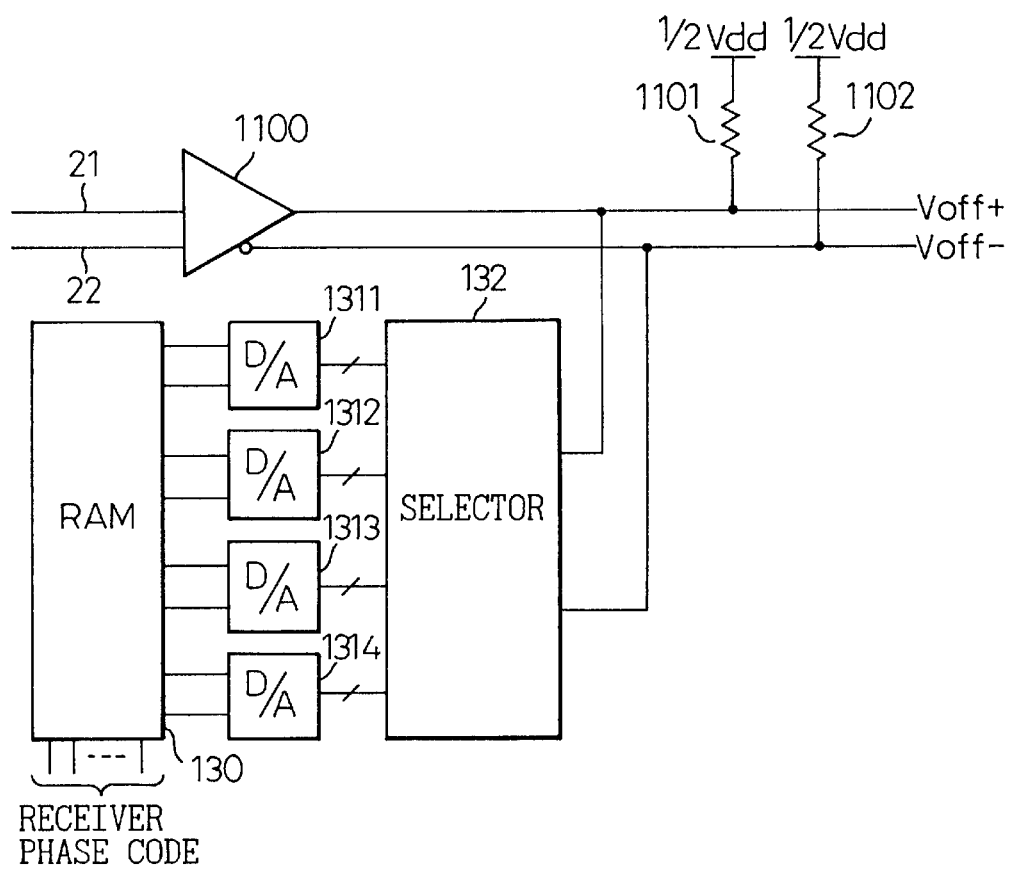
FIG. 70 is a circuit diagram showing a compensation voltage generating circuit in a transceiver circuit as a 12th embodiment according to the fourth mode of the present invention.

FIG. 70 is a circuit diagram showing a compensation voltage generating circuit 13 (33) in a transceiver circuit as a 12th embodiment according to the fourth mode of the present invention.

As shown in FIG. 70, the compensation voltage, generating circuit of the 12th embodiment is equivalent, for example, to a combination of the driver of the third embodiment shown in FIG. 57 and the compensation voltage generating circuit of the eighth embodiment shown in FIG. 66. More specifically, the replica driver 1100 in the 12th embodiment corresponds to the driver shown in FIG. 57. In the 12th embodiment, the replica driver 1100 is, for example, of one-eighth the size (transistor size) of the driver of FIG. 57, and termination resistors 1101 and 1102 are chosen to have a resistance value, for example, eight times that of the termination resistors 23 and 24 in FIG. 57.

Further, the RAM (phase data reference section) 130, D/A converters (compensation voltage generators) 1311 to 1314, and selector 132 in the 12th embodiment correspond to the phase data reference section 330., compensation voltage generators 3311 to 3314, and switches 3321 to 3324, respectively.

In the 12th embodiment, by using the RAM 130 which outputs a digital signal in accordance with the receiver phase code, the D/A converters 1311 to 1314 each of which converts the signal supplied from the RAM 130 and outputs a correction signal (a voltage for correcting the compensation voltage), and the selector 132 which selects the output of one of the D/A converters 1311 to 1314, further corrections are applied to the compensation voltage (Voff+, Voff−) to further increase the accuracy of the compensation voltage at the decision timing of the receiver. In the circuit shown in FIG. 70, the D/A converters 1311 to 1314 each generate a correction signal (correction voltage), for example, in accordance with the 2-bit output sequence, 00, 01, 10, or 11, following the present bit, and the signal is selected by the selector 132 for application to the compensation voltage. In the 12th embodiment, since compensation with a certain degree of accuracy is accomplished by the replica driver 1100, the correction circuit (RAM 130, D/A converters 1311 to 1314, etc.) can be constructed with simple circuitry of two or so bits. In this way, according to the 12th embodiment, with the addition of simple circuitry the accuracy of the compensation performed by the replica driver is further increased, achieving higher-sensitivity signal reception.

Thus, according to the embodiments of the fourth mode of the present invention, since bidirectional transmission capable of effectively utilizing the bandwidth of the transmission line becomes possible, and since the phase relationship between the transmitted signal and the received signal is allowed to vary as the time elapses, the length of the transmission line can be extended.

As described in detail above, according to the fourth mode of the present invention, a signal transmission system, a signal transmission method, and a transceiver circuit can be provided that can achieve more efficient utilization of the signal transmission line and accurately perform high-speed signal transmission using fewer signal lines, and that can extend maximum signal line length.

Many different embodiments of the present invention may be constructed without departing from the spirit and scope of the present invention, and it should be understood that the present invention is not limited to the specific embodiments described in this specification, except as defined in the appended claims.

What is claimed is:

1. A receiver comprising:
   an offset application circuit for applying an offset to an input signal;
   a decision circuit for comparing said offset-applied input signal with a reference voltage, wherein the level of said input signal is determined based on said known offset and on a result output from said decision circuit; and
   a timing control circuit for controlling decision timing in said decision circuit by shifting said decision timing relative to said input signal.

2. The receiver as claimed in claim 1, wherein said offset application circuit includes an offset level control circuit for controlling the level of said offset by a digital signal.

3. The receiver as claimed in claim 2, further comprising:
   an input signal level detection circuit for detecting the level of said input signal by increasing or decreasing the level of said offset using said offset level control circuit, and by finding an offset level where the result output from said decision circuit changes.

4. The receiver as claimed in claim 1, wherein said offset application circuit varies the level of said offset by passing a constant current into an internal node in said receiver.

5. The receiver as claimed in claim 1, wherein said offset application circuit varies the level of said offset by passing a constant current into an internal node in said receiver.

6. The receiver as claimed in claim 1, wherein received signal quality of said input signal is diagnosed, or a characteristic of said receiver or driver is adjusted, by using the waveform of said input signal obtained from said known offset and the result output from said decision circuit.

7. A receiver comprising:
   an offset application circuit for applying an offset to an input signal;
   a decision circuit for comparing said offset-applied input signal with a reference voltage, wherein the level of said input signal is determined based on said known offset and on a result output from said decision circuit wherein said offset application circuit includes an offset level control circuit for controlling the level of said offset by a digital signal;
   an input signal level detection circuit for detecting the level of said input signal by increasing or decreasing the level of said offset using said offset level control circuit, and by finding an offset level where the result output from said decision circuit changes; and
   a timing control circuit for controlling decision timing in said decision circuit in such a manner as to vary said decision timing relative to an internal clock in said receiver, and wherein the level of said offset is adjusted by judging an externally supplied, predetermined test pattern at output timing of said timing control circuit, and information concerning said input signal is acquired using said input signal level detection circuit.

8. A receiver comprising:
   an offset application circuit for applying an offset to an input signal;
   a decision circuit for comparing said offset-applied input signal with a reference voltage, wherein the level of said input signal is determined based on said known offset and on a result output from said decision circuit, wherein said offset voltage application circuit passes a constant current to a termination resistor provided in parallel to an input terminal of said receiver.

9. A receiver comprising:
   an offset application circuit for applying an offset to an input signal;
   a decision circuit for comparing said offset-applied input signal with a reference voltage, wherein the level of said input signal is determined based on said known offset and on a result output from said decision circuit, wherein said offset voltage application circuit includes a plurality of capacitors and switches, and varies the level of said offset by varying a precharge voltage of each of said capacitors.

10. A transceiver circuit having a receiver for receiving a signal input thereto, and a driver for outputting a signal, wherein said receiver comprises:
    an offset application circuit for applying an offset to said input signal;
    a decision circuit for comparing said offset-applied input signal with a reference voltage, wherein the level of said input signal is determined based on said offset and on a result output from said decision circuit; and
    a timing control circuit for controlling decision timing in said decision circuit by shifting said decision timing relative to said input signal.

11. The transceiver circuit as claimed in claim 10, wherein said offset application circuit includes an offset level control circuit for controlling the level of said offset by a digital signal.

12. The transceiver circuit as claimed in claim 11, wherein said receiver further comprises:
    an input signal level detection circuit for detecting the level of said input signal by increasing or decreasing the level of said offset using said offset level control circuit, and by finding an offset level where the result output from said decision circuit changes.

13. The transceiver circuit as claimed in claim 10, wherein said offset application circuit varies the level of said offset by passing a constant current into an internal node in said receiver.

14. The transceiver circuit as claimed in claim 10, wherein said offset application circuit varies the level of said offset by passing a constant current into an internal node in said receiver.

15. The transceiver circuit as claimed in claim 10, wherein received signal quality of said input signal is diagnosed, or a characteristic of said receiver or driver is adjusted, by using the waveform of said input signal obtained from said known offset and the result output from said decision circuit.

16. A transceiver circuit having a receiver for receiving a signal input thereto, and a driver for outputting a signal, wherein said receiver comprises:

an offset application circuit for applying an offset to said input signal, wherein said offset application circuit includes an offset level control circuit for controlling the level of said offset by a digital signal;

a decision circuit for comparing said offset-applied input signal with a reference voltage, wherein the level of said input signal is determined based on said known offset and on a result output from said decision circuit;

an input signal level detection circuit for detecting the level of said input signal by increasing or decreasing the level of said offset using said offset level control circuit, and by finding an offset level where the result output from said decision circuit changes; and a timing control circuit for controlling decision timing in said decision circuit in such a manner as to vary said decision timing relative to an internal clock in said receiver, wherein the level of said offset is adjusted by judging an externally supplied, predetermined test pattern at an output timing of said timing control circuit, and information concerning said input signal is acquired using said input signal level detection circuit.

17. A transceiver circuit having a receiver for receiving a signal input thereto, and a driver for outputting a signal, wherein said receiver comprises:

an offset application circuit for applying an offset to said input signal; and a decision circuit for comparing said offset-applied input signal with a reference voltage, wherein the level of said input signal is determined based on said known offset and on a result output from said decision circuit, wherein said offset voltage application circuit passes a constant current to a termination resistor provided in parallel to an input terminal of said receiver.

18. A transceiver circuit having a receiver for receiving a signal input thereto, and a driver for outputting a signal, wherein said receiver comprises:

an offset application circuit for applying an offset to said input signal; and a decision circuit for comparing said offset-applied input signal with a reference voltage, wherein the level of said input signal is determined based on said known offset and on a result output from said decision circuit, wherein said offset voltage application circuit includes a plurality of capacitors and switches, and varies the level of said offset by varying a precharge voltage of each of said capacitors.

19. A transceiver circuit having a receiver for receiving a signal input thereto, and a driver for outputting a signal, wherein said receiver comprises:

an offset application circuit for applying an offset to said input signal; and a decision circuit for comparing said offset-applied input signal with a reference voltage, wherein the level of said input signal is determined based on said known offset and on a result output from said decision circuit, the transceiver circuit further comprising:

a test pattern transmitting circuit for transmitting a predetermined test pattern from said driver to a receiver in another transceiver circuit;

a test pattern judging circuit for receiving, by said receiver, a test pattern transmitted from a driver in another transceiver circuit and for judging said received test pattern at a predetermined timing using said decision circuit; and a test pattern level detection circuit for detecting the level of said test pattern by adjusting the level of said offset, and wherein an equalization parameter of said receiver is adjusted using an output of said test pattern level detection circuit.

20. A transceiver circuit having a receiver for receiving a signal input thereto, and a driver for outputting a signal, wherein said receiver comprises:

an offset application circuit for applying an offset to said input signal; and a decision circuit for comparing said offset-applied input signal with a reference voltage, wherein the level of said input signal is determined based on said known offset and on a result output from said decision circuit, the transceiver circuit, further comprising:

a boundary signal transmitting circuit for transmitting from said driver to a receiver in another transceiver circuit a boundary signal which should be judged to be at a boundary between data "0" and "1"; and a boundary offset seeking circuit for receiving, by said receiver, a boundary signal transmitted from a driver in another transceiver circuit and for seeking such a boundary offset that the result of a decision in said decision circuit agrees with the boundary between data "0" and "1", and wherein zero adjustment of said receiver is performed by applying said boundary offset to said receiver at the time of usual input signal reception.

21. A transceiver circuit having a receiver for receiving a signal input thereto, and a driver for outputting a signal, wherein said receiver comprises:

an offset application circuit for applying an offset to said in input signal; and a decision circuit for comparing said offset-applied input signal with a reference voltage, wherein the level of said input signal is determined based on said known offset and on a result output from said decision circuit, the transceiver circuit, further comprising:

a test pattern transmitting circuit for transmitting a predetermined test pattern from said driver to a receiver in another transceiver circuit;

a receive timing changing test pattern level detection circuit for receiving, by said receiver, a test pattern transmitted from a driver in another transceiver circuit by sequentially changing a receive timing in said receiver and for detecting the level of said test pattern; and an operation circuit for adjusting a parameter of said transceiver circuit by using an output of said receive timing changing test pattern level detection circuit.

22. A signal transmission system having a first transceiver circuit, a second transceiver circuit, and a signal transmission line connecting between said first and second transceiver circuits, wherein:

each of said transceiver circuits comprises a receiver for receiving a signal input thereto, and a driver for outputting a signal; and said receiver includes an offset application circuit for applying an offset to said input signal, a decision circuit for comparing said offset-applied input signal with a reference voltage, wherein the level of said input signal is determined based on said offset and on a result output from said decision circuit, and a timing control circuit for controlling decision timing in said decision circuit by shifting said decision timing relative to said input signal.

23. The signal transmission system as claimed in claim 22, wherein said offset application circuit includes an offset level control circuit for controlling the level of said offset by a digital signal.

24. The signal transmission system as claimed in claim 22, wherein said receiver further includes:
an input signal level detection circuit for detecting the level of said input signal by increasing or decreasing the level of said offset using said offset level control circuit, and by finding an offset level where the result output from said decision circuit changes.

25. The signal transmission system as claimed in claim 22, wherein said offset application circuit varies the level of said offset by passing a constant current into an internal node in said receiver.

26. The signal transmission system as claimed in claim 22, wherein said offset application circuit varies the level of said offset by passing a constant current into an internal node in said receiver.

27. The signal transmission system as claimed in claim 22, wherein received signal quality of said input signal is diagnosed, or a characteristic of said receiver or driver is adjusted, by using the waveform of said input signal obtained from said known offset and the result output from said decision circuit.

28. A signal transmission system having a first transceiver circuit, a second transceiver circuit, and a signal transmission line connecting between said first and second transceiver circuits, wherein:
each of said transceiver circuits comprises a receiver for receiving a signal input thereto, and a driver for outputting a signal: and
said receiver includes an offset application circuit for applying an offset to said input signal and a decision circuit for comparing said offset-applied input signal with a reference voltage, wherein the level of said input signal is determined based on said known offset and on a result output from said decision circuit,
wherein said receiver further includes:
an input signal level detection circuit for detecting the level of said input signal by increasing or decreasing the level of said offset using said offset level control circuit, and by finding an offset level where the result output from said decision circuit changes; and
a timing control circuit for controlling decision timing in said decision circuit in such a manner as to vary said decision timing relative to an internal clock in said receiver, wherein the level of said offset is adjusted by judging an externally supplied, predetermined test pattern at output timing of said timing control circuit, and information concerning said input signal is acquired using said input signal level detection circuit.

29. A signal transmission system having a first transceiver circuit, a second transceiver circuit, and a signal transmission line connecting between said first and second transceiver circuits, wherein:
each of said transceiver circuits comprises a receiver for receiving a signal input thereto, and a driver for outputting a signal; and
said receiver includes an offset application circuit for applying an offset to said input signal and a decision circuit for comparing said offset-applied input signal with a reference voltage, wherein the level of said input signal is determined based on said known offset and on a result output from said decision circuit, wherein said offset voltage application circuit passes a constant current to a termination resistor provided in parallel to an input terminal of said receiver.

30. A signal transmission system having a first transceiver circuit, a second transceiver circuit, and a signal transmission line connecting between said first and second transceiver circuits, wherein:
each of said transceiver circuits comprises a receiver for receiving a signal input thereto, and a driver for outputting a signal; and
said receiver includes an offset application circuit for applying an offset to said input signal and a decision circuit for comparing said offset-applied input signal with a reference voltage, wherein the level of said input signal is determined based on said known offset and on a result output from said decision circuit, wherein said offset voltage application circuit includes a plurality of capacitors and switches, and varies the level of said offset by varying a precharge voltage of each of said capacitors.

31. A signal transmission system having a first transceiver circuit, a second transceiver circuit, and a signal transmission line connecting between said first and second transceiver circuits, wherein:
each of said transceiver circuits comprises a receiver for receiving a signal input thereto, and a driver for outputting a signal;
said receiver includes an offset application circuit for applying an offset to said input signal and a decision circuit for comparing said offset-applied input signal with a reference voltage, wherein the level of said input signal is determined based on said known offset and on a result output from said decision circuit;
a predetermined test pattern is transmitted from said driver in said first transceiver circuit, said test pattern is judged at predetermined timing using said receiver in said second transceiver circuit; and
the level of said test pattern is detected by adjusting the level of said offset in said second transceiver circuit, thereby adjusting an equalization parameter of said receiver in said second transceiver circuit.

32. A signal transmission system having a first transceiver circuit, a second transceiver circuit, and a signal transmission line connecting between said first and second transceiver circuits, wherein:
each of said transceiver circuits comprises a receiver for receiving a signal input thereto, and a driver for outputting a signal;
said receiver includes an offset application circuit for applying an offset to said input signal and a decision circuit for comparing said offset-applied input signal with a reference voltage, wherein the level of said input signal is determined based on said known offset and on a result output from said decision circuit;
a boundary signal which should be judged to be at a boundary between data "0" and "1" is transmitted to said receiver in said second transceiver circuit by said driver in said first transceiver circuit;
said boundary signal is received by said receiver in said second transceiver circuit and such a boundary offset is sought so that the result of a decision in said decision circuit of said receiver agrees with the boundary between data "0" and "1"; and
zero adjustment of said receiver in said second transceiver circuit is performed by applying said boundary offset to said receiver at the time of usual input signal reception.

33. A signal transmission system having a first transceiver circuit, a second transceiver circuit, and a signal transmission line connecting between said first and second transceiver circuits, wherein:

each of said transceiver circuits comprises a receiver for receiving a signal input thereto, and a driver for outputting a signal;

said receiver includes an offset application circuit for applying an offset to said input signal and a decision circuit for comparing said offset-applied input signal with a reference voltage, wherein the level of said input signal is determined based on said known offset and on a result output from said decision circuit;

a predetermined test pattern is transmitted to said receiver in said first transceiver circuit by said driver in said first transceiver circuit; and said test pattern is received by said receiver in said second transceiver circuit by sequentially changing the receive timing in said receiver and the level of said test pattern is detected, thereby adjusting a parameter of said second transceiver circuit.

34. A receiver comprising:

an offset application circuit for applying an offset to an input signal;

a decision circuit for comparing said offset-applied input signal with a reference voltage, wherein the level of said input signal is determined based on said offset and on a result output from said decision circuit; and an offset level control circuit for increasing or decreasing the level of said offset to detect a change of an output of said decision circuit.

35. A signal transmission system having a first transceiver circuit, a second transceiver circuit, and a signal transmission line connecting between said first and second transceiver circuits, wherein:

each of said transceiver circuits comprises a receiver for receiving a signal input thereto, and a driver for outputting a signal; and said receiver includes an offset application circuit for applying an offset to said input signal, a decision circuit for comparing said offset-applied input signal with a reference voltage, wherein the level of said input signal is determined based on said offset and on a result output from said decision circuit, and an offset level control circuit for increasing or decreasing the level of said offset to detect a change of an output of said decision circuit.

* * * * *